US011129294B2

(12) United States Patent
Chen

(10) Patent No.: US 11,129,294 B2
(45) Date of Patent: **\*Sep. 21, 2021**

(54) MODULAR RACK ASSEMBLY

(71) Applicant: CFW Investments LLC, Irvine, CA (US)

(72) Inventor: Li Chen, Shenzhen (CN)

(73) Assignee: CFW Investments LLC, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/682,480

(22) Filed: Nov. 13, 2019

(65) Prior Publication Data

US 2020/0163248 A1 May 21, 2020

Related U.S. Application Data

(63) Continuation-in-part of application No. 16/192,531, filed on Nov. 15, 2018, now Pat. No. 10,517,187.

(51) Int. Cl.
| | |
|---|---|
| H05K 7/14 | (2006.01) |
| H05K 7/18 | (2006.01) |
| H05K 7/20 | (2006.01) |
| A47B 47/03 | (2006.01) |
| A47B 47/00 | (2006.01) |

(52) U.S. Cl.
CPC ......... *H05K 7/183* (2013.01); *A47B 47/0025* (2013.01); *A47B 47/03* (2013.01); *H05K 7/1491* (2013.01); *H05K 7/1495* (2013.01); *H05K 7/20736* (2013.01)

(58) Field of Classification Search
CPC .......................... H05K 7/1491; H05K 7/1495
See application file for complete search history.

(56) References Cited

U.S. PATENT DOCUMENTS

| | | | | |
|---|---|---|---|---|
| 5,893,539 | A * | 4/1999 | Tran | H05K 7/1491 |
| | | | | 248/282.1 |
| 6,293,637 | B1 * | 9/2001 | Anderson | H02B 1/301 |
| | | | | 211/26 |
| 6,605,777 | B1 | 8/2003 | Anderson et al. | |
| 8,730,678 | B1 * | 5/2014 | Cunningham | H05K 7/1491 |
| | | | | 361/725 |
| 9,328,851 | B2 * | 5/2016 | Walsh | H02G 3/32 |
| 10,117,348 | B2 * | 10/2018 | Babcock | H05K 7/183 |
| 10,123,449 | B1 * | 11/2018 | Stevens | H05K 7/1491 |
| 10,182,651 | B2 * | 1/2019 | Jost | A47B 96/14 |

(Continued)

FOREIGN PATENT DOCUMENTS

CN 108666874 A 10/2018

OTHER PUBLICATIONS

International Search Report and Written Opinion dated Apr. 1, 2020 for corresponding PCT Application No. PCT/US2019/061172.

*Primary Examiner* — Adrian S Wilson
(74) *Attorney, Agent, or Firm* — Raymond Sun

(57) ABSTRACT

A frame structure for a cabinet enclosure has a front frame assembly having first and second front pillars, a rear frame assembly having first and second rear pillars, a first side brace member, and a second side brace member, each having a beam that has opposite ends, with the opposite ends of each side brace member connected to one of the front pillars and one of the rear pillars. The frame structure also includes cable management and air flow management features and functions.

25 Claims, 46 Drawing Sheets

(56) References Cited

U.S. PATENT DOCUMENTS

| | | | |
|---|---|---|---|
| 10,517,187 B1* | 12/2019 | Chen | A47B 47/03 |
| 10,605,381 B2* | 3/2020 | Crowe | F16L 3/137 |
| 2003/0121689 A1* | 7/2003 | Rasmussen | H05K 7/1449 |
| | | | 174/50 |
| 2004/0079712 A1* | 4/2004 | Mayer | A47B 57/485 |
| | | | 211/26 |
| 2004/0182798 A1* | 9/2004 | Williams | H05K 7/1491 |
| | | | 211/26 |
| 2005/0115737 A1* | 6/2005 | Levesque | H02G 3/0493 |
| | | | 174/100 |
| 2007/0144981 A1 | 6/2007 | Nguyen | |
| 2009/0090533 A1* | 4/2009 | Jones | H04Q 1/064 |
| | | | 174/95 |
| 2009/0224110 A1* | 9/2009 | Donowho | H02G 3/30 |
| | | | 248/65 |
| 2011/0181160 A1 | 7/2011 | Peng et al. | |
| 2012/0013236 A1 | 1/2012 | Fan | |
| 2013/0140972 A1 | 6/2013 | Mattlin et al. | |
| 2013/0342091 A1 | 12/2013 | Walker et al. | |
| 2014/0153186 A1* | 6/2014 | Liu | H05K 7/1491 |
| | | | 361/679.58 |
| 2014/0153187 A1* | 6/2014 | Liu | H05K 7/1491 |
| | | | 361/679.58 |

* cited by examiner

MODULAR RACK ASSEMBLY

BACKGROUND OF THE INVENTION

1. Field of the Invention

The present invention generally relates to a modular racks or enclosures for housing equipment, and more particularly to a frame structure for an assembled rack or enclosure for housing data processing, networking, and audio video or similar equipment.

2. Description of the Prior Art

Racks or enclosures are commonly used for housing electronic equipment, including but not limited to data processing, networking, information technology, audio and video equipment. In places like data centers and other facilities for data intensive applications, clusters of racks and enclosures are used for housing hundreds and thousands of electronic equipment. Further, with ever-increasing power and the reduction in size of electronic hardware, there are increased concerns relating to power distribution, ventilation, cable management, and load capacity at the rack level. People are constantly looking for equipment racking systems with increased reliability, yet are flexible enough to serve a variety of application scenarios, capable of meeting industry standards, and yet simple in configuration and also being cost effective.

At present, conventional cabinets used for these applications normally have front and rear frames, and then each cabinet is assembled with side brace members by using screws, so as to form the cabinet frame. The side brace member and the frame are in planar contact without any buckles or other retaining means. Racks or enclosures assembled in this manner have relatively low load capacity and poor stability.

Furthermore, data centers arrange racks or enclosures in a hot-aisle/cold aisle layout for greater data center capacity and efficiency, which requires much more efficient infrastructure and equipment housing design with the flexibility to support growth. For example, installing side barrier panels between cabinets is extremely important in segregating each cabinet for better airflow control. However, when baying cabinets, it is often impossible to install side panels without using modified custom side panels or cabinet structures, otherwise it will be very difficult to pull out individual cabinets from a row for replacement or repair. Therefore, the versatility is poor.

In addition, current rack and enclosure products do not provide an integral solution for installation of power distribution units (PDU) or cable management, but instead requires installation of additional accessories which increase workload and costs. Therefore, cable management is a problem that is not readily addressed.

Proper ventilation or air flow management is another problem that plagues current rack and enclosure products.

SUMMARY OF THE DISCLOSURE

It is an object of the present invention to provide a frame structure for an enclosure cabinet that overcomes the drawbacks described above.

In order to accomplish the objects of the present invention, a frame structure for a cabinet enclosure is provided. The frame structure has a front frame assembly having first and second front pillars, a rear frame assembly having first and second rear pillars, a first side brace member, and a second side brace member, each having a beam that has opposite ends, with the opposite ends of each side brace member connected to one of the front pillars and one of the rear pillars.

The frame structure of the present invention provides the following aspects.

A first aspect of the present invention is directed to improving the structural stability and load capacity of the frame structure for housing equipment. The frame structure includes a front frame, a rear frame, side brace members, limiting and retaining members provided on the frames to place and reinforce the side brace members in contact with the front and rear frames, and connecting structures provided on the side brace member and the front frame or the rear frame to restrict and fasten the side brace members with the front and rear frames. The limiting members on the frames restrict and fix the side brace member to the frames, thereby increasing the stability of the assembled frame structure. The connecting structures pull the fastening surfaces together in a manner which allows for adjustability and stability. Because the fastening surface is recessed or distanced from the end edges of the side brace members, the fastening distance and thus the fastening force are adaptable. This elastic fastening structure along with frictional contact between surfaces behaves like a viscoelastic system which offers excellent resistance to impact forces or dynamic loads by absorbing energy. For example, tightening the fastener results in higher internal tension force inside the fastener, and the fastener in return applies a higher contacting force on the fastening surface. Because the side brace member has a fastening structure on both ends, it is under high compressional forces. These compressional forces reinforce the attachment of side brace member to the pillars of the frames and make the structure substantially rigid. Thus, the structural stability is greatly improved with high resilience to both in-plane (along the fastening direction) and out-of-plane (transverse to the fastening direction) external loads.

A second aspect of the present invention is directed to facilitating deployment and maintenance of the rack enclosures. The rack has a front frame, a rear frame, and side brace members connected with the frames, where the pillars of the front frame and rear frame have recessed surface profiles on the side. Even when side panels are installed on the side of the frames, the outer surfaces of these side panels are also recessed from the outermost surface of the frames. As a result, the side to side contact area (and thus frictional force) between adjacently deployed cabinets can be greatly reduced. The extra clearance provided by the recessed areas also makes the resulting cabinet compact and easier for gripping and maneuvering. Embodiments of such pillar design of the front frame assembly and the rear frame assembly may have one or multiple recessed profile surfaces. An increased number of bends and surfaces (surface areas) formed on the pillars facilitates overall strength of the pillar and frame structure. In this regard, the upper and lower frame beams of the front frame assembly and the rear frame assembly have at least one recessed surface on the sides. The upper and lower frame beams provide multiple mounting surfaces for installation of components, such as a top cover, a base, a front door, mounting rails, mounting brackets and electronic devices. Even when other components are installed on the frame beams, the extra clearance provided by the recessed areas facilitates the installation or removal of components, as well as preventing interference among installed components.

A third aspect of the present invention is directed to facility installation and operation of entry plate of the enclosure. The upper beam of the rear frame assembly has cable entry ports on the top surface of the beam or the top cover. The cable entry ports are used for installation of cable entry assembly. The cable entry assembly may include a mounting bracket and a brush structure, where the mounting bracket has an entrapment area defined by an angled/curved entrapment plate and fastening tabs for receiving the brush structure. The cable entry assembly may also include flexible, configurable airseal grommets that can be made from elastomeric plastic material and fitted into cable entry ports having various geometric shapes and sizes, that are located on the top cover, the base, the front frame assembly, the rear frame assembly, the mounting rail and other components. The configurable airseal grommet can accommodate various cable pass-through configurations while still effectively blocking unwanted air flow in the area.

A fourth aspect of the present invention is directed to improving thermal air flow management, as well as to facilitate cable installation, routing and management within the cabinet enclosure. The front frame assembly and the rear frame assembly can form closed chambers, thus blocking air flow in unwanted areas to maximize cooling efficiency. The front and rear frame assemblies can also include integrated cable management structures for optimal organization of cables. Pillars of the rear frame assembly or the front frame assembly can have device management apparatus, T-shaped entry openings, hook openings, PDU mounting ports and cable entry ports, which facilitate installation, routing and organization of cables or other pass-through devices without the need for additional functional accessories.

A fifth aspect of the present invention is the provision of adjustable feet installed on the enclosure. The lower beam of the front frame assembly or the rear frame assembly has openings that facilitate the installation of threaded shafts for adjustable foot assemblies. The openings offer access to adjust the feet from inside the enclosure, so that the operator does not need to access the adjustable feet from outside the enclosure.

DETAILED DESCRIPTION OF THE PREFERRED EMBODIMENTS

Figure 1:
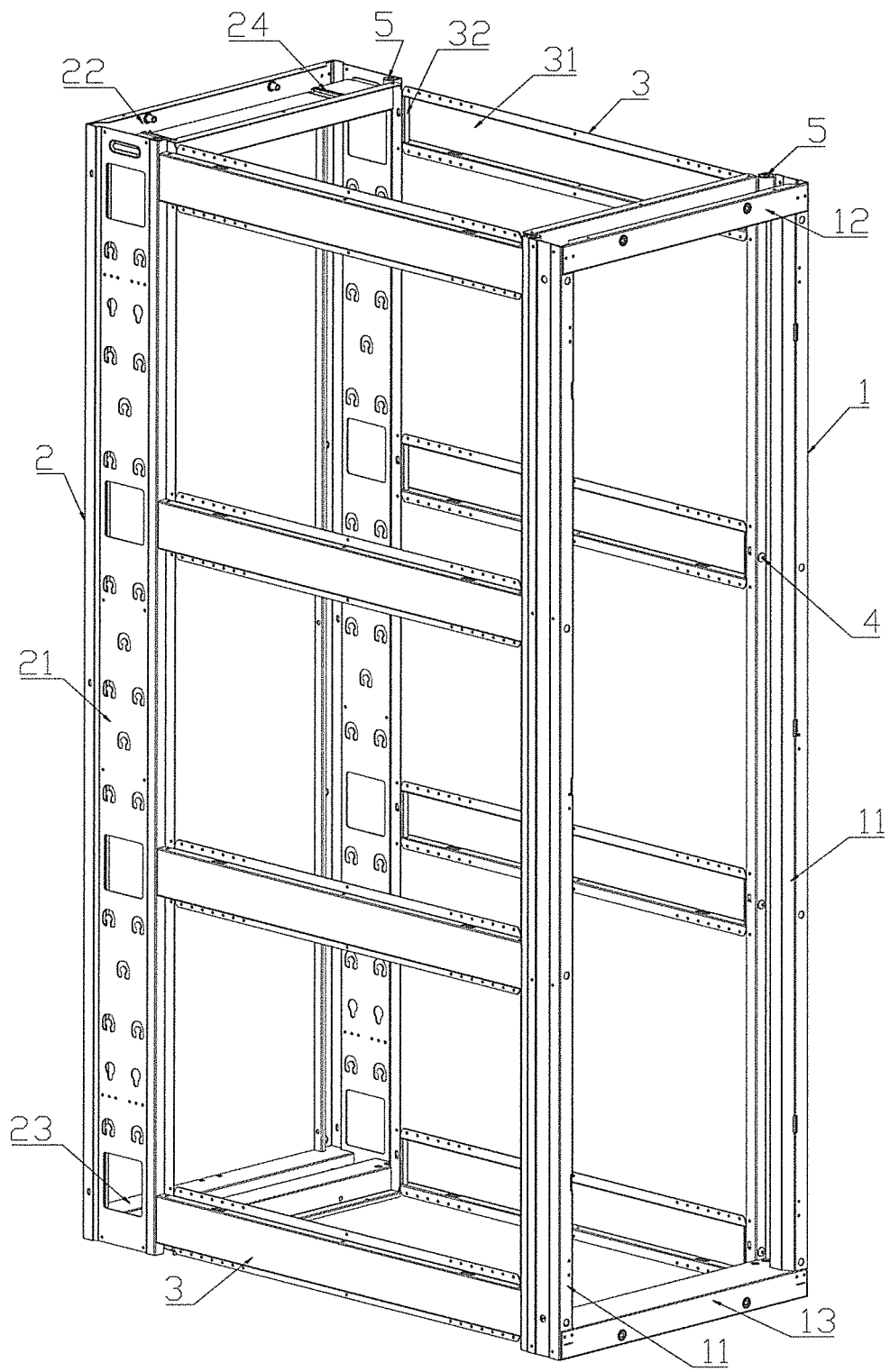
FIG. 1 is a perspective view showing the frame structure of the enclosure cabinet according to a first embodiment of the present invention.
Figure 2:
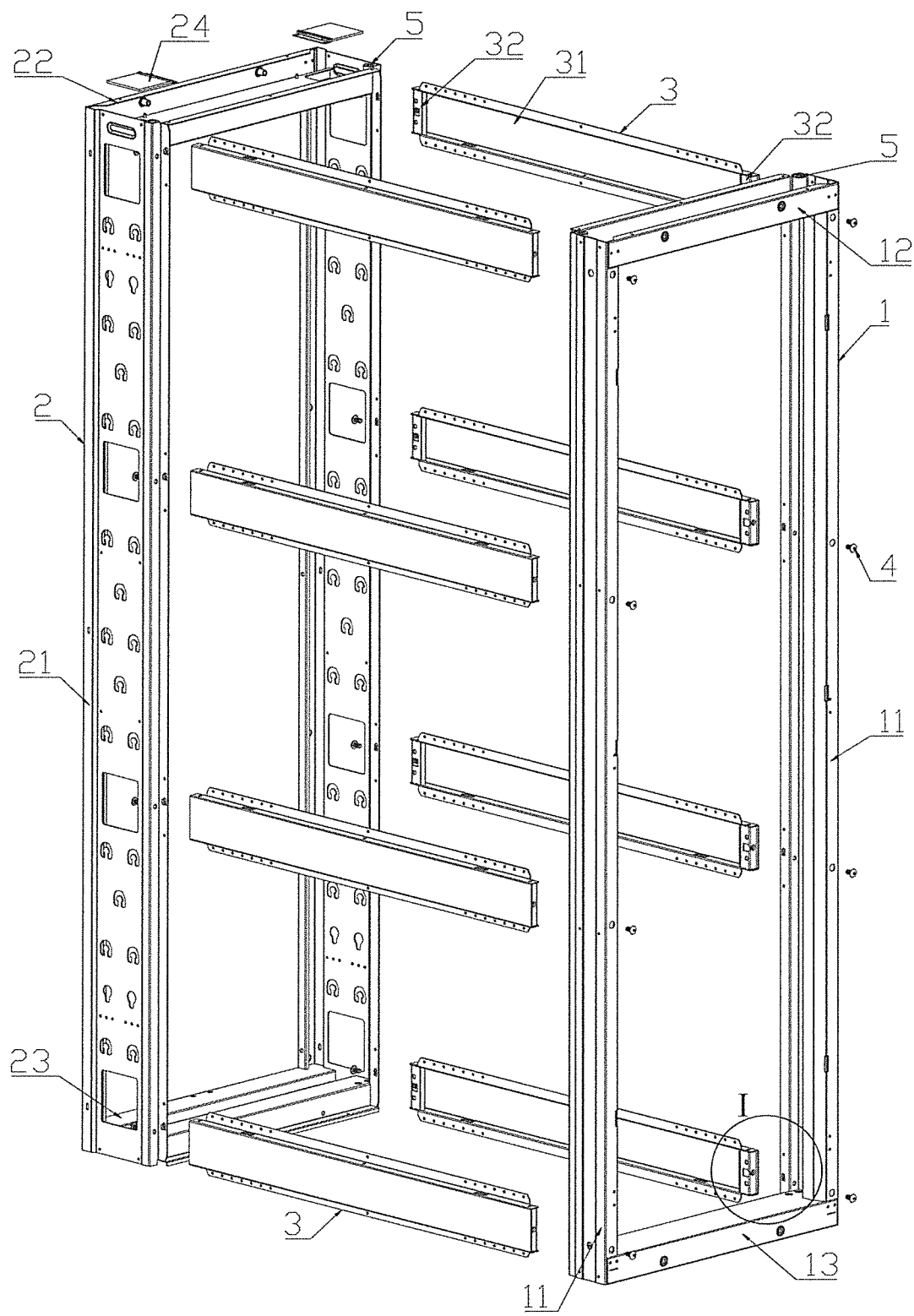
FIG. 2 is an exploded perspective view of the frame structure of FIG. 1.
Figure 3:
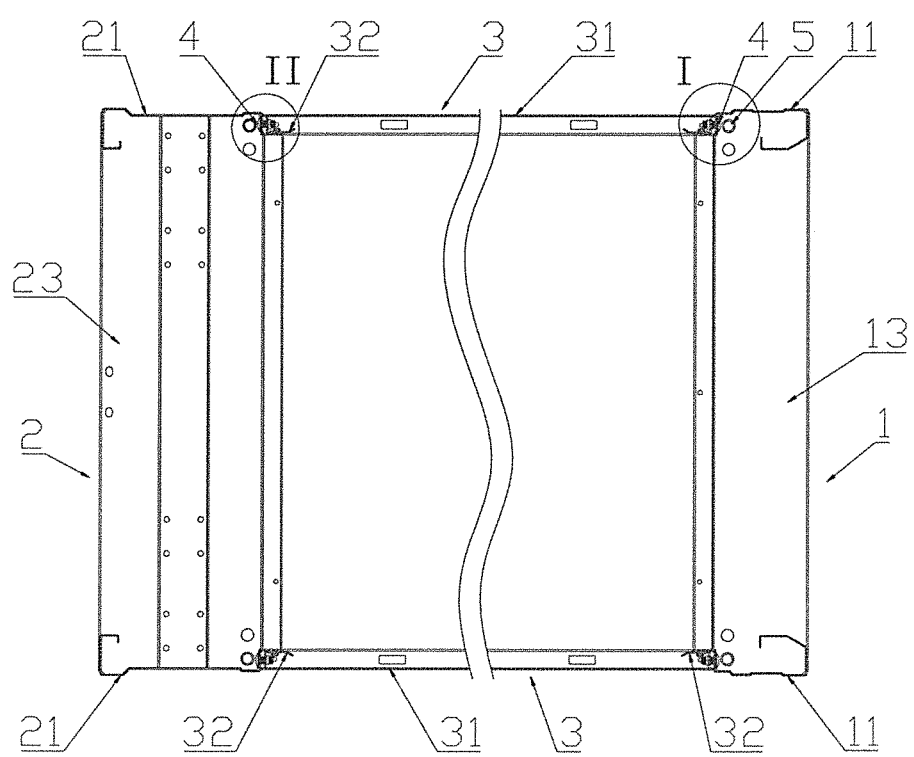
FIG. 3 is a cross-sectional view of the frame structure of FIG. 1 taken along the base thereof.
Figure 4A:
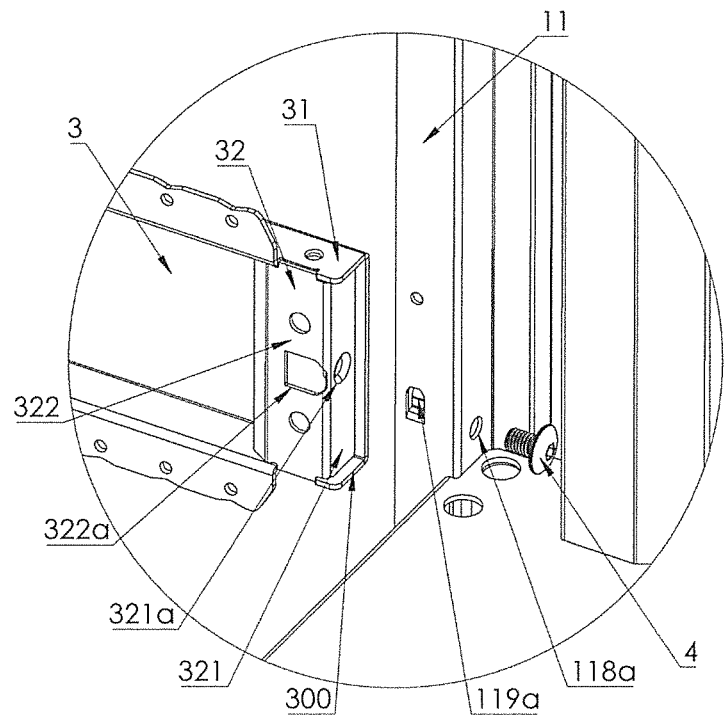
FIG. 4A is an enlarged exploded front perspective view of the area marked I in FIG. 3.
Figure 4B:
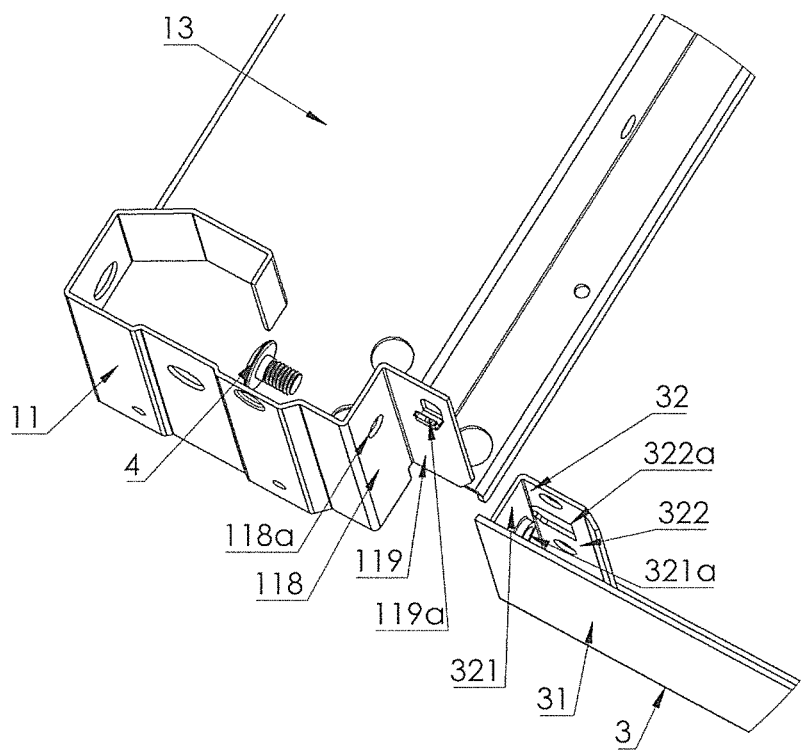
FIG. 4B is an enlarged exploded rear perspective view of the area marked I in FIG. 3.
Figure 5:
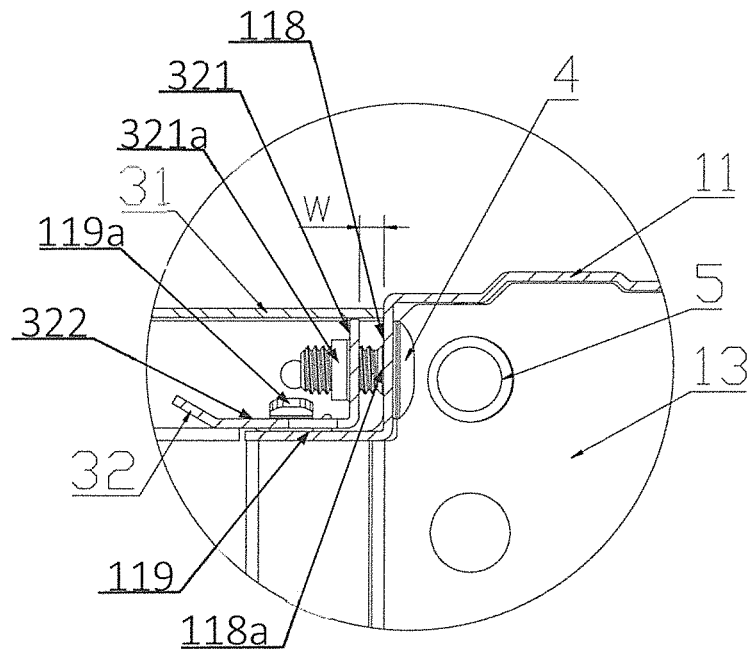
FIG. 5 is a cross-sectional view of the area marked I in FIG. 3
Figure 6:
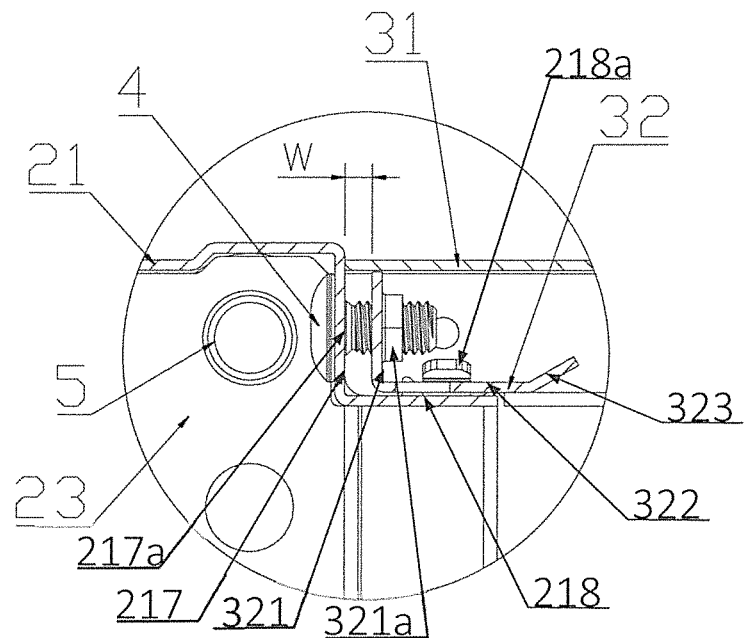
FIG. 6 is a cross-sectional view of the area marked II in FIG. 3.

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

First Embodiment

Referring to FIGS. 1-3 and 21-25, the frame structure of the cabinet enclosure of the present invention includes a front frame assembly 1, a rear frame assembly 2, two side brace members 3, and connectors (e.g., bolts) 4 to fasten the side brace members 3 with the frame assemblies 1 and 2. Side panels 6 can be installed on the surface defined by recessed flange surfaces 314, 315 of the side brace members 3. A top cover 7 can be installed on the top of the front frame assembly 1 and the rear frame assembly 2. A base 8 can be installed on the bottom of the front frame assembly 1 and the rear frame assembly 2.

Referring to FIGS. 8A to 11, the front frame assembly 1 has two front pillars 11, a front upper frame beam 12, and a front lower frame beam 13. The upper ends of the front pillars 11 are connected to the front upper frame beam 12, and the lower ends of the front pillars 11 are connected to the front lower frame beam 13. The front pillar 11 can be provided with a retaining member, such as a hook 119a, which can be provided on a mounting surface 119 which functions as a limiting member. Each front pillar 11 may further include a fastening member, such as a mounting hole 118a, on a fastening surface 118.

Figure 9:
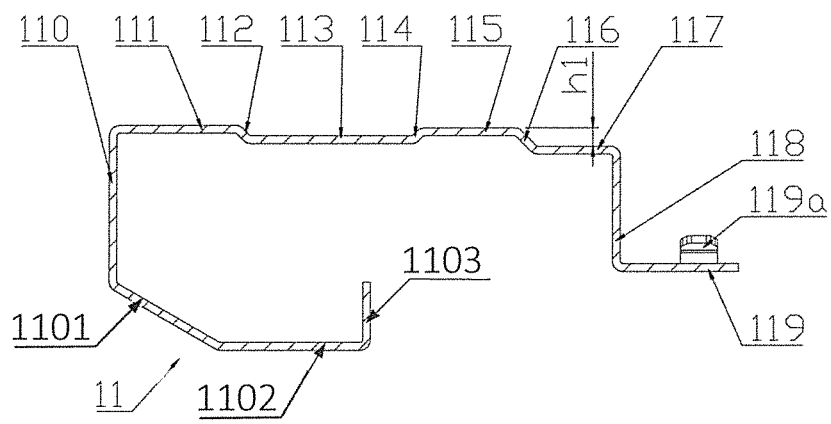
FIG. 9 is a cross-sectional view of the front pillar of the front frame assembly of FIG. 8A.

As best shown in FIG. 9, the front pillar 11 can be formed by forming multiple surfaces using methods such as bending a metal plate. The front pillar 11 has a front surface 110. One end of an angled surface 1101 extends from one end of the front surface 110, and the other end of the angled surface 1101 transitions into an enclosing surface 1102, which ends in a lip 1103 that extends about ninety degrees from the enclosing surface 1102. The other end of the front surface 110 is bent inwardly by about ninety degrees into a front side that has two raised surfaces 111 and 115. A first recessed surface 113 is formed between the two raised surfaces 111 and 115 via transition surfaces 112 and 114, respectively. From the raised surface 115 opposite to the transition surface 114 is another transition surface 116 that leads to a second recessed surface 117. The two recessed surfaces 113 and 117 are both parallel to the raised surfaces 111 and 115. The second recessed surface 117 is bent inwardly by ninety degrees to form a fastening surface 118, and then is further bent outwardly by ninety degrees to form a limiting member, which is a mounting surface 119. The mounting surface 119 can have a width of 1 to 50 mm. The surfaces 111, 113, 115 and 117 are parallel with the surface 1102. A retaining member, such as a hook 119a, can be provided on the mounting surface 119, and a fastening member, such as a mounting hole 118a, can be provided on the fastening surface 118.

Figure 24:
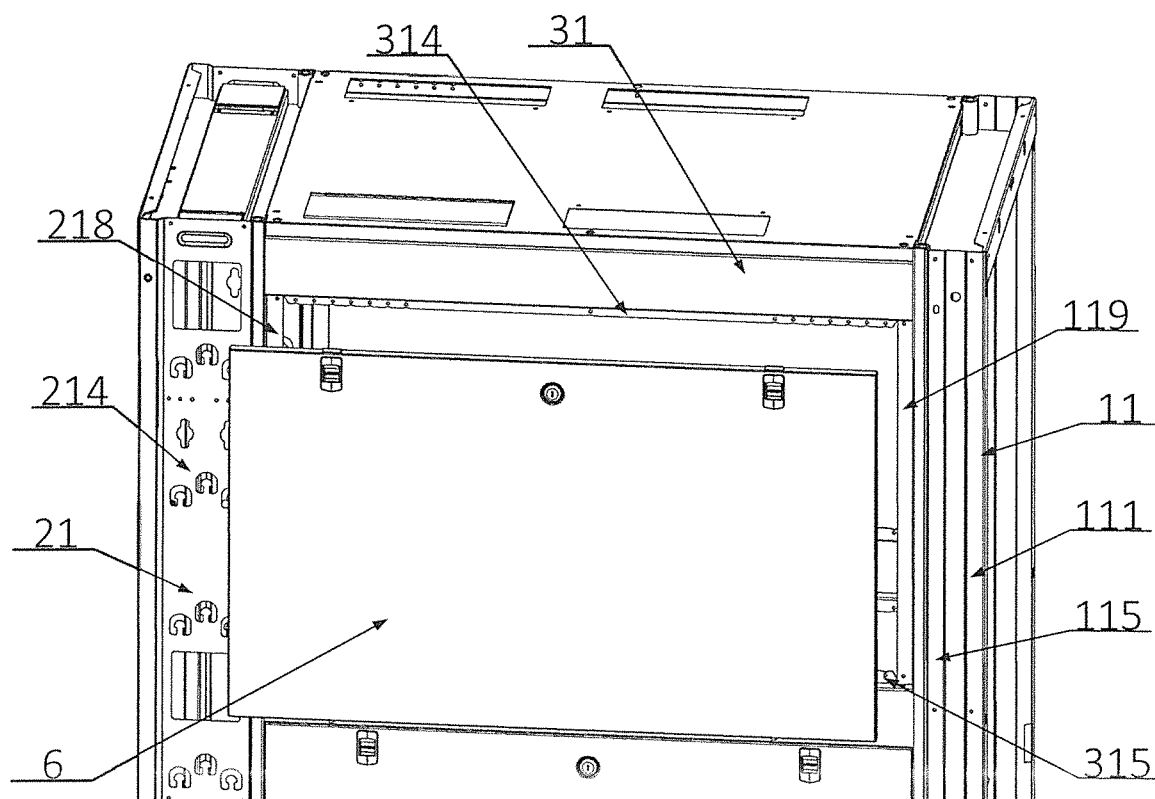
FIG. 24 is a side view of the enclosure cabinet of FIG. 21 showing how the side panels are connected.
Figure 25:
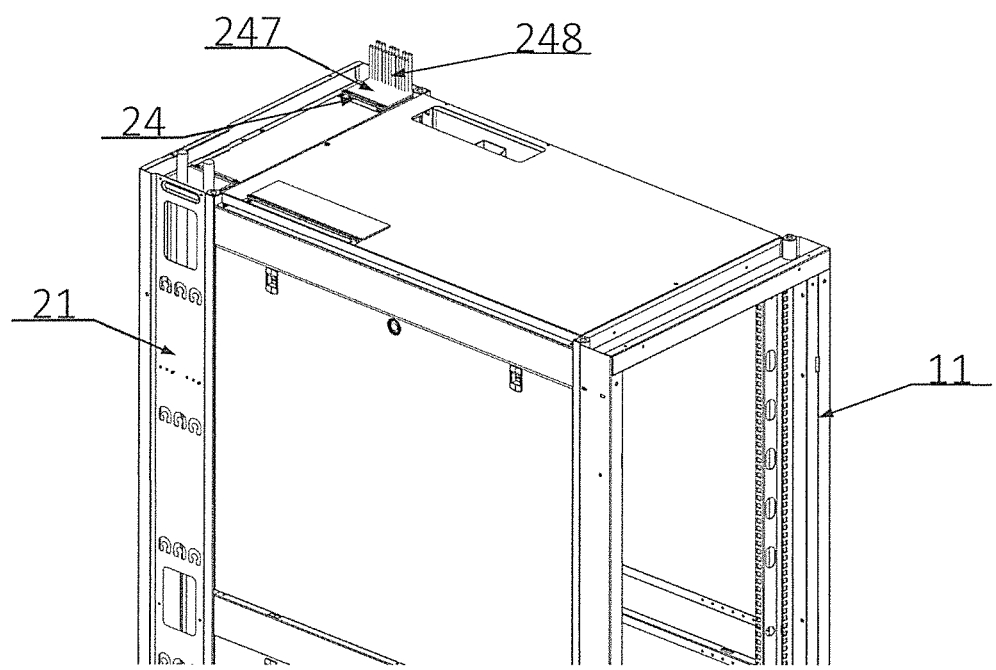
FIG. 25 is a top perspective view of the enclosure cabinet of FIG. 21.
Figure 26:
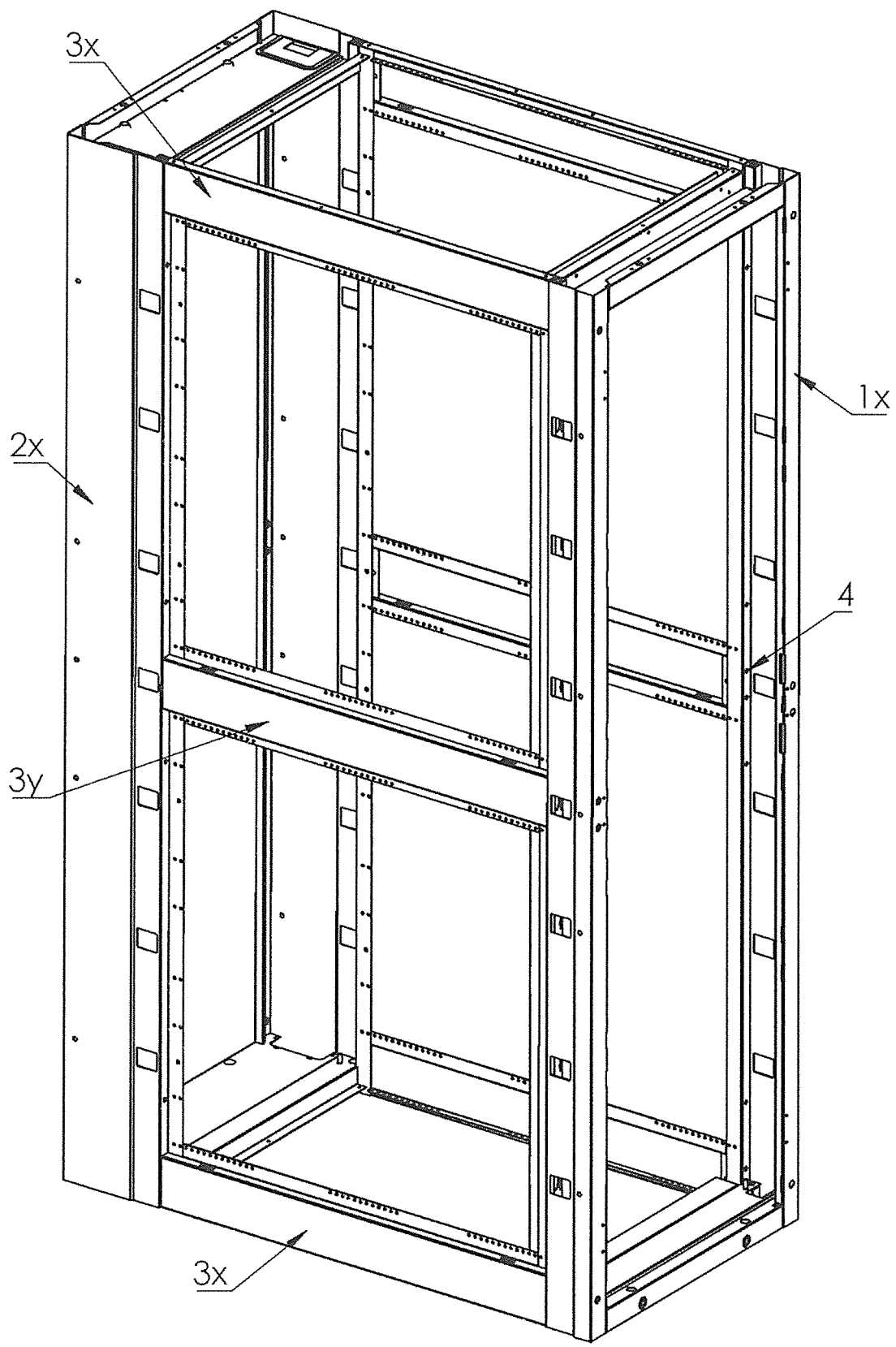
FIG. 26 is a perspective view showing the frame structure of the enclosure cabinet according to a second embodiment of the present invention.

The offset distance h1 between the recessed surfaces 113 and 117 and the raised surfaces 111 and 115 is between 1 to 25 mm. These bends and transition surfaces increase the rigidity of the front pillar 11 against bending moment and deflection forces applied to it, thereby improving the strength and stability of the front frame assembly 1. As shown in FIG. 24, the side panels 6 are installed on the recessed flange surfaces 314, 315 of the side brace members 3 (as described below), the mounting surface 119 of the front frame assembly, and the mounting surface 218 (as described below) of the rear frame assembly. After installation of the front frame assembly 1, the rear frame assembly 2 and the side panels 6, the outer surface of each side panel 6 is recessed from the raised surfaces 111 and 115 of the front frame pillar 11, and the raised surface 212 of the rear frame pillar 21. Since the recessed distance is equal to or greater than the offset distance h1 of 1 to 25 mm, when a plurality of these cabinet enclosures are bayed side by side (e.g., see FIG. 23), even if these cabinet enclosures have preinstalled side panels 6, the contact surface area at the front frame assembly 1, the rear frame assembly 2 and side panels 6 between the adjacent cabinet enclosures will be small, and less than 5% of the total side area of the cabinet enclosure.

Figure 10:
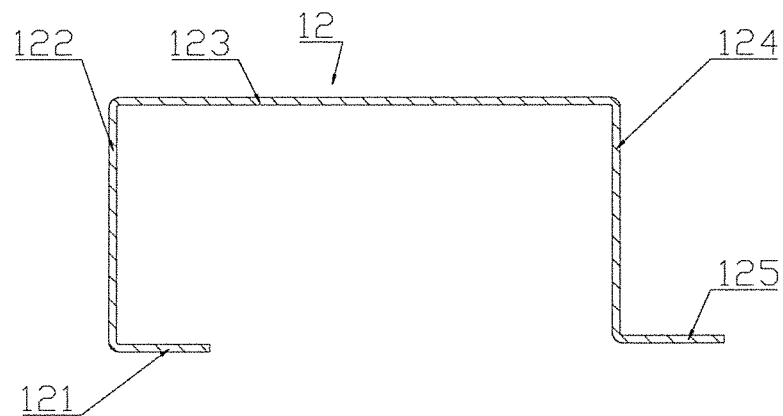
FIG. 10 is a cross-sectional view of the upper frame beam of the front frame assembly of FIG. 8A.

As best shown in FIG. 10, the front upper frame beam 12 can also be formed by forming multiple surfaces using methods such as bending a metal plate. The plate is first bent inwardly by ninety degrees to form one side of a first surface 121 into a second surface 122, and then bent inwardly by ninety degrees to form a third plane 123, from which another inward ninety-degree bend forms a fourth surface 124. Finally, a further outward ninety-degree bend forms a fifth surface 125.

Figure 11:
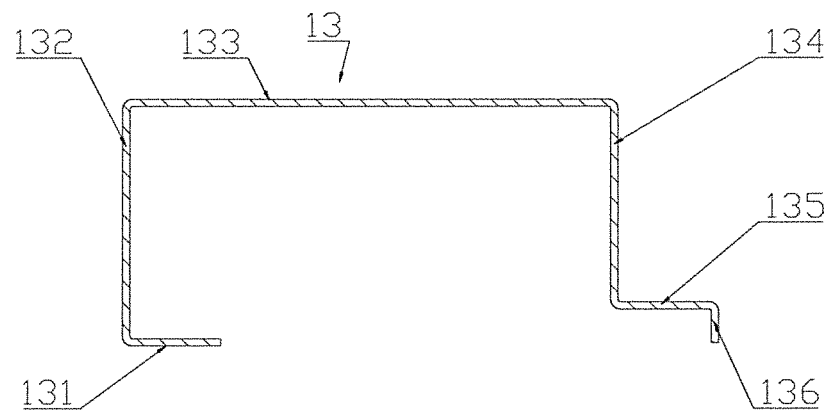
FIG. 11 is a cross-sectional view of the lower frame beam of the front frame assembly of FIG. 8A.

As best shown in FIG. 11, the front lower frame beam 13 can also be formed by bending a plate material. The first surface of the front side of the lower frame beam 131 is bent inwardly by ninety degrees to form a second surface 132, then bent ninety degrees inwardly to form a third surface 133, and a further inward ninety-degree bend forms a fourth surface 134. From there, a fifth surface 135 is formed by bending outwardly by ninety degrees, and then a further inward ninety-degree bend results in a sixth surface 136.

Referring to FIGS. 12A to 15, the rear frame assembly 2 has two rear pillars 21, a rear upper frame beam 22, and a rear lower frame beam 23. The upper ends of the rear pillars 21 are connected to the rear upper frame beam 22, and the lower ends of the rear pillars 21 are connected to the rear lower frame beam 23. Each rear pillar 21 may include a retaining member, such as a hook 218a, on a mounting surface 218 which functions as a limiting member, and a fastening member, such as a mounting hole 217a, on a fastening surface 217.

Figure 13:
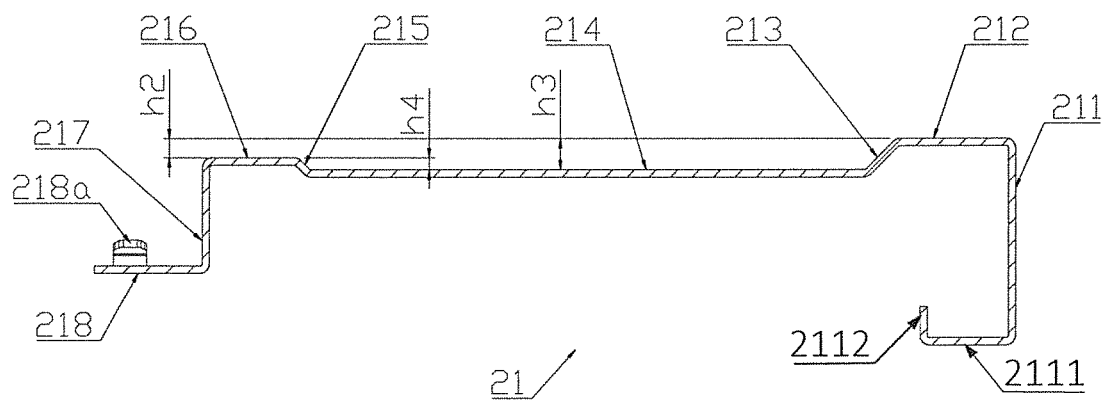
FIG. 13 is a cross-sectional view of the rear pillar of the rear frame assembly of FIG. 12A.

As best shown in FIG. 13, each rear pillar 21 can be formed by bending a plate material such as a metal plate. Each rear pillar 21 has a rear front surface 211. One end of a lateral surface 2111 extends by ninety degrees from one end of the rear front surface 211, and the other end of the lateral surface 2111 is bent inwardly by about ninety degrees into a lip 2112. The other end of the rear front surface 211 is bent inwardly by about ninety degrees to form a raised side surface 212, and then bent inwardly at an angle to form a transition surface 213, and further bent outwardly to form a recessed surface 214 parallel to the rear side surface 212 and the lateral surface 2111. The recessed surface 214 is then angled outwardly into another transition surface 215, and then bent inwardly to form a raised surface 216 which is also parallel with the surface 214. From the raised surface 216, the plate is bent inwardly by ninety degrees to form a fastening surface 217, and then further bent outwardly by 90 degrees to form a mounting surface 218 which functions as a limiting member. The mounting surface 218 can have a width of 1 to 50 mm. Each rear pillar 21 has a retaining member, such as a hook 218a, on the mounting surface 218, and a fastening member, such as a mounting hole 217a, on the fastening surface 217.

Furthermore, the recessed surface 214 is provided with T-shaped entry openings 214a, hook openings 214b, PDU mounting ports 214c, and cable entry ports 214d. See FIGS. 12A-12B. These features are arranged on the rear pillars 21 so as to meet the multifunctional needs of the customer, including installation, routing and organization of cables or other pass-through devices, without the need for additional accessories.

The offset distance h4 between the recessed surface 214 and the raised surface 216 is between 1 to 25 mm. The distance h3 between the rear side surface 212 and the recessed surface 214 is larger than h4. Similar to the front pillar 11, these bends and transition surfaces increase the rigidity of the rear pillar 21 against bending moment and deflection forces applied to it, thereby improving the strength and stability of the rear frame assembly 2.

The offset distance h1 between the recessed surface 117 and the raised surface 115 in FIG. 9 may be equal to the offset distance h2 between the raised surface 216 and the rear side surface 212 in FIG. 13. The value of h1 and h2 can be between 1 to 25 mm.

Figure 14:
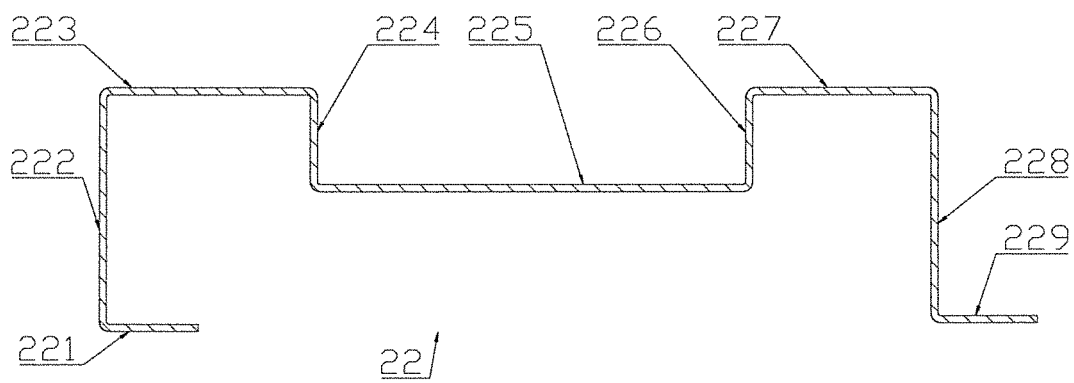
FIG. 14 is a cross-sectional view of the upper frame beam of the rear frame assembly of FIG. 12A.

As best shown in FIG. 14, the rear upper frame beam 22 can be formed by bending a plate material such as a metal plate. One side of a first surface 221 is bent inwardly by ninety degrees into a second surface 222, and then bent inwardly by ninety degrees to form a third surface 223, and then bent ninety degrees into a fourth surface 224, and then bent outwardly ninety degrees to form a fifth surface 225, and then bent outwardly by ninety degrees into a sixth surface 226, and then bent ninety degrees inwardly to form a seventh surface 227. From the seventh surface 227, a ninety-degree inward bend forms an eighth surface 228, and then the plate material is bent outwardly by ninety degrees to form a ninth surface 229. The surfaces 229 and 221 are on the same plane. The surface 225 is recessed from the surfaces 223 and 227, and the surfaces 222 and 228 are generally parallel to each other.

Figure 15:
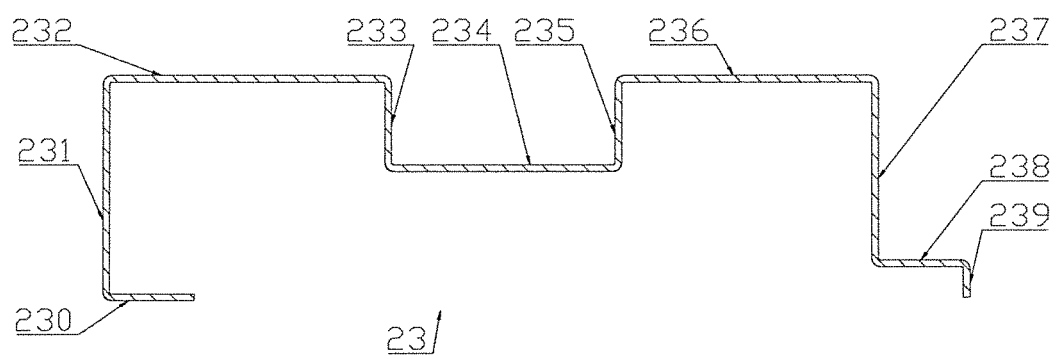
FIG. 15 is a cross-sectional view of the lower frame beam of the rear frame assembly of FIG. 12A.

As best shown in FIG. 15, the rear lower frame beam 23 can be formed by bending a plate material such as a metal plate. One side of a first surface 230 is bent inwardly by ninety degrees into a second surface 231, and then bent inwardly ninety degrees to form a third surface 232, then bent another ninety degrees to form a fourth surface 233, then bent outwardly ninety degrees to form a fifth surface 234, then bent outwardly ninety degrees to form a sixth surface 235, and then bent ninety degrees inwardly to form a seventh horizontal surface 236. From the seventh surface 236, a further ninety-degree inward bend forms an eighth surface 237, and then the plate material is bent outwardly ninety degrees into a ninth surface 238, and then bent another ninety degree to form a lip 239. The surface 234 is recessed from the surfaces 232 and 236, and the surfaces 231 and 237 are generally parallel to each other.

Figure 12A:
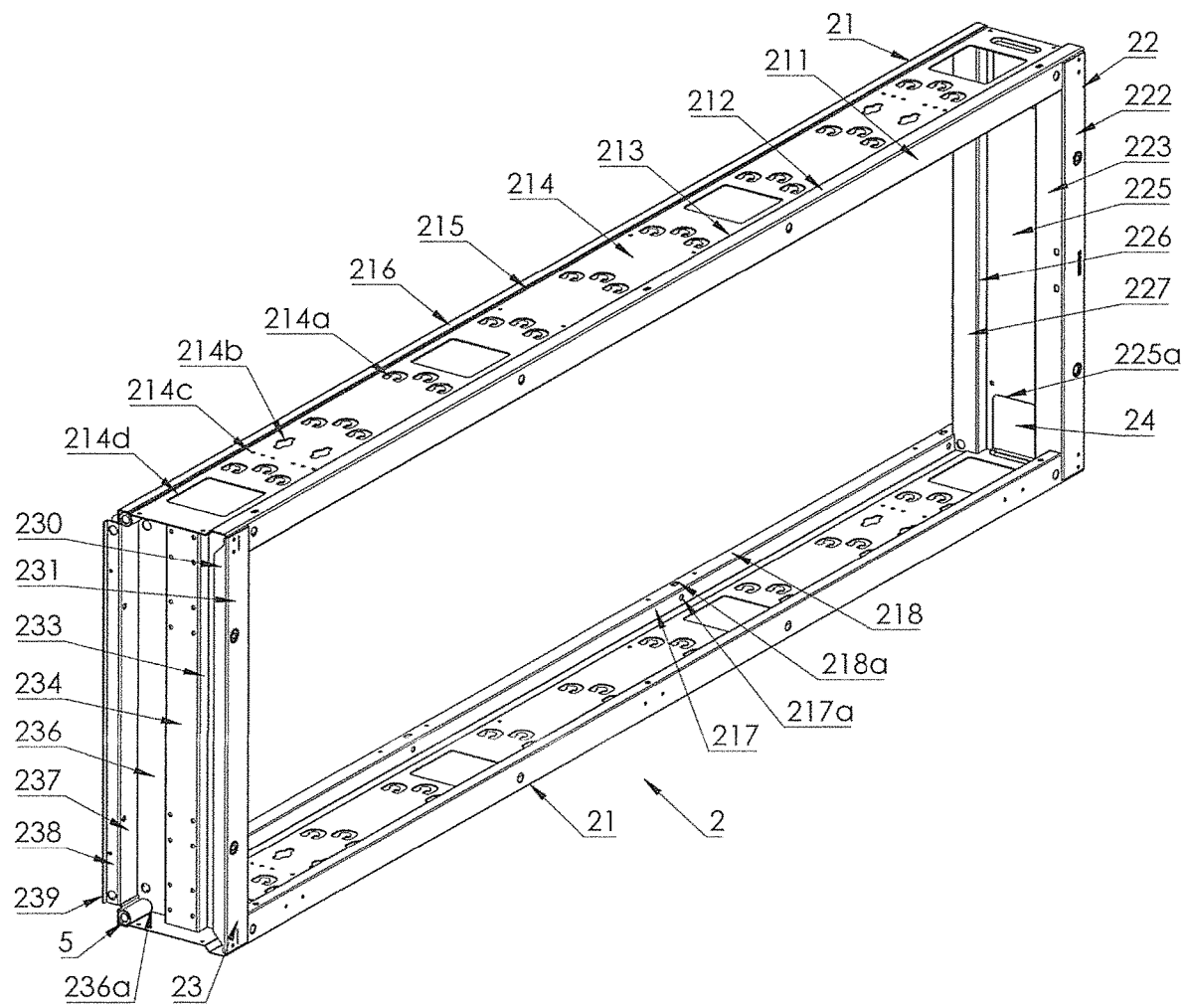
FIG. 12A is a perspective view of the rear frame assembly of the frame structure of FIG. 1.
Figure 12B:
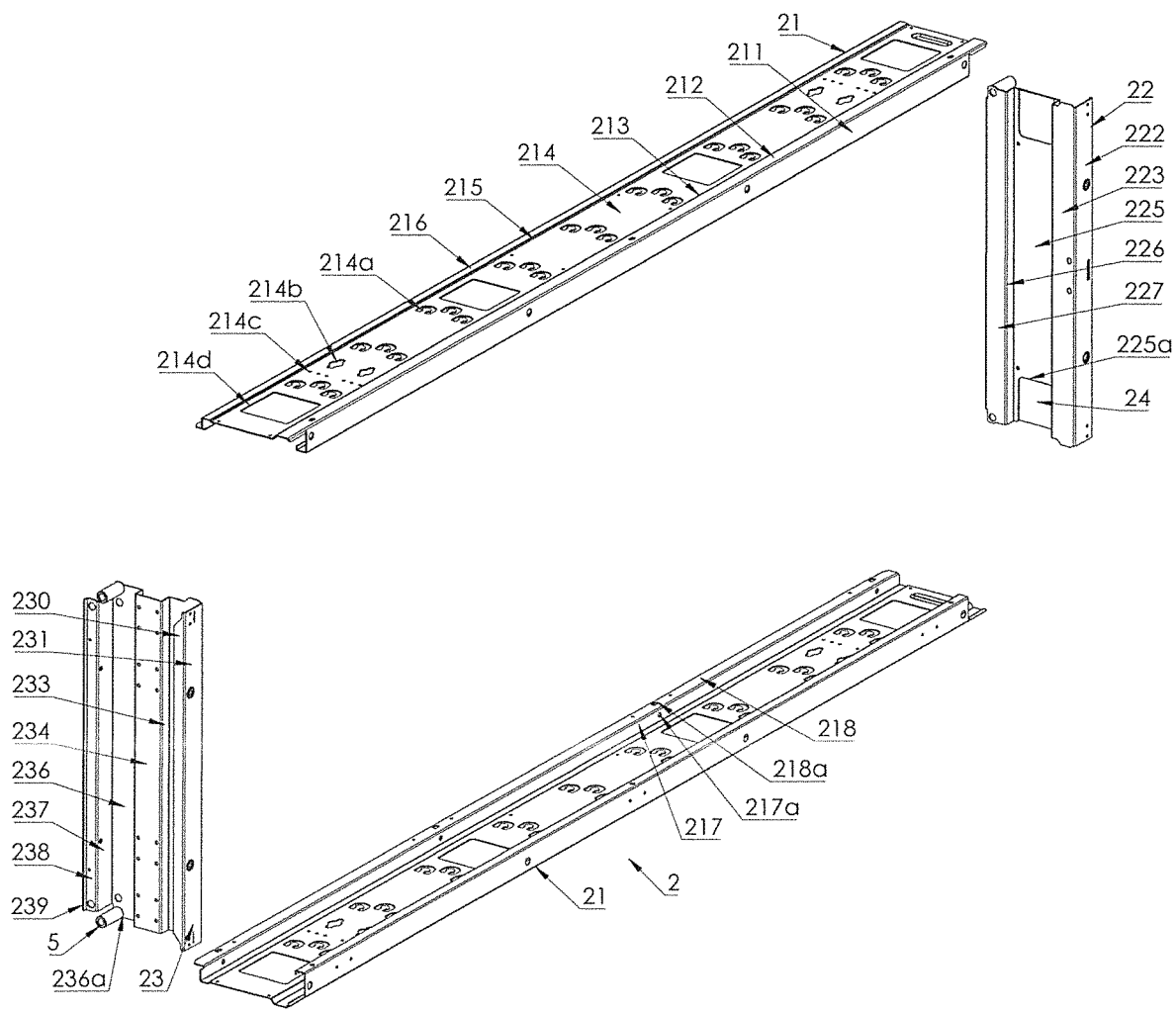
FIG. 12B is an exploded perspective view of the rear frame assembly of FIG. 12A.
Figure 16:
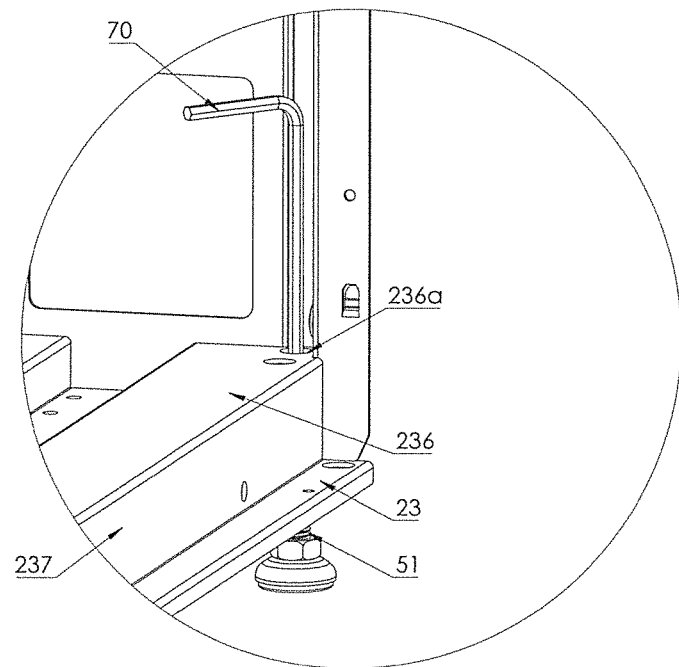
FIG. 16 is an enlarged perspective view of the rear frame assembly showing a leveling foot subassembly.
Figure 17:
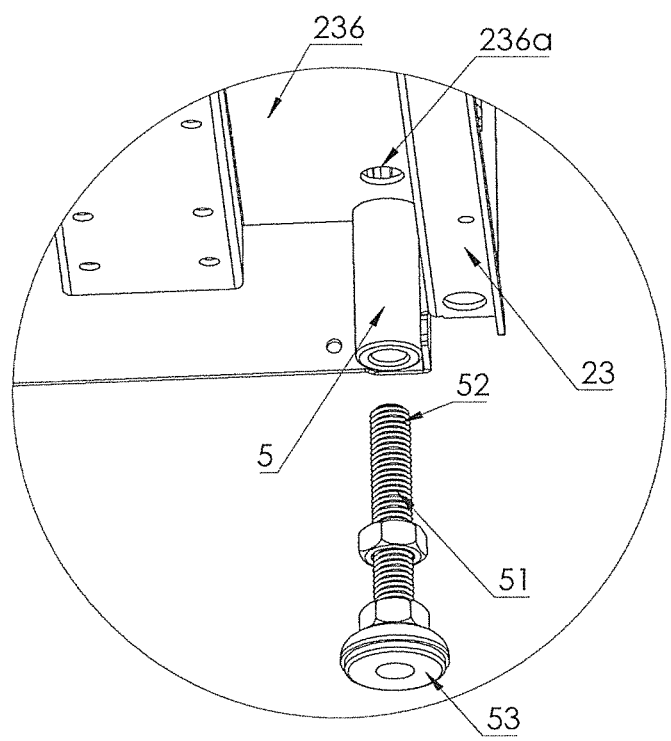
FIG. 17 is an exploded bottom view of the leveling foot subassembly of FIG. 16.
Figure 18:
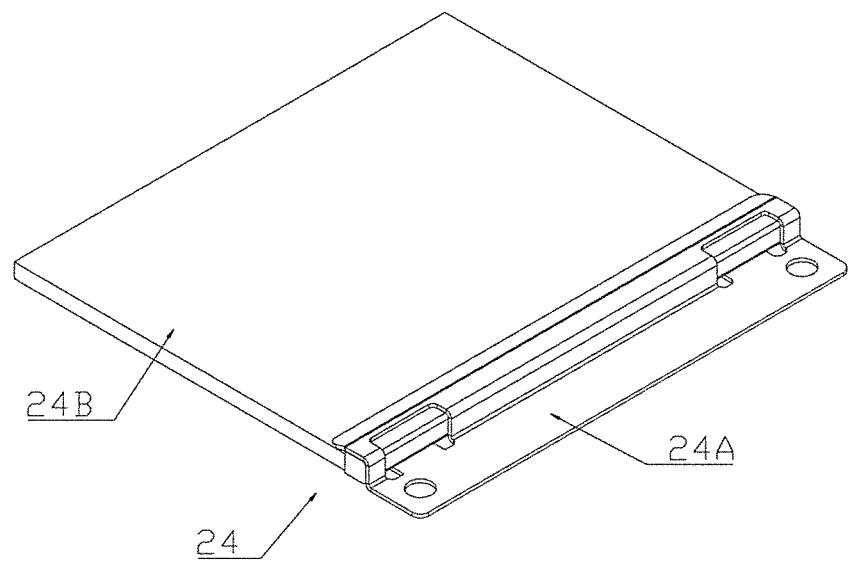
FIG. 18 is a perspective view of a cable entry assembly for the present invention.
Figure 19:
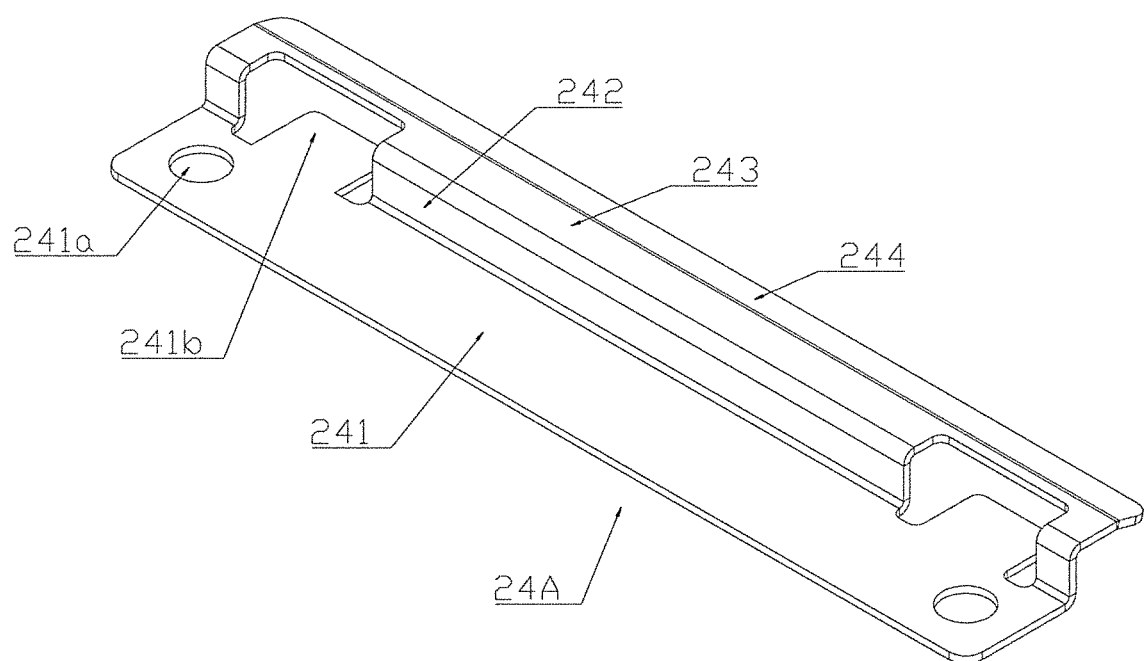
FIG. 19 is a perspective view of a mounting bracket for the cable entry assembly of FIG. 18.
Figure 20:
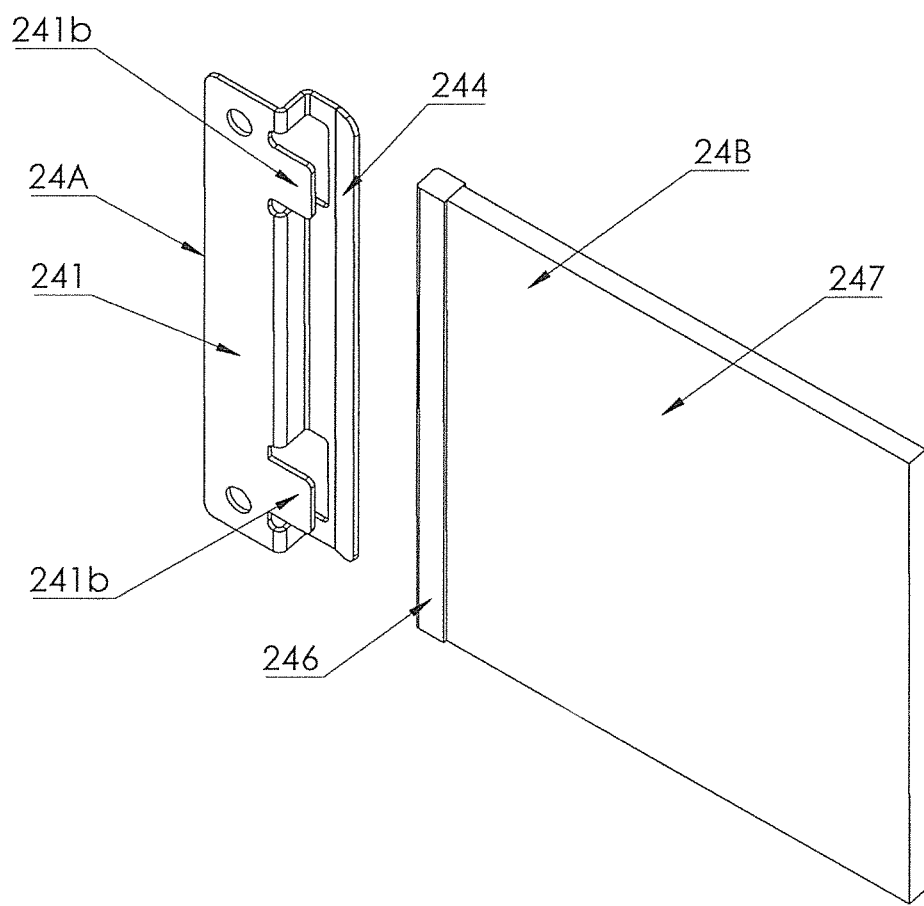
FIG. 20 is an exploded perspective view of the cable entry assembly of FIG. 18.

Referring to FIGS. 12A, 16 and 17, an adjustable foot assembly is provided on the rear lower frame beam 23. The foot assembly has a cylinder 5 with a threaded bore, and a threaded bolt 51 that functions as a leg. The cylinder 5 is positioned below the surface 236, and adjacent the surface 237. Openings 236a are provided in the surface 236 above the cylinder 5. The threaded bolt 51 has a threaded shaft 52 and a flat head 53 that functions as a stand for the foot. In use, the shaft 52 is threaded into the threaded bore of the cylinder 5, and the position of the head 53 can be adjusted up or down by turning the shaft 52 inside the threaded bore. This can be accomplished by inserting an end of a wrench tool 70 through the opening 236a into the threaded bore to engage the end of the shaft 52. Similarly, referring to FIG. 8A, the front lower frame beam 13 of the front frame assembly 1 may have similar openings 136a on the surface 133 to access similar cylinders 5. Thus, the height of the lower frame beams 13 and 23 off the ground can be easily and quickly adjusted by inserting the wrench tool 70 through the openings 136a and 236a, without the need to effectuate the adjustment from underneath the lower frame beams 13 and 23. In other words, the openings 136a and 236a offer access to adjust the threaded bolt 51 from inside the enclosure, so that the operator does not need to access the threaded bolt 51 from outside the enclosure.

Referring to FIGS. 4A, 4B, 5, 6 and 7, the side brace member 3 has a beam 31 and connecting brackets 32 attached on both ends of the beam 31. Each beam 31 has a recessed surface 311 with two vertical surfaces 312 and 313 extending by ninety degrees from either end of the recessed surface 311. Two flange surfaces 314 and 315 extend by ninety degrees from the vertical surfaces 312 and 313, respectively. The beam 31 can also be formed by bending a plate material, such as metal.

Each connecting bracket 32 has retaining members, such as slots 322a, provided on a mounting surface 322 of the connecting bracket 32. The hooks 119a and 218a of the pillars 11 and 21, respectively, are adapted to be inserted into separate corresponding slots 322a to bring the connecting bracket 32 into contact with the limiting member (i.e., mounting surface 119) of the front pillar 11, or the limiting member (i.e., mounting surface 218) of the rear pillar 21. The limiting members are bent from corresponding fastening surfaces 118 and 217, which helps to increase the rigidity of the pillars 11 and 21. The limiting members (mounting surfaces 119 and 218) fix the side brace member 3 to the pillars 11, 21, and provide resistance to lateral loads applied to the side brace members 3, thereby enhancing the structural stability. This is best illustrated in connection with FIGS. 4A and 4B.

Each connecting bracket 32 also includes a fastening member, such as a secured nut 321a, provided on the fastening surface 321. The fastening surface 321 is also recessed or distanced by a distance W from the end edge 300 of the beam 31 by a distance of 0.5 to 25 mm. Therefore, when a connecting bolt 4 connects the nut 321a and the front pillar 11 through the mounting hole 118a (or connects the nut 321a to the rear pillar 21 through the mounting hole 217a), because the fastening surface 321 is recessed from the end edge 300, the fastening surface 321 is not in direct contact with the fastening surfaces 118 and 217 on the pillars 11 and 21.

Thus, the fastening distance and the fastening force are adaptable. This elastic fastening structure between the fastening surface 321 and the end edge 300, together with frictional contact between the end edge 300 and the fastening surfaces 118 and 217, frictional contact between the mounting surface 322 and the mounting surfaces 119 and 218, and frictional contact between the bolt 4 and fastening surfaces 118 and 217, behaves like an viscoelastic system which offers excellent resistance to impact forces or dynamic loads by absorbing energy. For example, due to this elastic fastening structure, tightening the bolt 4 brings the fastening surface 321 closer to the fastening surface 118 or 217 by slightly deflecting the fastening surfaces 118, 217 inwardly. This results in higher internal tension forces inside the bolt 4, which in return exerts higher contacting forces on the fastening surfaces 118, 217, and the higher contacting forces also result in higher frictional forces between these surfaces. In particular, because the side brace member 3 has a fastening structure on both ends, the side brace member 3 experiences higher compressional forces in the frame structure. These compressional forces reinforce the attachment of the side brace member 3 to the pillars 11 and 21 and make the frame structure substantially rigid. Thus, the structural stability is greatly improved with high resilience to both in-plane (along the fastening direction) and out-of-plane (transverse to the fastening direction) external loads.

The connecting bracket 32 can be formed by bending a plate material, such as metal. The fastening surface 321 is bent inwardly by ninety degrees to form the mounting surface 322, then bent inwardly to form an angled surface 323. This angled surface 323 improves the strength of the connecting bracket 32. This is best illustrated in connection with FIG. 7.

Unlike the conventional flat planar surface to surface contact found in conventional frame structures, the fastening surfaces 118 and 217 on the pillars 11 and 21 are in contact with the end edge 300 of the side brace member, and the fastening surface 321 of the side brace member 3 is recessed from the end edge 300. Therefore, small dents and notches (that are less than the size of the recessed structure) on the ends, or any imperfections on fastening surfaces 118, 217 will not degrade the effectiveness of the fastening. The approach taken by the present invention maximizes tolerance for assembly requirements Referring to FIGS. 1, 2, 18, 19, 20, 21, 22 and 25, one or more cable entry assemblies 24 can be provided in the rear upper frame beam 22 and/or top cover 7. Each cable entry assembly 24 has a mounting bracket 24A and a cable brush structure 24B. The mounting bracket 24A can be formed from bending a plate material, which is provided with a mounting plate 241 having one side bent outwardly by ninety degrees to form a supporting wall 242, and then bent by another ninety degrees to form a transition wall 243. A curved or angled entrapment plate 244 extends from an edge of the transition wall 243. The mounting plate 241 includes one or more mounting openings 241a and one or more fastening tabs 241b that extend parallel with the transition wall 243, and together with the entrapment plate 244 defines a receiving space. The mounting openings 241a allow for installation of the cable entry assembly 24 to the rear upper frame beam 22. The opening 225a of the rear upper frame beam 22 is aligned with the brush part 247 (as described below) of the cable brush structure 24B, and allows cables to pass through the rear upper frame beam 22 and cable entry assembly 24. The coupling edge 246 of the cable brush structure 24B is received into the space between the entrapment plate 244 and the fastening tab(s) 241b, thereby providing a snap-fit installation for the cable brush structure 24B, and easy replacement of the cable brush structure 24B. The cable brush structure 24B also has a brush 247 for allowing cables 248 to extend therethrough.

Figure 21:
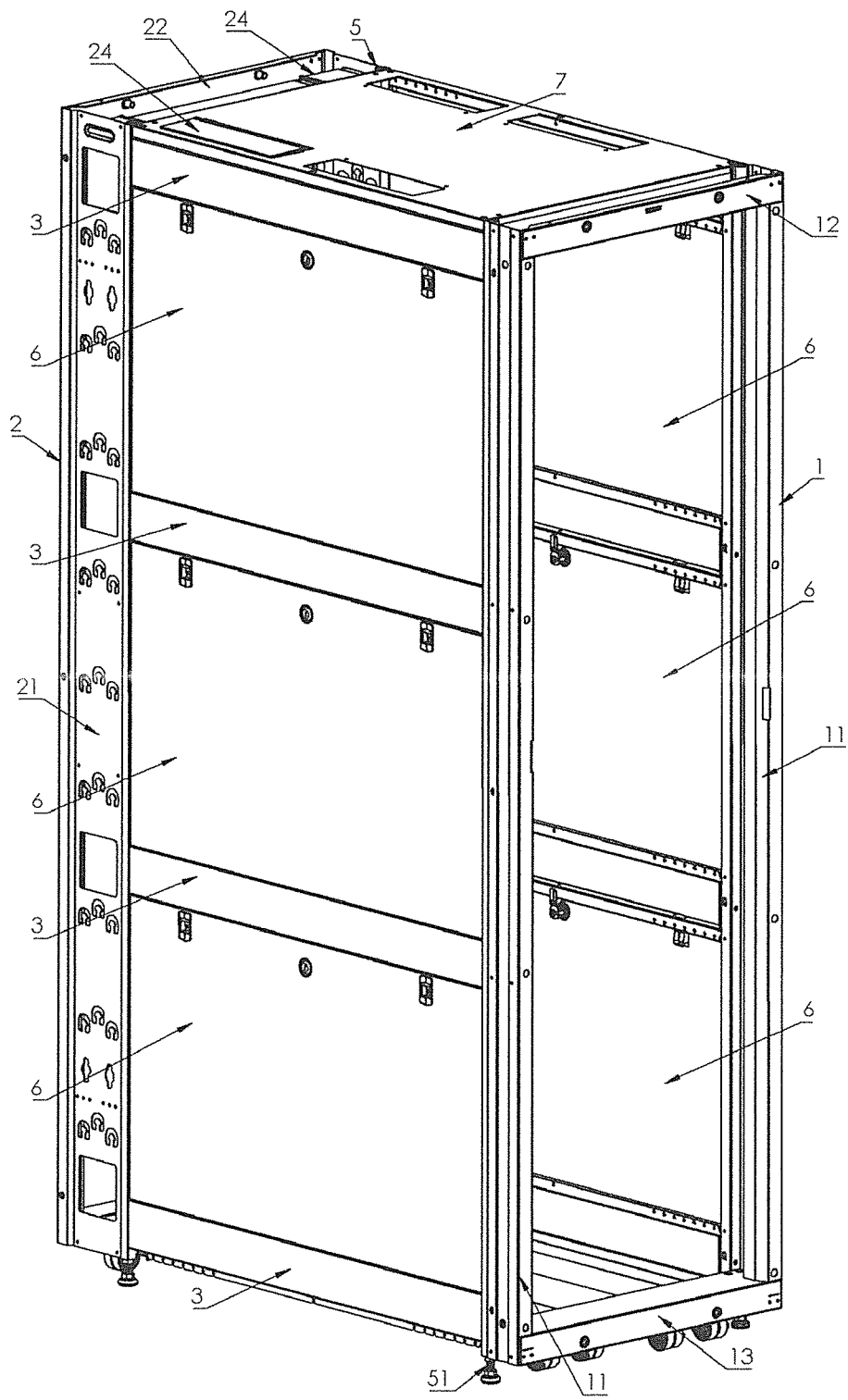
FIG. 21 is a perspective view of the enclosure cabinet according to the present invention showing the side panels installed on to the frame structure of FIG. 1.
Figure 22:
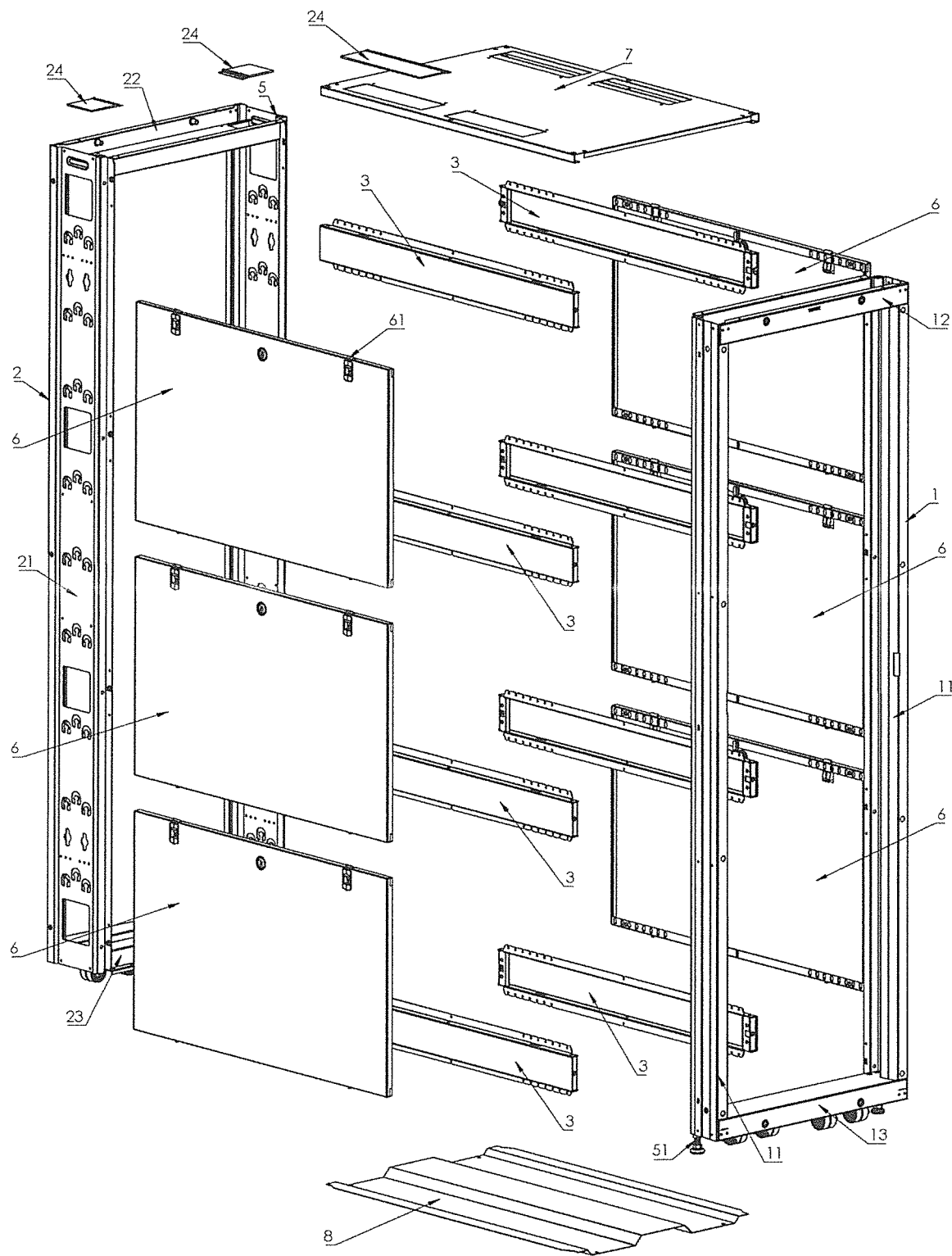
FIG. 22 is an exploded perspective view of the enclosure cabinet of FIG. 21.
Figure 23:
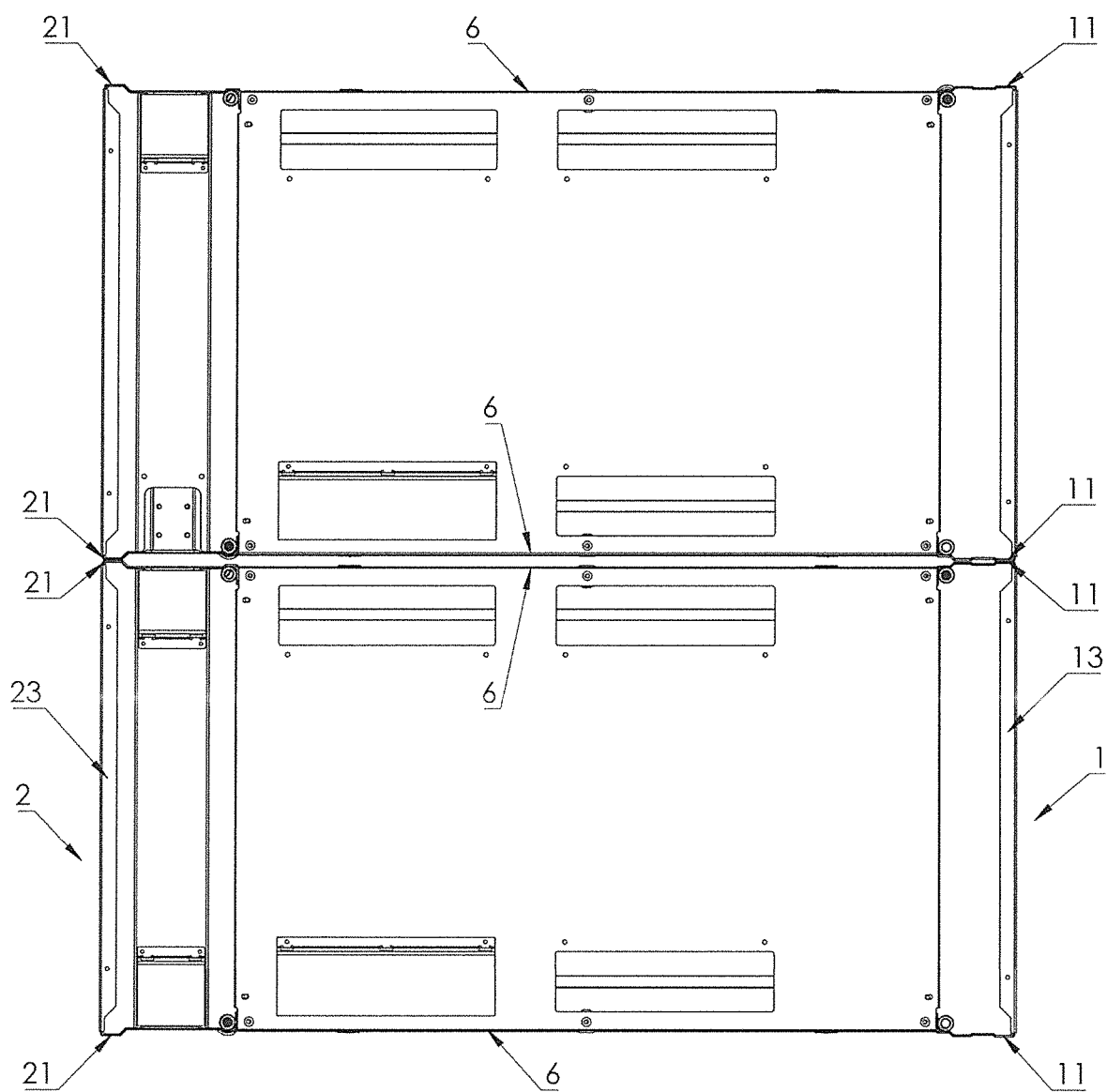
FIG. 23 is a top view of two enclosure cabinets of the present invention shown installed side by side.

Referring now to FIGS. 21, 22 and 24, the side panels 6 can be secured to the recessed flange surfaces 314 and 315 of the beams 31 of the side brace members 3. Specifically, each pair of vertical surface 312/313 and flange surface 314/315 provides a recessed attachment area for connecting edges of each side panel 6 to the beams 31. In addition, each pair of vertical fastening surface 118/217 and mounting surface 119/218 (which functions as limiting member) provides a recessed attachment area for side edges of each side panel 6 to the front pillar 11 or the rear pillar 21. As a result, the outer surfaces of these side panels 6 are also recessed from the outermost surface of the frame assemblies 1 and 2. The flange surface 314/315 and the mounting surface 119/218 can overlap and contact with connecting edges of these side panels 6, and can therefore effectively block airflow through the side of cabinet enclosure. This provides better airflow control which leads to a more energy efficient cooling approach for cabinet enclosures. The upper edge of each side panel 6 can be connected to the lower vertical surface 313 (via slots 313a) and the lower flange 315 (via openings 315a) of an upper beam 31, and the lower edge of each side panel 6 can be connected to the upper vertical surface 312 (via slots) and the upper flange 314 (via openings 314a) of a lower beam 31. Each side panel 6 can have latches 61 that can be inserted through the slots 313a.

Second and Third Embodiments

FIGS. 26-65 illustrate additional embodiments, modifications and enhancements to the frame structure described above. FIGS. 26-40 illustrate a second embodiment of the frame structure of the cabinet enclosure, while FIGS. 41-65 illustrate a third embodiment of the frame structure of the cabinet enclosure. The second and third embodiments are essentially the same, but the third embodiment provides a "wider" version of the frame structure of the second embodiment by including the intermediate connecting member(s) 17. By adding the intermediate connecting members 17, the wider frame structure provides a greater amount of space and volume to allow more cables to be run through the enclosure. If fewer cables are needed, then the second embodiment would be sufficient.

The second and third embodiments both function to provide cable management and ventilation (or thermal air flow) management.

For example, since these types of racks and enclosure cabinets are typically used for housing rack-mounted computer systems and other IT equipment, cables may need to be routed and coupled to IT equipment within the rack or cabinet, and may even need to be routed and coupled to other devices external to the rack or cabinet to facilitate network connections. The routed cables have various sizes and lengths, and may consume considerable amount of space within the cabinet and through the cable entry openings of the cabinet. Thus, there is a need for an integral cable management system to provide neat organization and routing of cables without restricting the use of other cabinet functions or access to IT equipment mounted therein.

In addition, in order to achieve efficient cooling of the electronic equipment mounted therein, the cabinet requires integral thermal air flow management to effectively remove heat generated by electronic equipment, and to supply fresh cool air, while simultaneously blocking air flow to unwanted areas so as to maximize air flow efficiency. The present invention provides an arrangement of components that allow cooling air flow to be drawn from front-to-rear, or rear-to-front, directly into the electronic equipment without allowing cooling air to escape from the sides of equipment, and venting out the exhaust to the rear or front of the enclosure cabinet.

The second embodiment in FIGS. 26-36 includes a front frame assembly 1x, a rear frame assembly 2x, middle side brace members 3y, upper and lower side brace members 3x, and connectors (e.g., bolts) 4 to fasten the side brace members 3y and 3x with the frame assemblies 1x and 2x. Side panels 6 (not shown in FIG. 26) can be installed on the surface defined by recessed flange surfaces 314, 315 of the middle side brace members 3y, and 315x of the upper and lower side brace member 3x. A top cover 7x can be installed on the top of the front frame assembly 1x and the rear frame assembly 2x. A base 8x (i.e., a bottom cover) can be installed on the bottom of the front frame assembly 1x and the rear frame assembly 2x.

Furthermore, referring to FIGS. 29 to 32, the front frame assembly 1x has two front pillars 11x and two front frame beams 13x. Each front pillar 11x may further include a plurality of fastening members, such as mounting holes 118a, on a fastening surface 118x.

Figure 31:
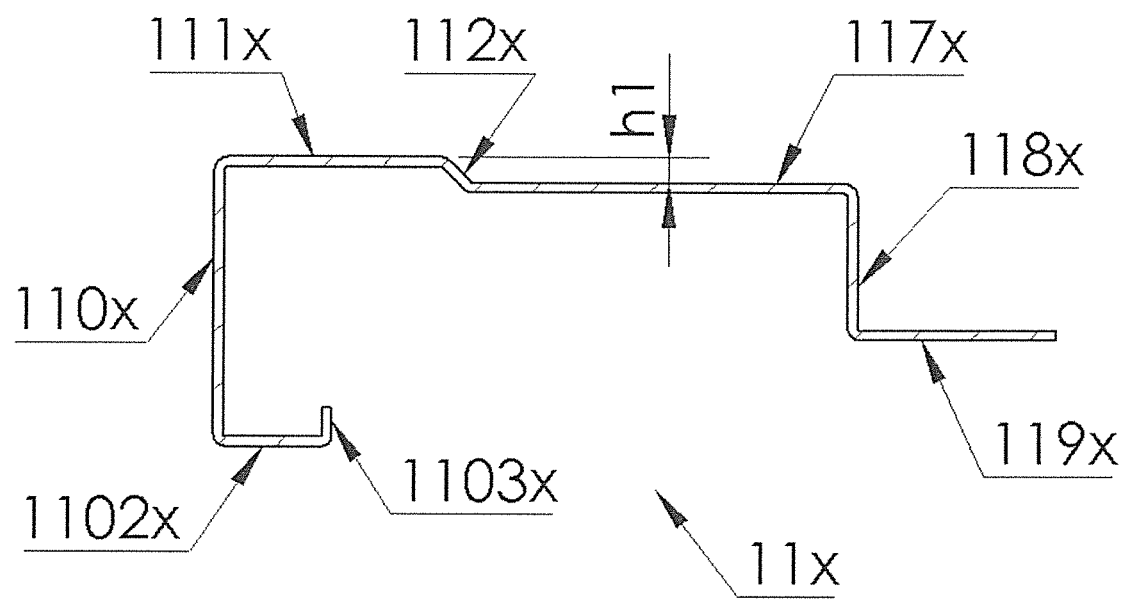
FIG. 31 is a cross-sectional view of the front pillar of the front frame assembly of FIG. 29.

As best shown in FIG. 31, the front pillar 11x can be formed by forming multiple surfaces using methods such as bending a metal plate. The front pillar 11x has a front surface 110x. One end of the front surface 110x is bent inwardly by about ninety degrees into an enclosing surface 1102x, which ends in a lip 1103x that extends about ninety degrees from the enclosing surface 1102x. The other end of the front surface 110x is bent inwardly by about ninety degrees into a front side that has a raised surface 111x which transitions into a recessed surface 117x via an angled transition surface 112x. The recessed surface 117x is bent inwardly by ninety degrees to form a fastening surface 118x, which is then further bent outwardly by ninety degrees to form a limiting member, which is a mounting surface 119x. The mounting surface 119x can have a width of 1 to 100 mm. The surfaces 111x and 117x are parallel with the surface 1102x. A plurality of retaining members, such as hooks 119a, can be provided on the mounting surface 119x, and a plurality of fastening members, such as mounting holes 118a, can be provided on the fastening surface 118x. The edge that connects the surface 1102x and the surface 110x is provided with snap openings 110a (see FIGS. 29 and 30) for installation of a flexible cable duct 14 (see FIG. 39).

The offset distance h1 between the recessed surfaces 111x and 117x can be similar to the offset distance h1 in the first embodiment above, and is between 1 to 25 mm. These bends and transition surfaces increase the rigidity of the front pillar 11x against bending moment and deflection forces applied to it, thereby improving the strength and stability of the front frame assembly 1x.

Figure 32:
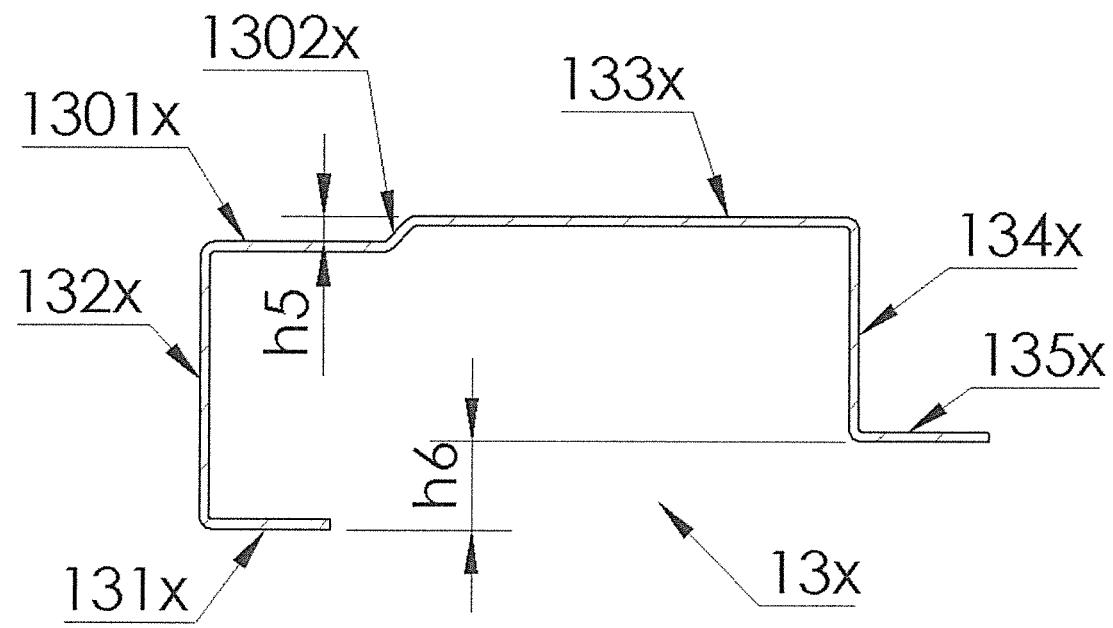
FIG. 32 is a cross-sectional view of the front frame beam of the front frame assembly of FIG. 29.

As best shown in FIG. 32, the front frame beam 13x can also be formed by bending a plate material. The first surface 131x of the front side of the frame beam 13x is bent inwardly by ninety degrees to form a second surface 132x, then bent ninety degrees inwardly to form a recessed third surface 1301x, and then bent at an angle outwardly to form a transition surface (fourth) 1302x, then bent inwardly to form a raised fifth surface 133x. From the opposite end of the fifth surface 133x, a further inward ninety-degree bend forms a sixth surface 134x, and a seventh surface 135x is formed by bending outwardly by ninety degrees. The offset distance h5 between the recessed surface 1301x and the raised surface 133x is between 1 to 25 mm. The seventh surface 135x is parallel to the first surface 131x, and the offset distance h6 between the surfaces 131x and 135x is between 1 to 100 mm.

Referring to FIGS. 33 to 36, the rear frame assembly 2x has two rear pillars 21x and two rear frame beams 23x. Each rear pillar 21x may further include a plurality of fastening members, such as mounting holes 217a, on a fastening surface 217x.

Figure 35:
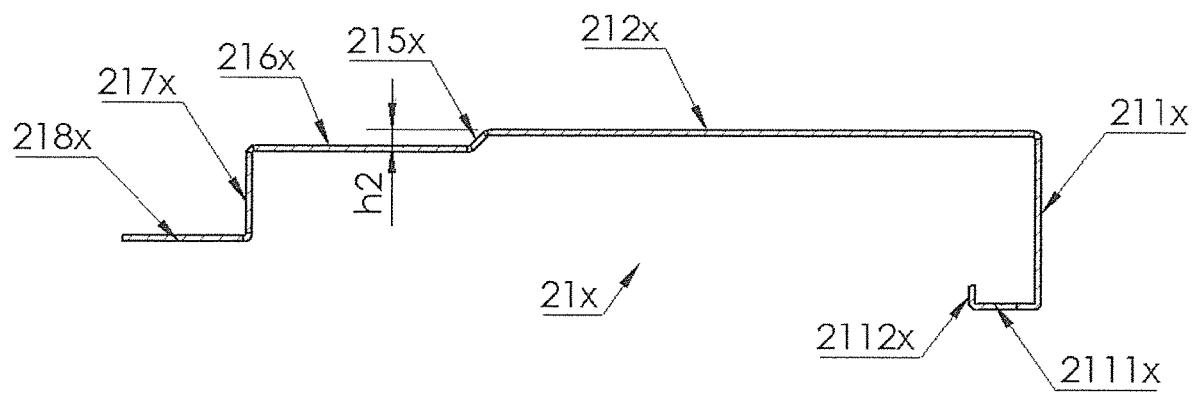
FIG. 35 is a cross-sectional view of the rear pillar of the rear frame assembly of FIG. 33.

As best shown in FIG. 35, the rear pillar 21x can be formed by forming multiple surfaces using methods such as bending a metal plate. The rear pillar 21x has a rear front surface 211x. One end of a lateral surface 2111x extends by ninety degrees from one end of the rear front surface 211x, and the other end of the lateral surface 2111x is bent inwardly by about ninety degrees to form a lip 2112x. The other end of the rear front surface 211x is bent inwardly by about ninety degrees to form a raised side surface 212x, and then bent inwardly at an angle to form a transition surface 215x, and further bent outwardly to form a recessed surface 216x that is parallel to the rear side surface 212x. From the surface 216x, the plate is bent inwardly by ninety degrees to form a fastening surface 217x, and then further bent outwardly by 90 degrees to form a mounting surface 218x which functions as a limiting member. The mounting surface 218x can have a width of 1 to 100 mm. Each rear pillar 21x has a plurality of retaining members, such as hooks 218a, on the mounting surface 218x, and a plurality of fastening members, such as mounting holes 217a, on the fastening surface 217x.

The offset distance h2 between the recessed surface 216x and the raised rear side surface 212x can be similar to the offset distance h2 in the first embodiment above, and is between 1 to 25 mm. Similar to the front pillar 11x, these bends and transition surfaces increase the rigidity of the rear pillar 21x against bending moment and deflection forces applied to it, thereby improving the strength and stability of the rear frame assembly 2x. The side panels 6 from FIGS. 21-25 can be installed on the recessed flange surfaces 315x and 314, 315 of the side brace members 3x and 3y (as described below), the mounting surface 119x of the front frame assembly, and the mounting surface 218x (as described below) of the rear frame assembly 2x. After installation of the front frame assembly 1x, the rear frame assembly 2x and the side panels 6, the outer surface of each side panel 6 is recessed from the raised surface 111x of the front frame pillar 11x, and the raised surface 212x of the rear frame pillar 21x. Since the recessed distance is equal to or greater than the offset distance h1 of 1 to 25 mm, when a plurality of these cabinet enclosures are bayed side by side, even if these cabinet enclosures have pre-installed side panels 6, the contact surface area at the front frame assembly 1x, the rear frame assembly 2x and side panels 6 between the adjacent cabinet enclosures will be small, and less than 5% of the total side area of the cabinet enclosure.

Figure 36:
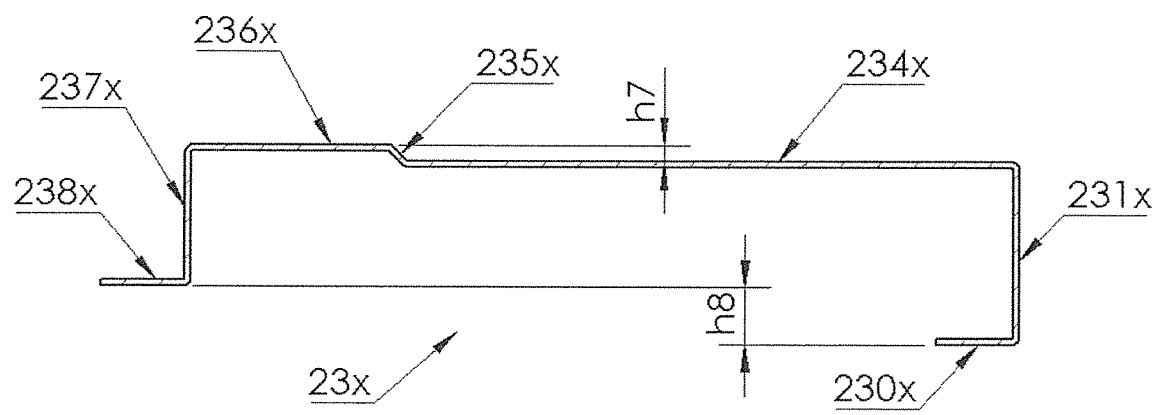
FIG. 36 is a cross-sectional view of the rear frame beam of the rear frame assembly of FIG. 33.

As best shown in FIG. 36, the rear frame beam 23x can be formed by bending a plate material such as a metal plate. One end of a first surface 230x is bent inwardly by ninety degrees into a second surface 231x, and then bent inwardly ninety degrees to form a third surface 234x that is parallel to the first surface 230x. The third surface 234x is then bent outwardly at an angle to form a transition (fourth) surface 235x, then bent inwardly at an angle to form a fifth surface 236x, and then bent ninety degrees inwardly to form a sixth surface 237x that is parallel to the second surface 231x. A seventh surface 238x is bent outwardly ninety degrees from the sixth surface 237x. The third surface 234x is recessed from the fifth surface 236. The offset distance h7 between the recessed surface 234x and the raised surface 236x is between 1 to 25 mm. The surface 238x is parallel to, and spaced from, the surface 230x with an offset distance h8 between 1 to 100 mm.

Referring to FIGS. 29, 30, 33 and 34 showing the front and rear frame assemblies, each of the front frame beam 13x and the rear frame beam 23x has a caster mounting bracket 250 which is adapted for receiving and securing casters (not shown). The second surface 132x of the front frame beam 13x is provided with a plurality of mounting holes 132a. Similarly, the second surface 231x of the rear frame beam 23x is provided with a plurality of mounting holes 231a. These mounting holes 132a and 231a can be used for securing the enclosure to the ground by using a floor bracket (not shown). The enclosure can be secured from the bottom, or from the side of, the enclosure, using these additional mounting holes. The surface 133x of the rear frame beam 13x is provided with cable entry openings 133a. The surface 234x of the rear frame beam 23x is also provided with cable entry openings 234a.

Figure 7:
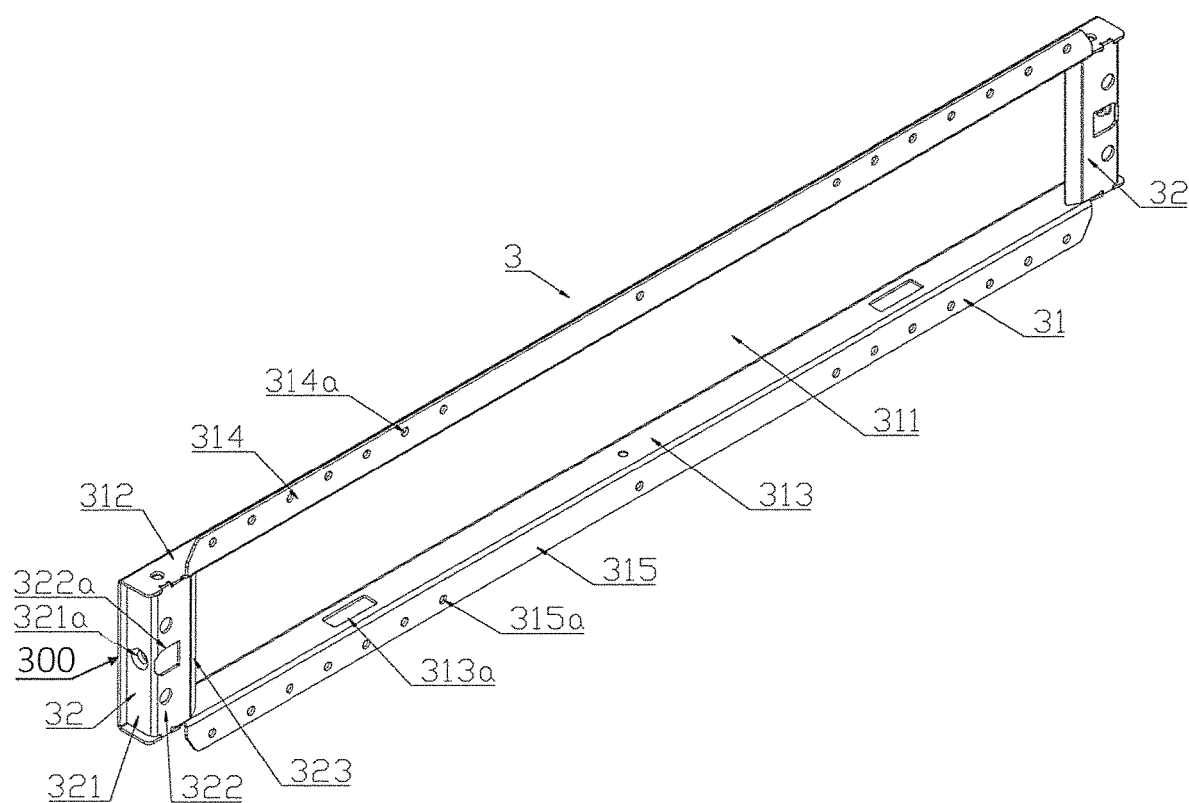
FIG. 7 is a perspective view of a side brace member of the frame structure of FIG. 1 with connecting brackets at both ends.
Figure 8A:
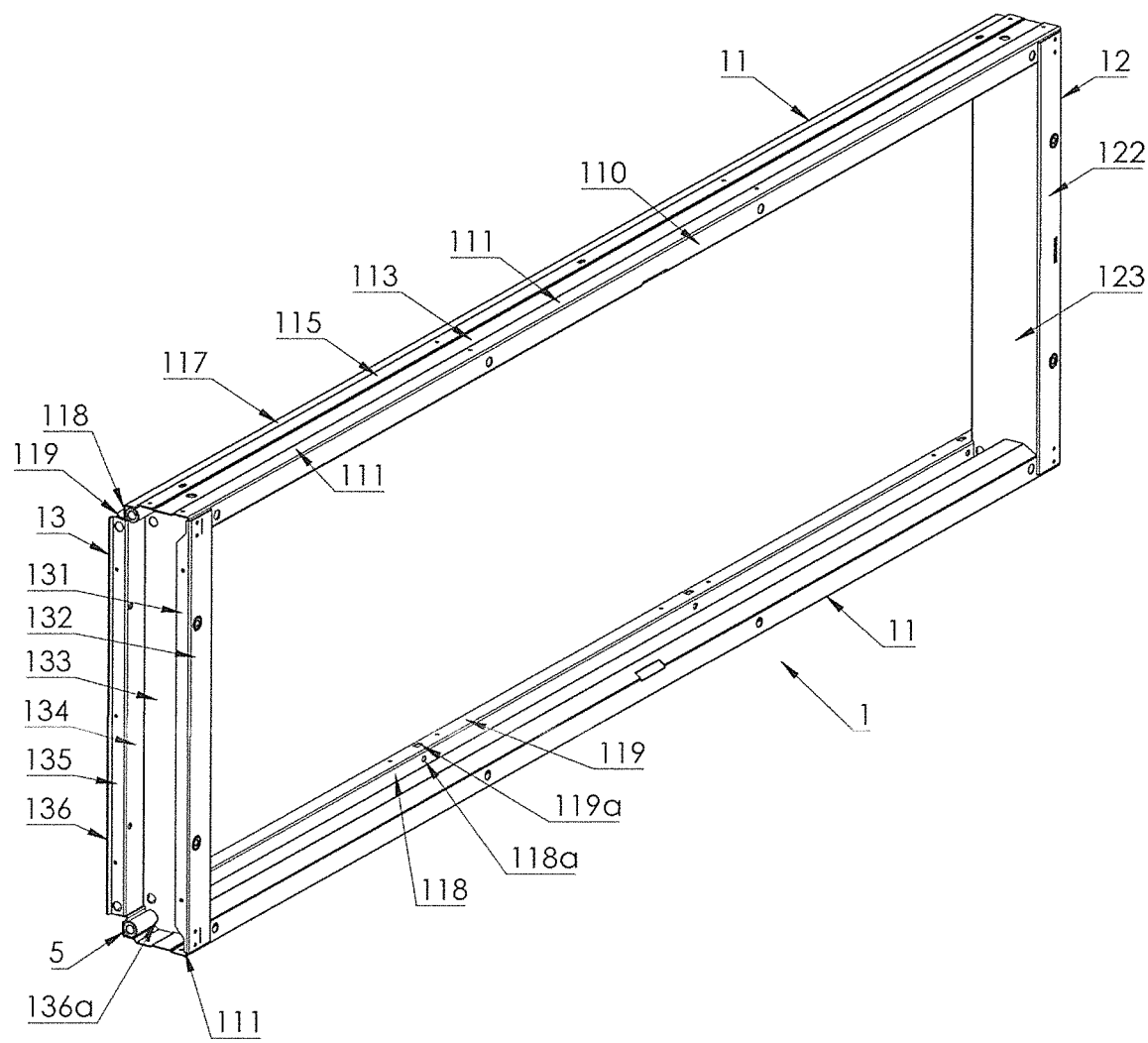
FIG. 8A is a perspective view of the front frame assembly of the frame structure of FIG. 1.
Figure 8B:
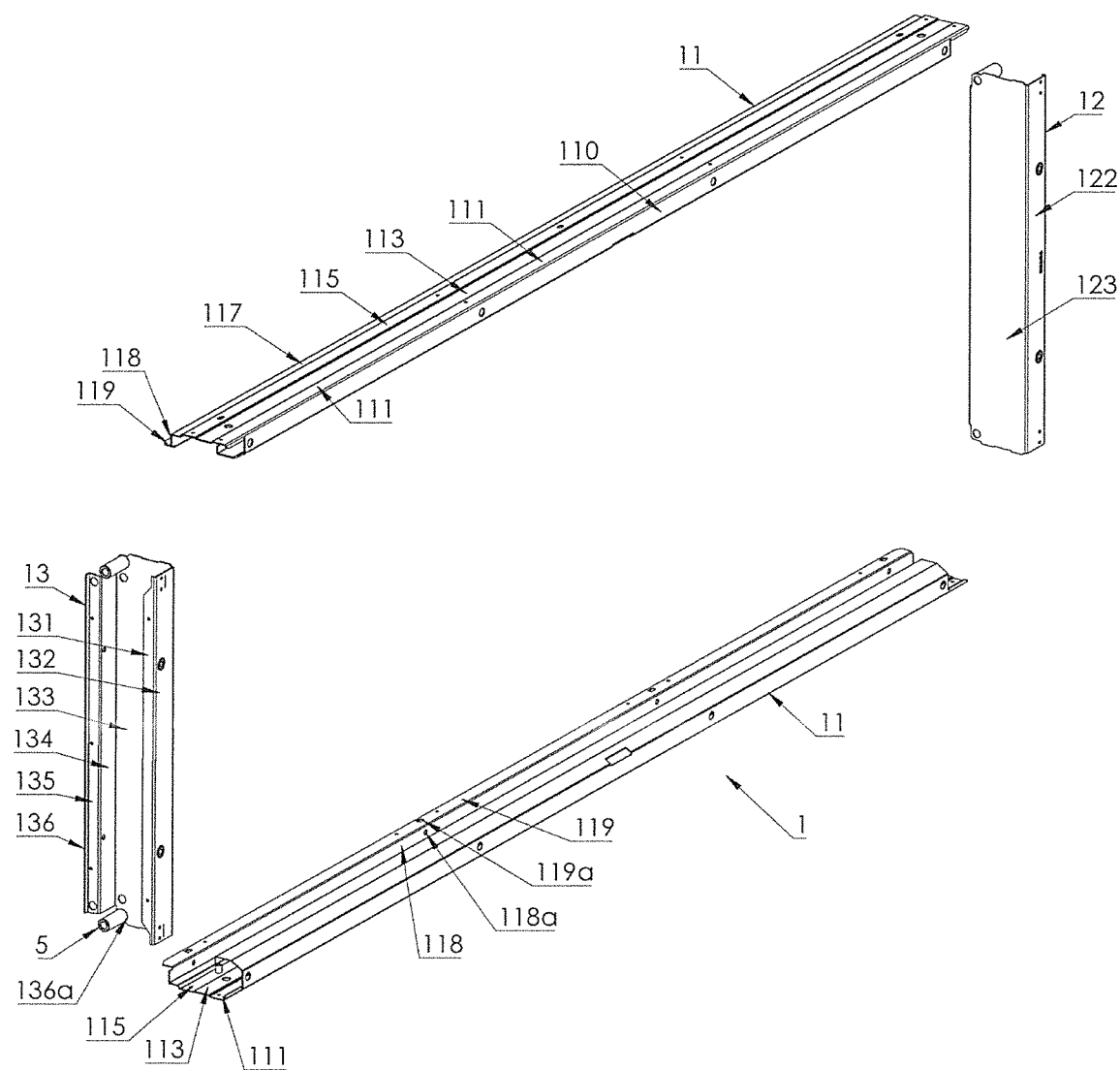
FIG. 8B is an exploded perspective view of the front frame assembly of FIG. 8A.

Connecting brackets 32x and 32y are modifications of the connecting bracket 32 in FIG. 7. The connecting brackets 32x and 32y shown in FIGS. 27 and 28 can be the same, and can be formed by bending a plate material (such as metal) in the manner described above. The fastening surface 321x or 321y is bent inwardly by ninety degrees to form the mounting surface 322x or 322y, and include two or more fastening members, such as a secured nut 321a, provided on the fastening surface 321x or 321y.

Figure 27:
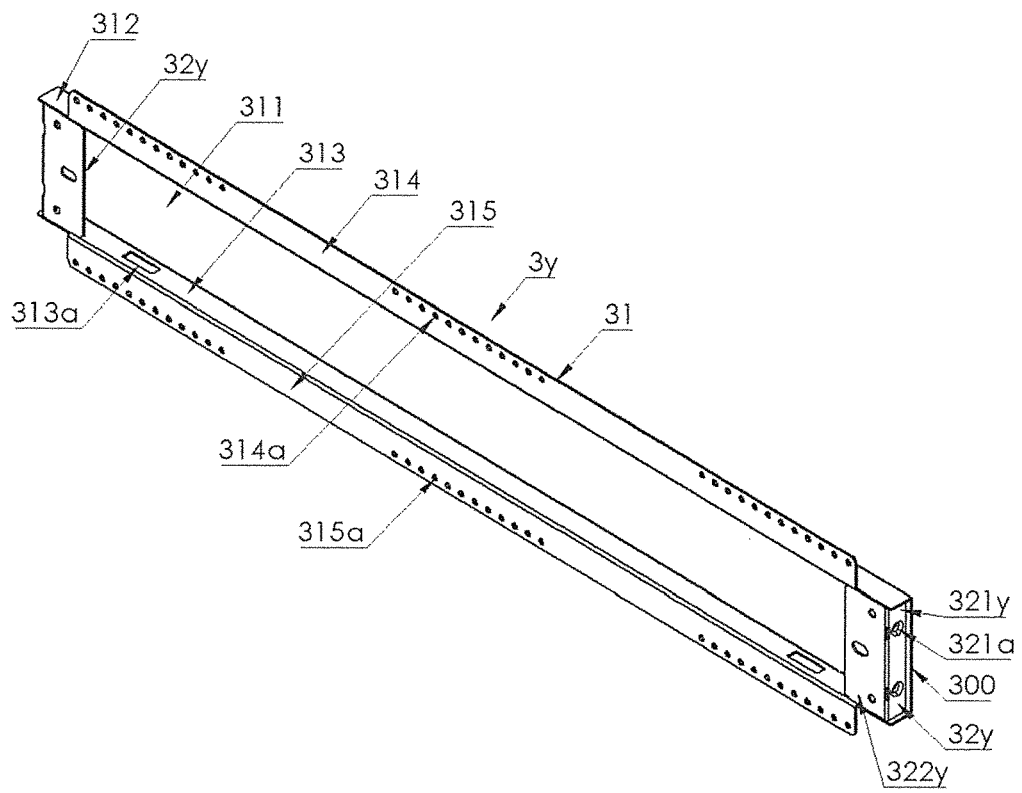
FIG. 27 is a perspective view of a side brace member of the frame structure of FIG. 26 with connecting brackets at both ends.

Referring to FIG. 27, the side brace member 3y has a beam 31 and connecting brackets 32y attached on opposite ends of the beam 31. Other than the connecting bracket 32y, the other elements in FIG. 27 are the same as shown in FIG. 7, so the same numerals in both FIGS. 7 and 27 depict the same elements.

Figure 28:
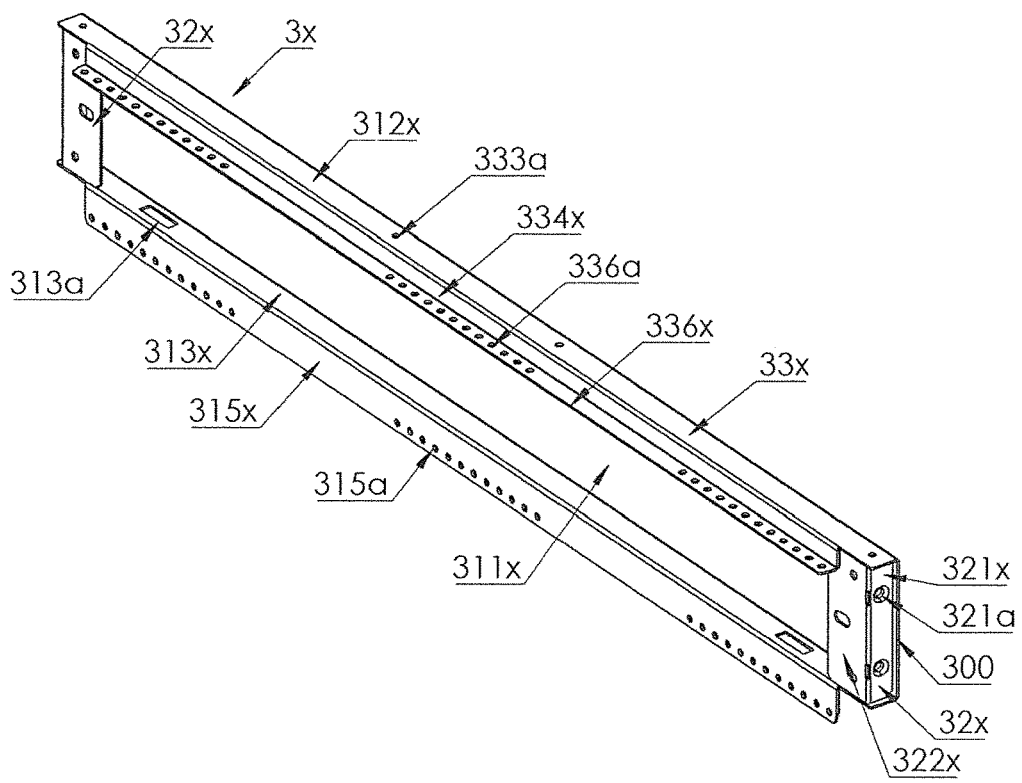
FIG. 28 is a perspective view of another side brace member of the frame structure of FIG. 26 with connecting brackets at both ends.
Figure 29:
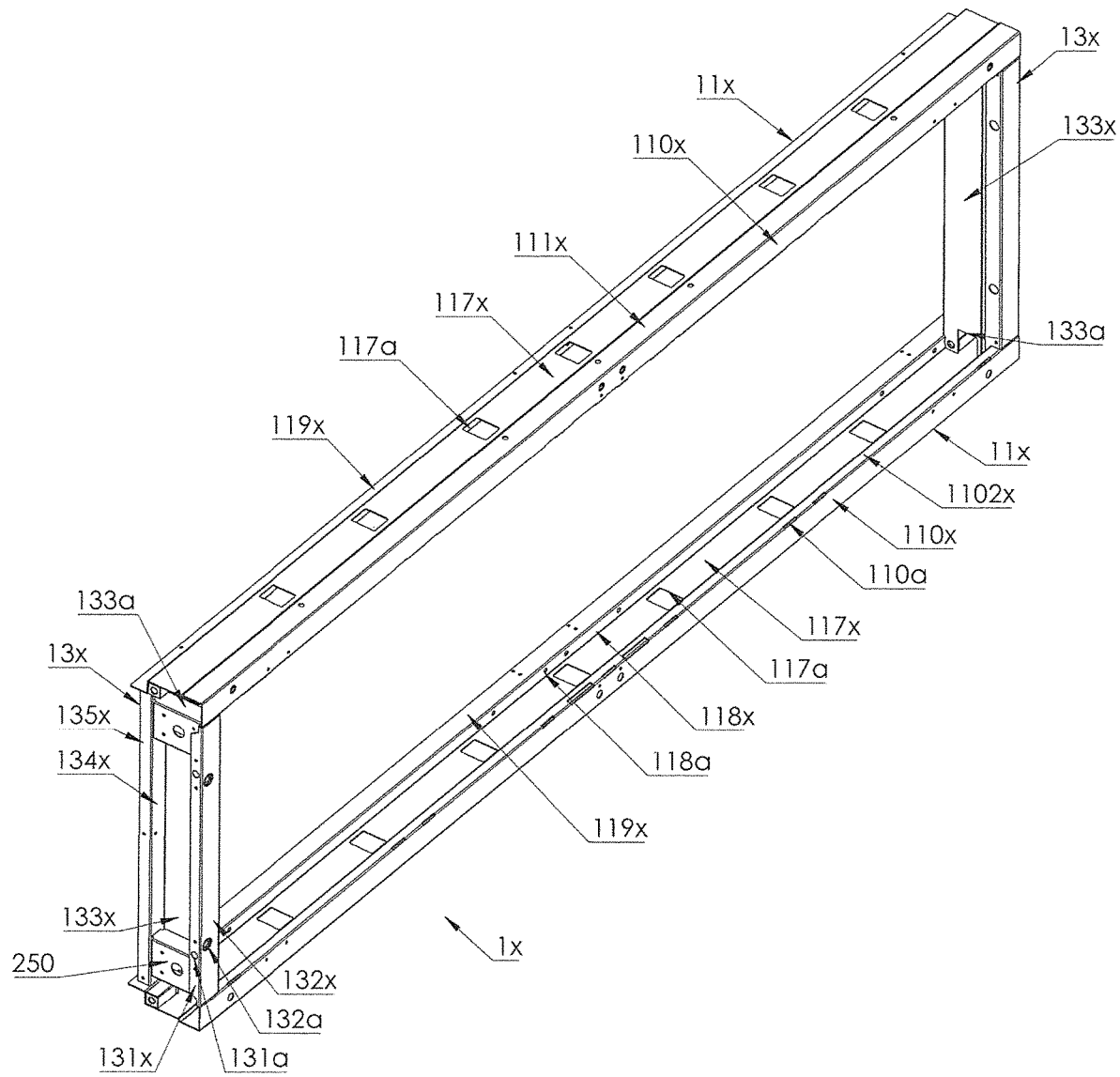
FIG. 29 is a perspective view of the front frame assembly of the frame structure of FIG. 26.
Figure 30:
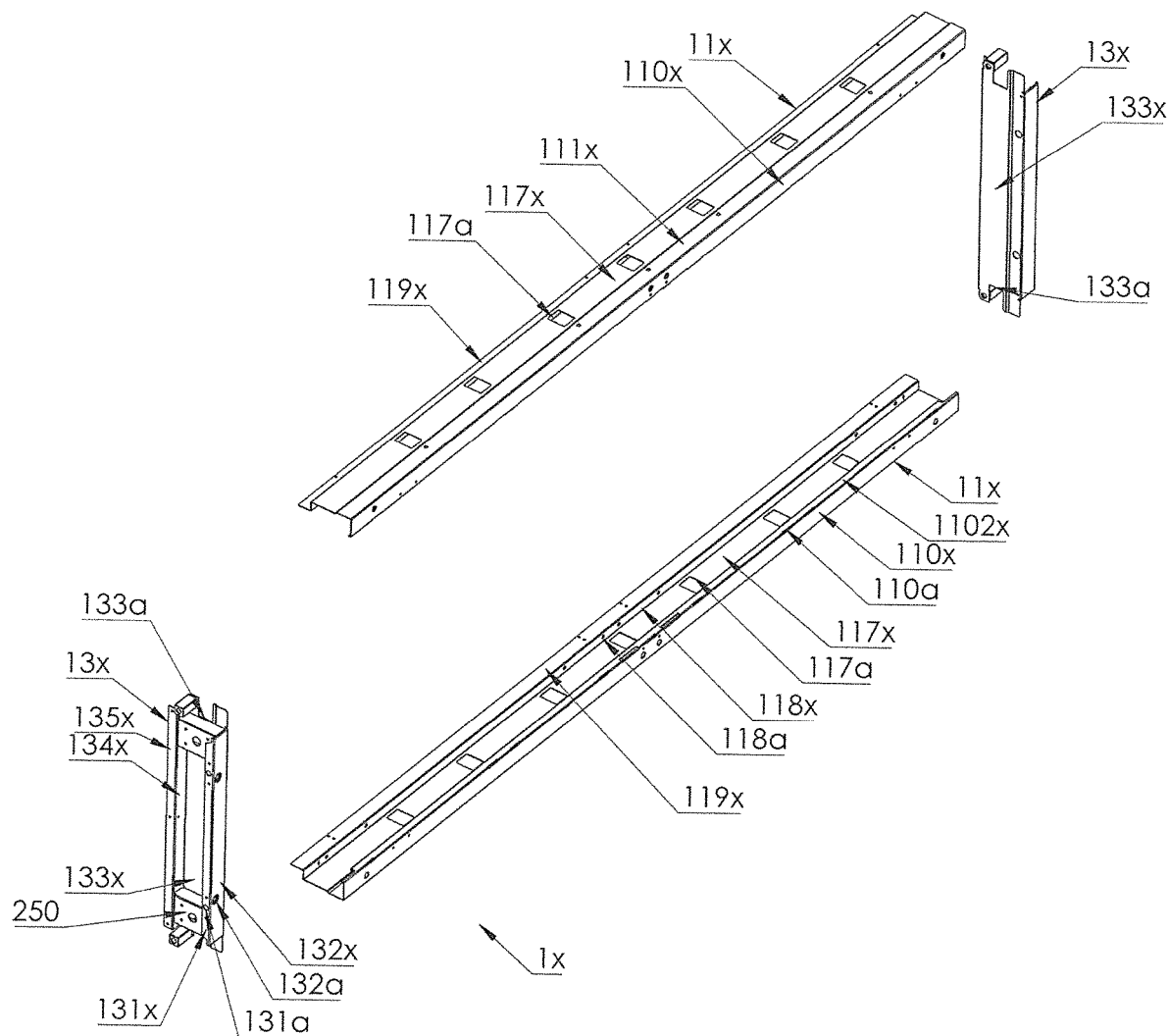
FIG. 30 is an exploded perspective view of the front frame assembly of FIG. 29.

Referring to FIG. 28, the upper and lower side brace members 3x have the same construction, and each has a beam 33x and connecting brackets 32x attached on both ends of the beam 33x. Each beam 33x has a recessed surface 311x with two vertical surfaces 312x and 313x extending by ninety degrees from the opposite edges of the recessed surface 311x. A flange surface 315x then extends outwardly by ninety degrees from the surface 313x, while another surface 334x extends inwardly (i.e., towards the surface 313x) by ninety degrees from the surface 312x. A flange surface 336x then extends from the inner edge of the surface 334x by a ninety degree outward bend (i.e., away from the recessed surface 311x). The flange surface 336x is used for mounting the top cover 7x or the base 8x. The flange surface 336x can overlap and contact with the connecting edges of the top cover 7x or the base 8x, and can therefore effectively block airflow through the sides of the cabinet enclosure.

FIGS. 37-40 illustrate the components in the enclosure of the second embodiment.

Figure 37:
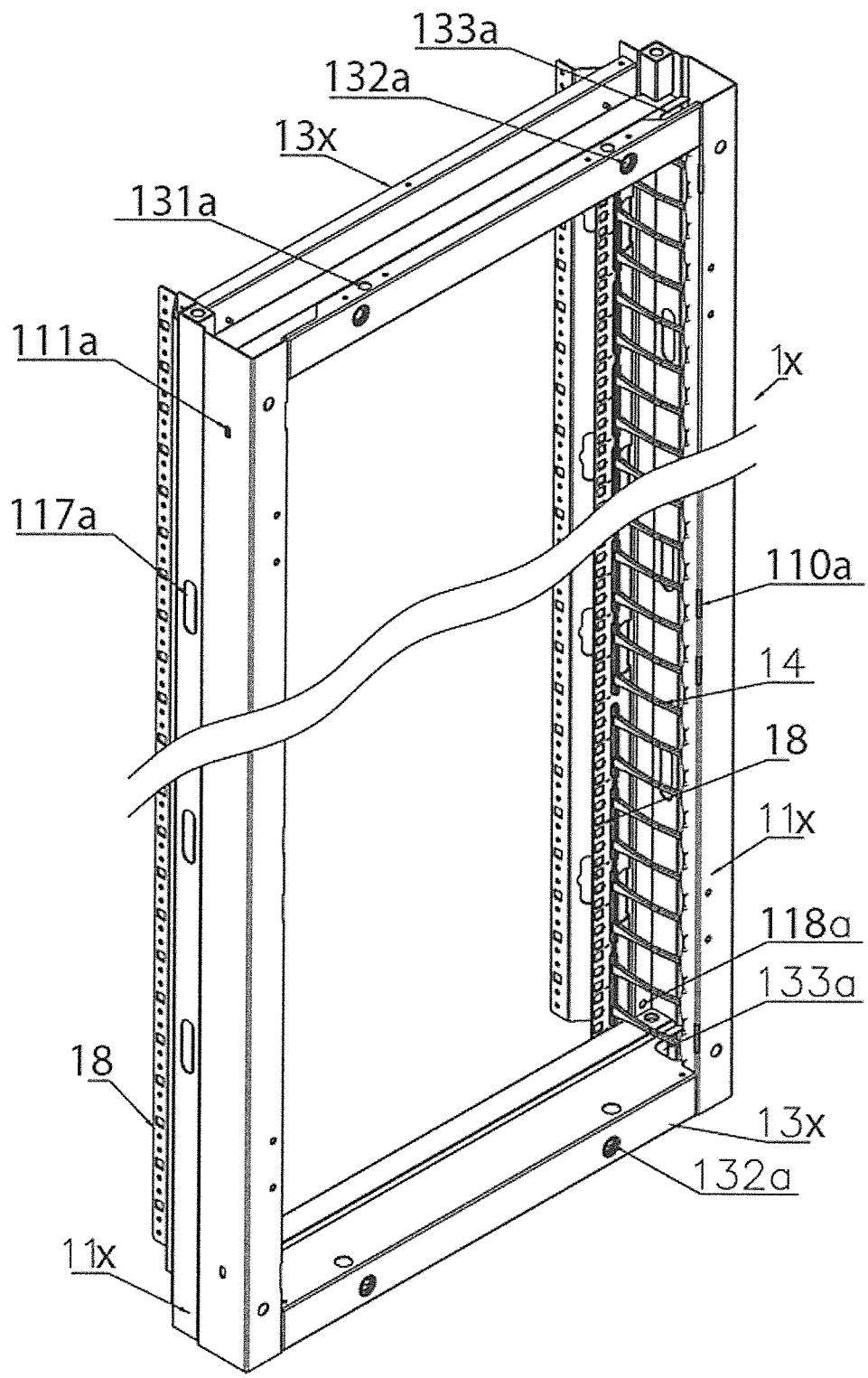
FIG. 37 is a perspective view of the front frame assembly of FIG. 29 assembled with a mounting rail and flexible cable ducts.
Figure 38:
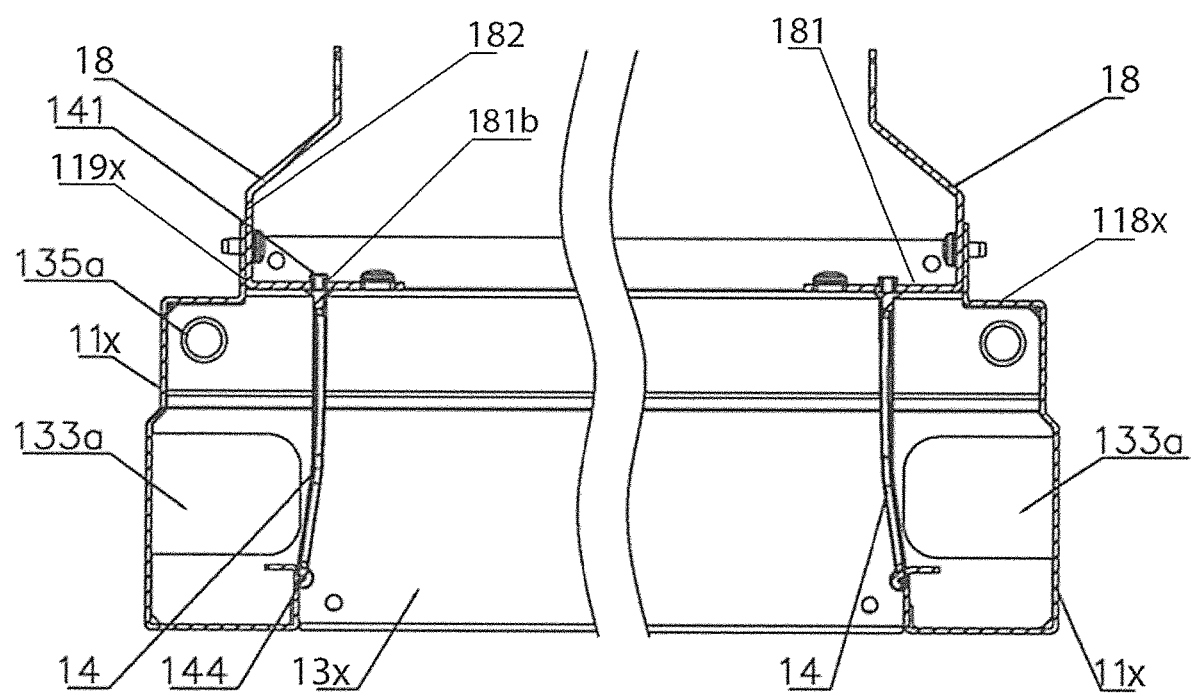
FIG. 38 is a cross-sectional view of FIG. 37.

FIG. 37 shows the front frame assembly 1x assembled with one or more mounting rails 18 and a plurality of modular flexible cable ducts 14. FIG. 38 is a cross-sectional view of FIG. 37 showing the front frame assembly 1x and the closed chambers formed. As best illustrated in FIGS. 38 and 40, the mounting surface 182 of the mounting rail 18 is in direct contact with, and attached to, the surface 119x of the front frame pillar 11x. Each flexible cable duct 14 (see below in connection with FIG. 39) has a hook 141 that is adapted to be secured to a mounting port 181b of the mounting rail 18. The other ellipsoid-shaped end 144 of the flexible cable duct 14 is in close contact with the surface 1102x of the front frame pillar 11x. The front frame pillar 11x, the mounting rail 18 and the flexible cable ducts 14 together define a front frame chamber that provides a cable management function, as well as a ventilation function, by being able to block airflow at those areas of the enclosure without using additional airseal components. The front frame chamber is shown in FIG. 38 as defined by the front frame pillar 11x, the mounting rail 18 and the flexible cable ducts 14, and can effectively block unwanted airflow from the front and side by the surfaces 110x, 111x, 112x and 117x of front frame pillar 11x, and blocks airflow from the back by a surface 181 of the mounting rail 18 and the surface 118x of the front frame pillar 11x. The flexible cable ducts 14 provide a neat cable organization and allow the cables to pass through horizontally from the side to run vertically inside the front frame chamber along the wall of front frame pillar 11x. The entry opening 133a on the surface 133x of the front frame beam 13x allows cables to pass through and enter the front frame chamber from the top or the bottom. Meanwhile, the entry openings 117a on the surface 117x of the front pillar 11x allow cables to pass through from the side to run inside the front frame chamber, as best illustrated in FIGS. 37 and 38.

Figure 39:
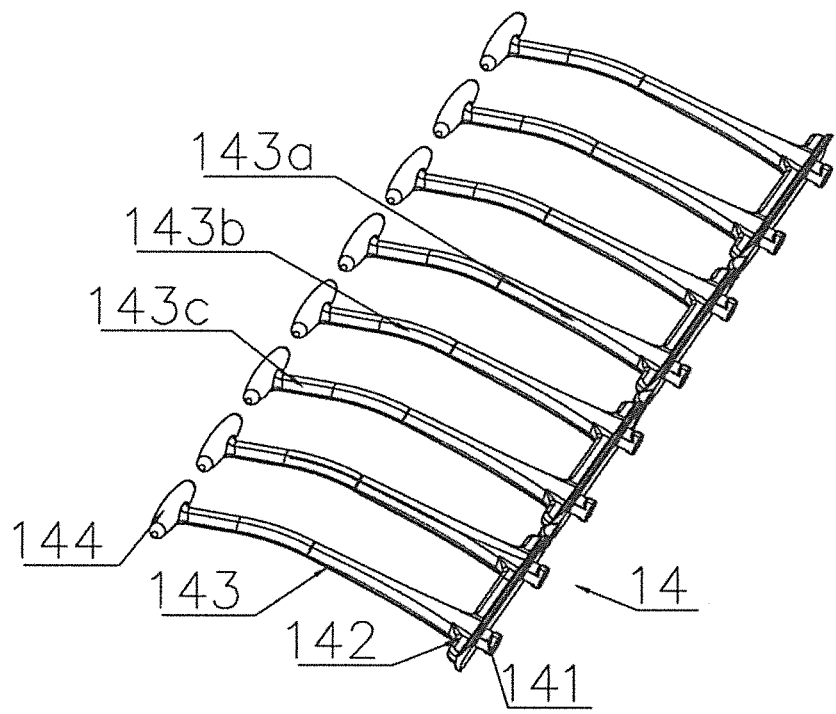
FIG. 39 is a perspective view of the flexible cable duct in FIG. 37.
Figure 40:
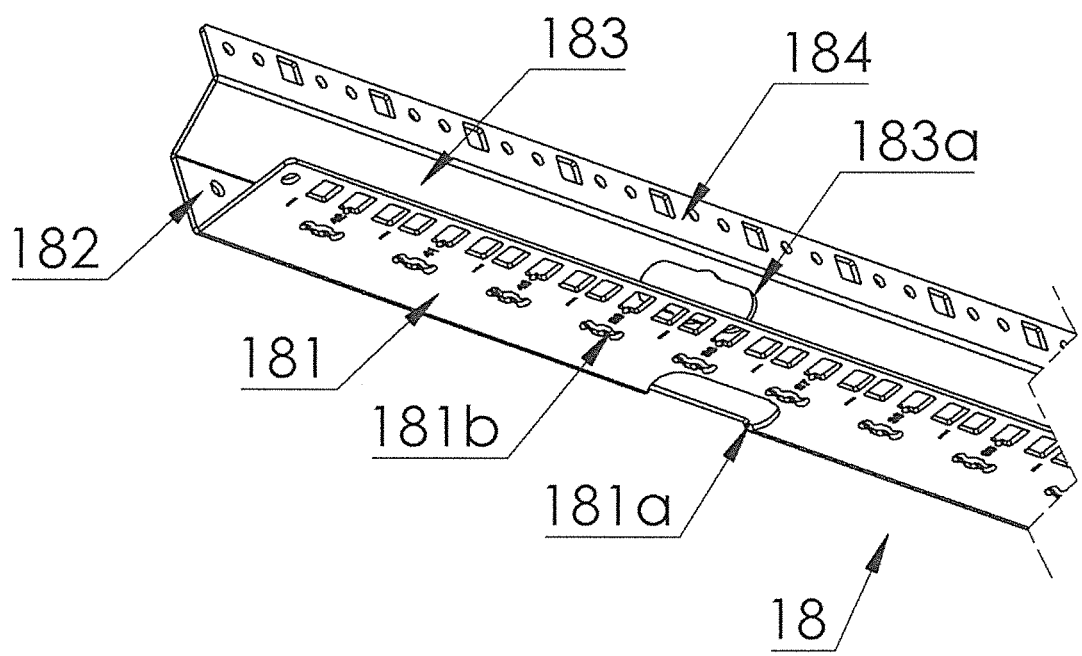
FIG. 40 is a perspective view of the mounting rail of FIG. 37.

FIG. 39 shows the flexible cable duct 14, which has a fishbone shape. The bottom end of the cable duct 14 is provided with a plurality of mounting adapters, such as hooks 141, and each hook 141 is connected to a base 142, and each base 142 is then connected with a curved finger 143. Each finger 143 is generally perpendicular to the base 142, and extends from the end of the base 142 with its width becoming gradually narrower from the base 142 towards the curved middle section 143b. Specifically, each finger 143 has a wider end 143a adjacent the base 142 that extends to a curved middle section 143b, which is slightly curved to extend to an upper section 143c at an angle with respect to the wider end 143a. From the curved middle section 143b to the upper section 143c, the width of the finger 143 remains constant. The end of the upper section 143c is connected to an ellipsoidal-shaped adapter 144 so that the combined finger 143 and adapter 144 forms a T-shape. The mounting hook 141 is adapted to be secured to a mounting port 181*b* of the mounting rail 18.

FIG. 40 shows the mounting rail 18, which has a mounting surface 182, and two side surfaces 181 and 183. The side surface 181 extends generally perpendicular from one edge of the mounting surface 182, and the side surface 183 is bent at an angle (other than ninety degrees) from the opposite edge of the mounting surface 182. A plurality of mounting ports 181*b* and a cable entry port 181*a* are provided on the surface 181, and a cable entry port 183*a* is provided on the surface 183. A flanged surface 184 extends at an angle from the opposite edge of the surface 183. The surfaces 182 and 184 are parallel to each other. The mounting ports 181*b* have a generally oblong shape, being wider in the middle and narrower towards both ends so that each is configured to receive a mounting hook 141 of the flexible cable duct 14. Cable entry ports 181*a* and 183*a* are aligned to allow cable to pass through both surfaces 181 and 183.

Figure 41:
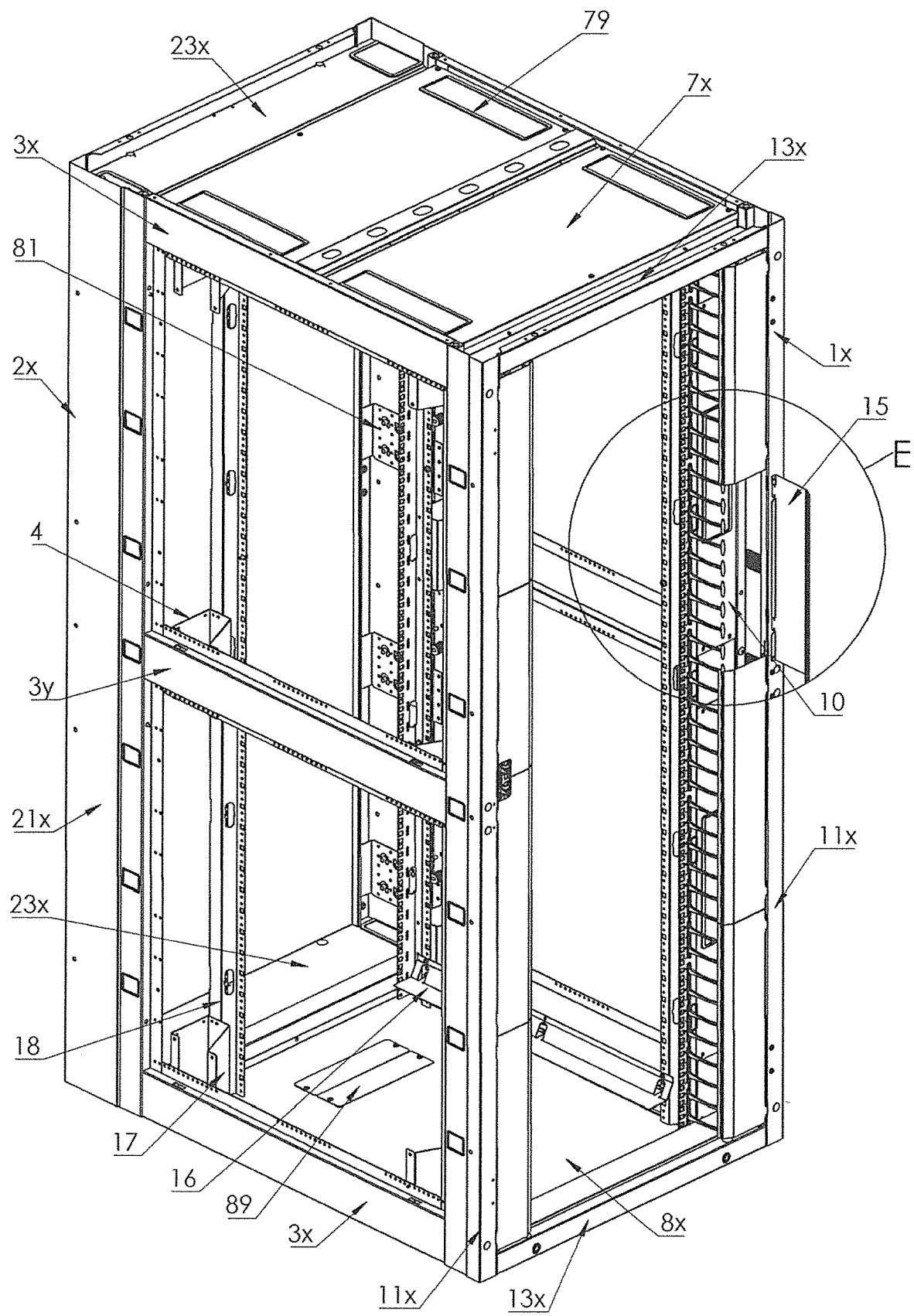
FIG. 41 is a perspective view of the frame structure of the enclosure cabinet according to a third embodiment of the present invention.
Figure 46:
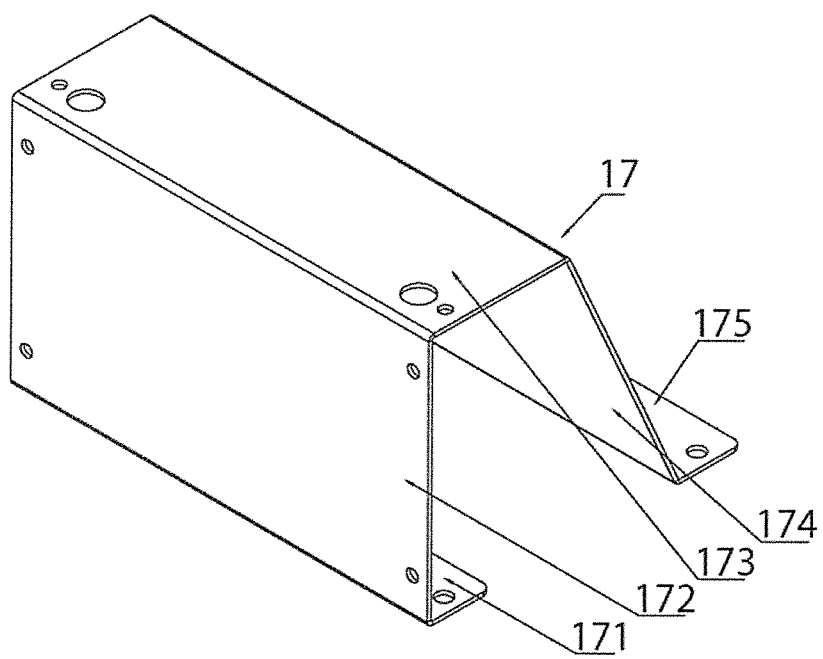
FIG. 46 is a perspective view of an intermediate connecting member.
Figure 47:
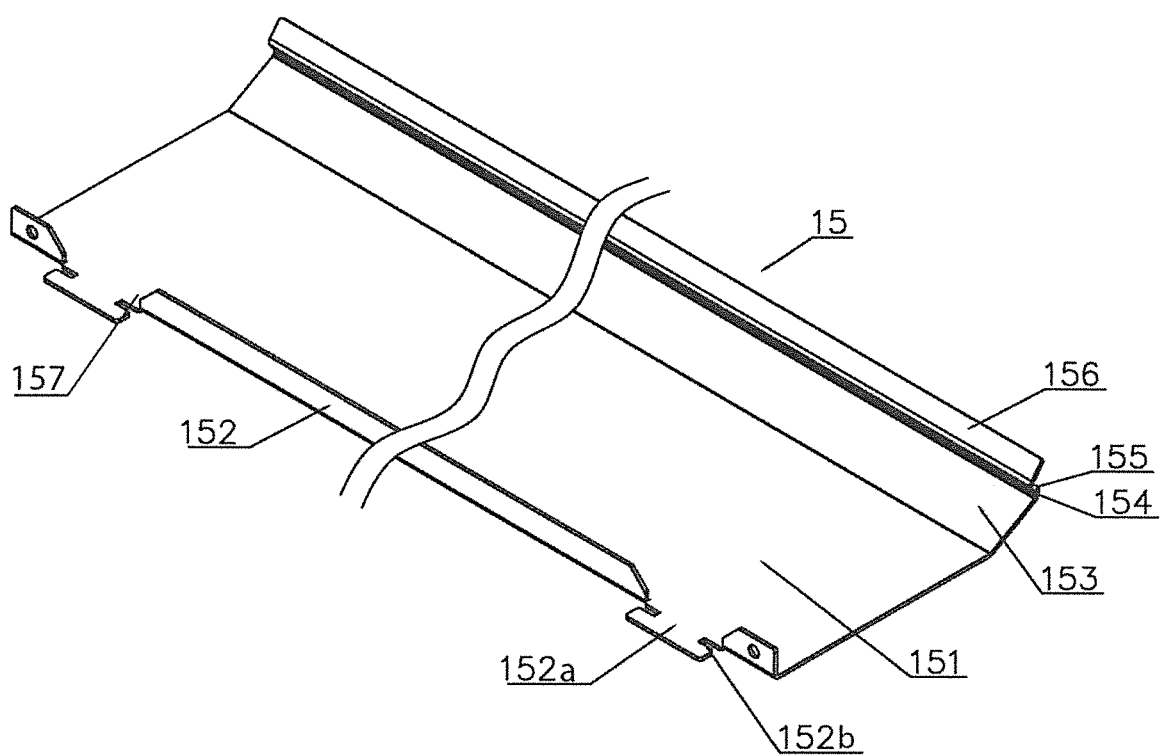
FIG. 47 is a perspective view of the swing cover conduit.

FIG. 41 shows the frame structure of the third embodiment, which includes the front frame assembly 1*x*, the rear frame assembly 2*x*, the middle side brace members 3*y*, the upper and lower side brace members 3*x*, one or more intermediate connecting members 17 (which is shown in FIG. 46), a plurality of mounting rails 18, a support rail 16, the top cover 7*x*, the base 8*x*, one or more modular cover plates 10, and a plurality of modular swing cover conduits 15 (see FIG. 47). FIG. 41 shows multiple modular swing cover conduits 15 installed, but only one is shown to be open, while the others are closed. The addition of the intermediate connecting member 17 provides a wider version of the frame structure which accommodates more cable.

The front frame assembly 1*x* and the rear frame assembly 2*x* form closed chambers that prevent the escape of air from the sides (as described below) of the enclosure. The front frame assembly 1*x* and the rear frame assembly 2*x* also provide cable management, cable entry ports, and PDU mounting ports. The mounting rail 18 can be directly connected to the front frame assembly 1*x* or the rear frame assembly 2*x*, or connected via one or more intermediate connecting members 17. The support rail 16 is mounted on the mounting rail 18 for supporting electronic devices, such as a server.

Figure 42:
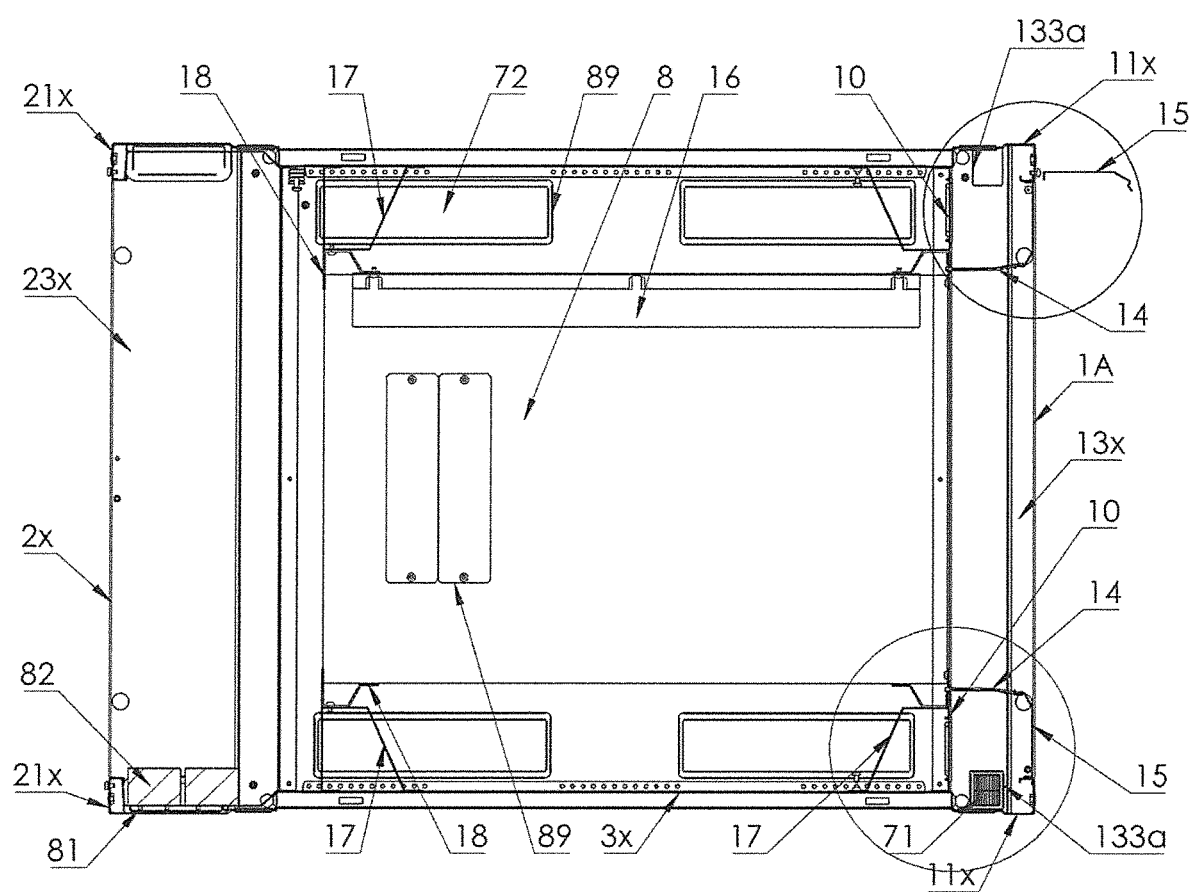
FIG. 42 is a cross-sectional view of FIG. 41.
Figure 43:
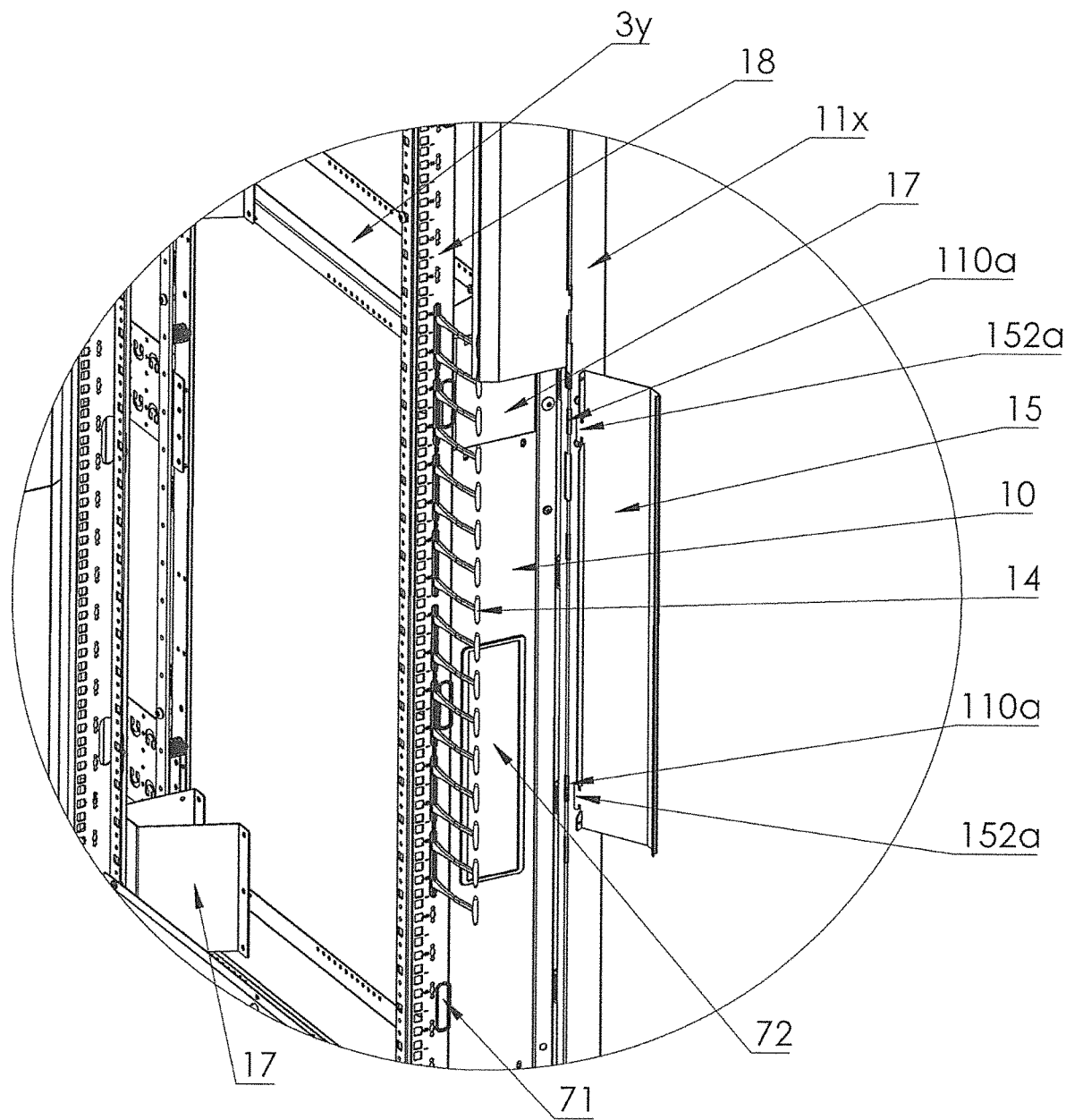
FIG. 43 is an enlarged view of the circled area E in FIG. 41.
Figure 44:
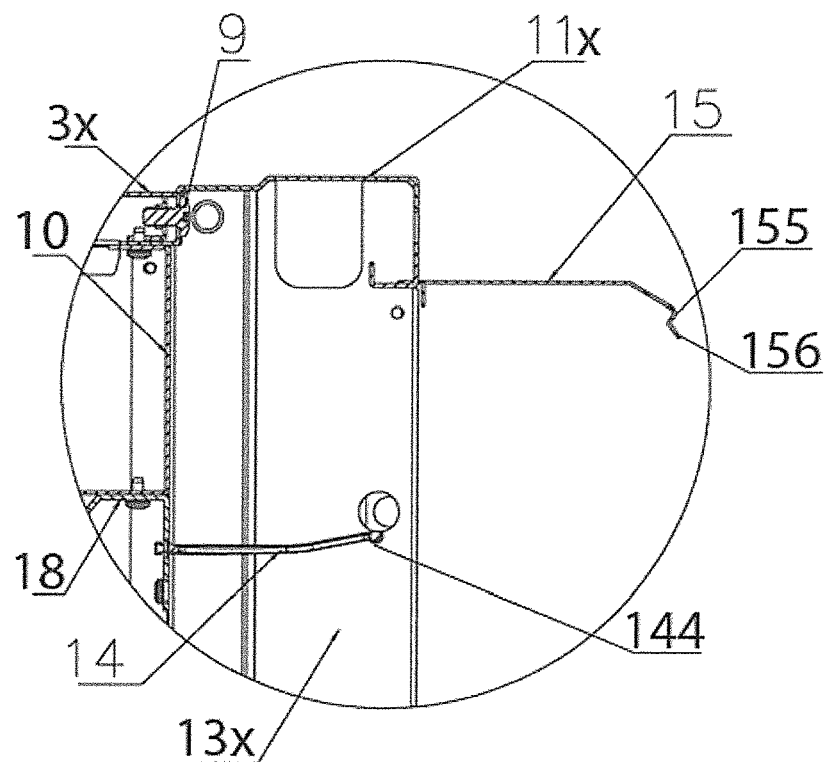
FIGS. 44 and 45 are enlarged cross-sectional views of FIG. 43 showing the operation of the swing cover conduit.
Figure 45:
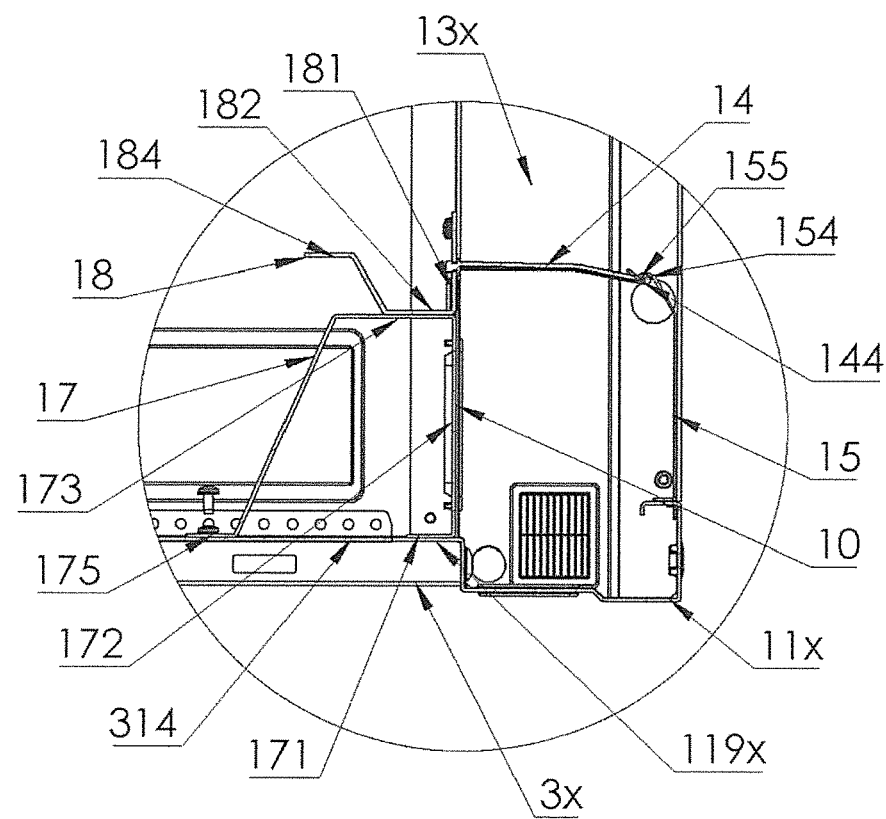

FIG. 42 is a cross-sectional view of the frame structure of the enclosure, and shows the closed chambers formed by the front frame assembly 1*x* and the rear frame assembly 2*x*. FIGS. 43-45 further illustrate the interaction between the front frame assembly 1*x*, its front frame pillar 11*x*, the mounting rail 18, the modular swing cover conduit 15, the flexible cable duct 14, and the modular cover plate 10 in defining the closed chamber.

First, the flexible cable duct 14 is coupled to the mounting rail 18 by connecting the hooks 141 to the mounting ports 181*b* in the mounting rail 18.

Next, the intermediate connecting member 17 is used to connect the mounting rail 18 to the side brace members 3*x*/3*y* and the frame assemblies 1*x* or 2*x*. For example, the intermediate connecting member 17 is mounted on a side brace member 3*x*/3*y*, and the front frame pillar 11*x*. Referring to FIG. 46, the intermediate connecting member 17 is bent from a plate material, and is provided with a first surface 171, and is bent 90 degrees inwardly along one side of the first surface 171 to form a (second) mounting surface 172; the second surface 172 is further bent 90 degrees inwardly to form a (third) mounting surface 173. A fourth angled surface 174 extends inwardly at an angle, and is bent outwardly at an angle to form a fifth surface 175. The first surface 171 and the fifth surface 175 may be on the same plane. Referring to FIGS. 42, 43 and 45, the mounting surface 173 of the intermediate connecting member 17 is connected to the mounting rail 18 via its mounting surface 182. The fifth surface 175 is connected to a side brace member 3*x*/3*y*, and the first surface 171 is connected to either the front frame assembly 1*x* or the rear frame assembly 2*x*. In addition, the modular cover plate 10 is connected to the intermediate connecting member 17 via the second mounting surface 172.

Referring to FIG. 47, the swing cover conduit 15 is bent from a plate and is provided with a cover front surface 151. One edge of the front surface 151 is bent ninety degrees inwardly to form a cover reinforcing surface 152, and the other edge of the front surface 151 is bent inwardly at an angle to form an inclined support surface 153, and then further bent to form a rounded catch surface 154 which is a rounded corner from the edge of the inclined support surface 153. From the rounded catch surface 154, the plate is then bent inwardly to form a snap surface 155, and then bent outwardly at an angle to form an angled cover surface 156. The cover reinforcing surface 152 is provided with a notch 157, with a fastening surface 152*a* extending in the same plane from the front surface 151 through the notch 157. The fastening surface 152*a* is provided with a snap groove 152*b*, and the snap groove 152*b* and the snap opening 110*a* of the front pillar 11*x* can form a rotational connection, as best illustrated in FIG. 43.

As a result, the swing cover conduit 15 can be pivoted about the snap grove 152*b* and snap opening 110*a* to have the snap surface 155 and the angled cover surface 156 snap-fitted to the adapter 144 of the flexible cable duct 14, as best illustrated in FIG. 44-45. The adapter 144 is fitted inside the rounded catch surface 154. This construction provides a neat cable organization space, as well as forming a closed chamber where: (i) the swing cover conduit 15 prevents air from escaping from the front of the enclosure, (ii) the modular cover plate 10 blocks air flow from the rear of the enclosure, and (iii) the side walls of the front pillar 11*x* prevent air from escaping from the side, as best illustrated in FIGS. 44-45. The modular swing cover conduit 15 provides easy access from the front of the enclosure to the space within the enclosure. The flexible cable duct 14 provides a neat and tidy cable organization, and allows cables to pass through horizontally from the side to run vertically inside the chamber along the wall of front frame pillar 11*x*, as illustrated in greater detail below in connection with FIGS. 62-64.

Figure 48:
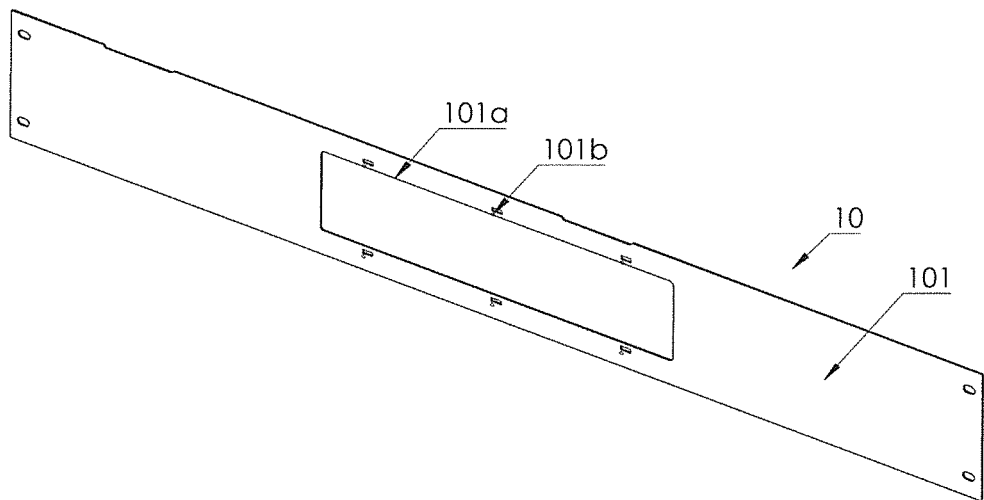
FIG. 48 is a perspective view of a modular cover plate.
Figure 49:
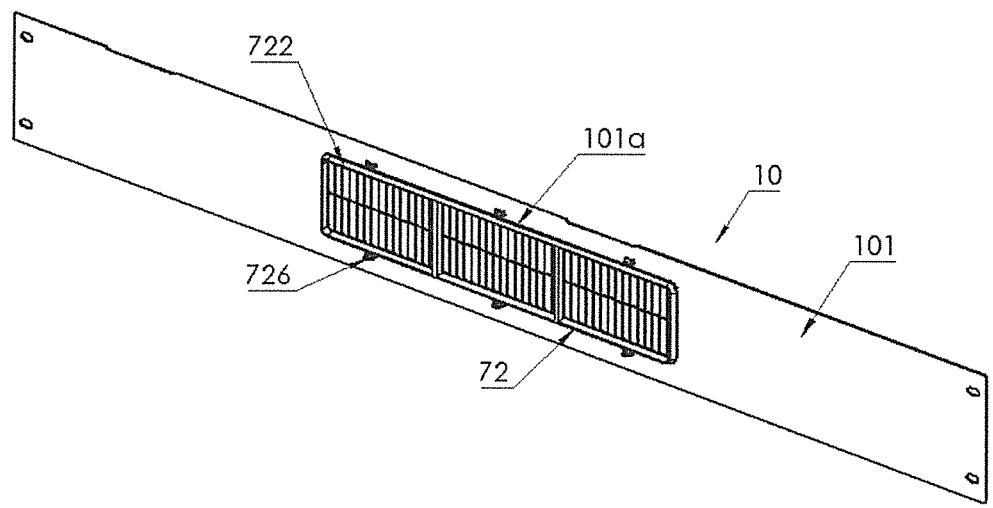
FIG. 49 is a perspective view of the modular cover plate of FIG. 48 with a cable entry grommet installed thereon.

Referring now to FIGS. 48 and 49, the modular cover plate 10 is assembled with a cable entry grommet 72. The mounting surface 101 of the modular cover plate 10 is provided with larger rectangular or oblong entry openings 101*a* and a plurality of smaller mounting holes 101*b* along its perimeter. Cable entry grommet 72 can be installed on the oblong entry opening 101*a* of the cover plate by inserting tabs 726 into mounting holes 101*b*.

Figure 50:
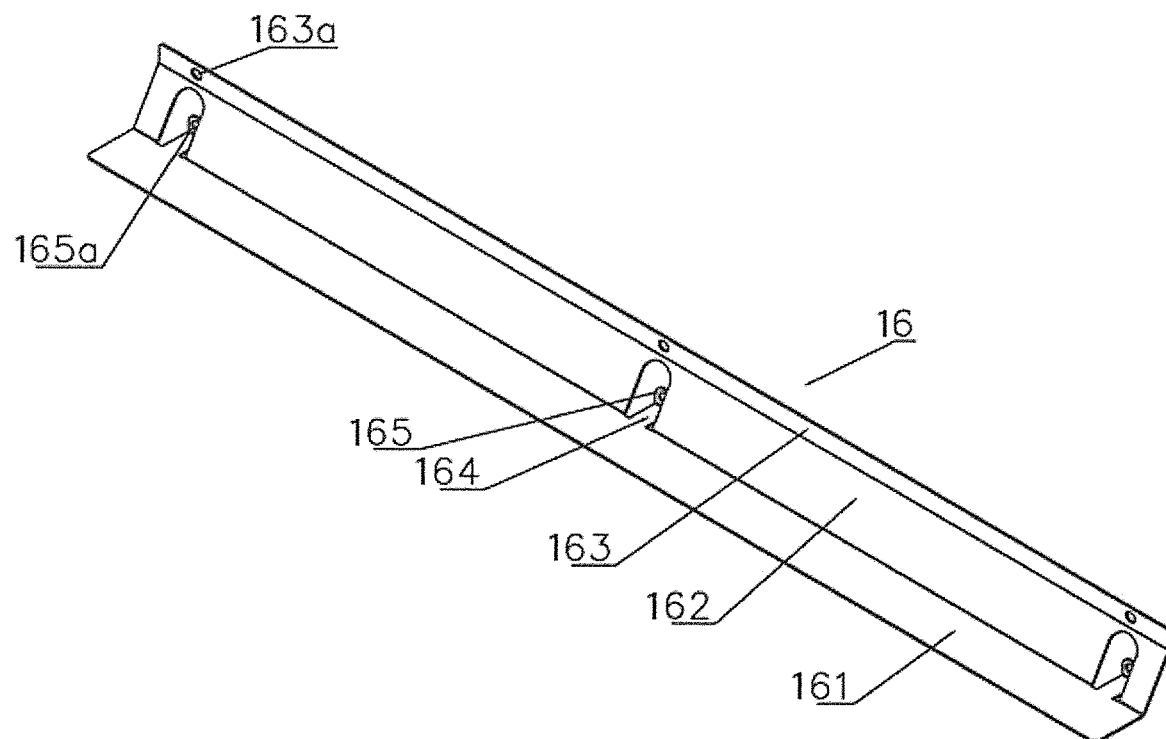
FIGS. 50 and 51 are different perspective views of a support rail.
Figure 51:
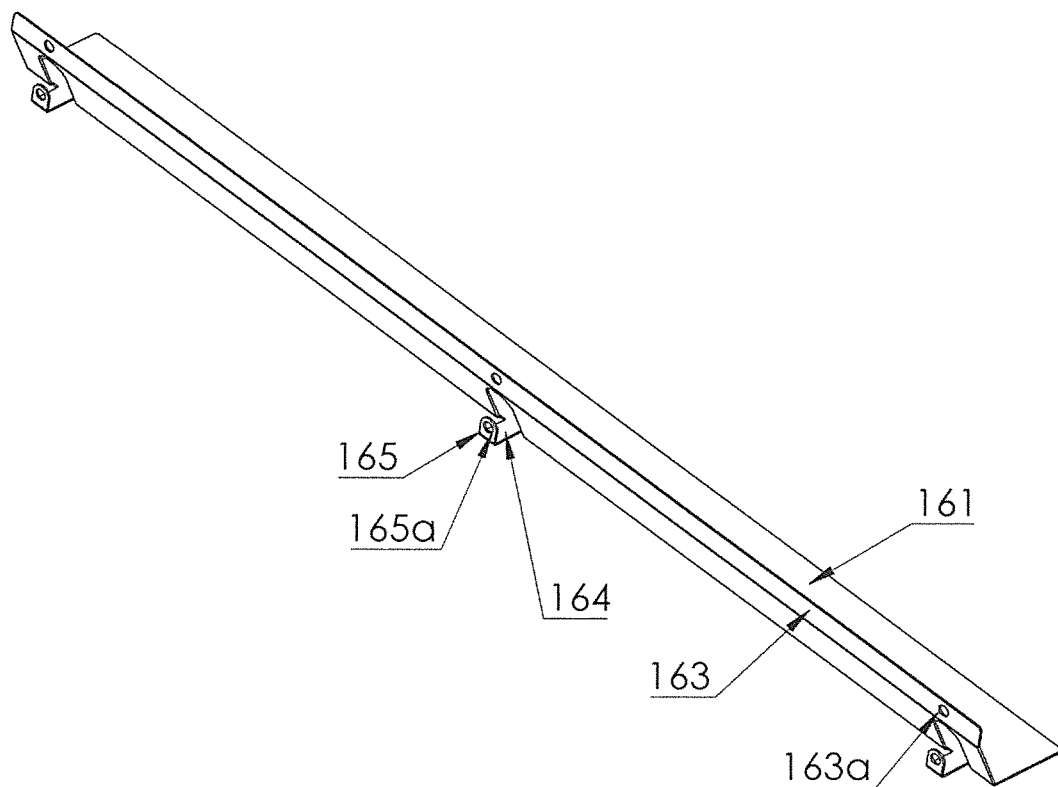

Referring to FIGS. 50 and 51, the support rail 16 can be L-shaped, and this configuration offers increased strength and stiffness with higher loading capacity without increasing the material thickness or changing product dimensions. The support rail 16 can be bent and stamped from a plate material, and is provided with a device placement surface 161. The device placement surface 161 is bent inwardly at an angle to form an angled transition surface 162, and then bent inwardly at an angle and to form a mounting surface 163 that is perpendicular to the device placement surface 161. The device placement surface 161 is provided with an extension part 164, with the extension part 164 further bent ninety degrees inwardly to form a rear support surface 165 that is aligned on the same plane as the mounting surface 163. The support rail 16 greatly increases the maximum possible loading force that is applied by any electronic device (e.g., a server) on the device placement surface 161. The support rail 16 is secured to the mounting surface 184 of the mounting rails 18 via mounting holes 163a and 165a that are provided on the mounting surface 163 and rear support surface 165, respectively.

Figure 52:
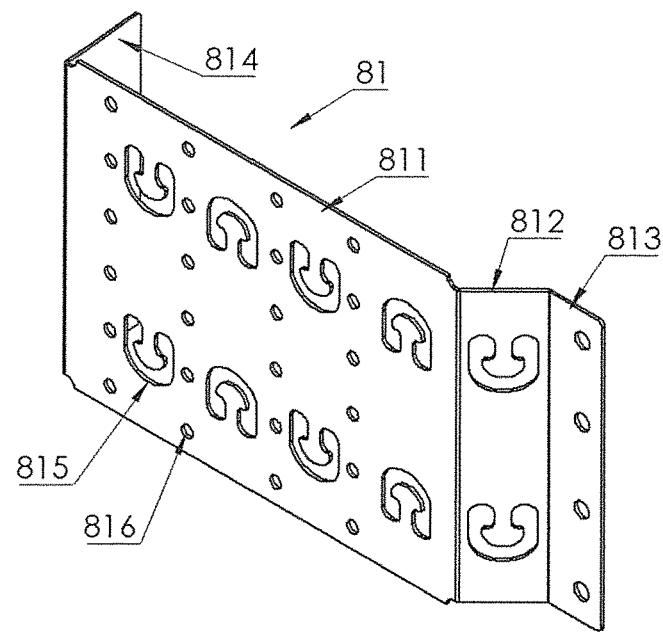
FIG. 52 is a perspective view of a device management apparatus.

FIG. 52 shows a device management apparatus 81. The device management apparatus 81 can be bent and sampled from a plate material, and is provided with a device mounting surface 811. One edge of the device mounting surface 811 is bent inwardly at an angle to form another mounting surface 812, and then bent outwardly at an angle to form yet another mounting surface 813. The other edge of the device mounting surface 811 is bent inwardly at an angle to form another mounting surface 814. The mounting surfaces 812 and 814 are angled at an obtuse angle with respect to the device mounting surface 811. Both the mounting surfaces 811 and 812 are provided with a plurality of cable tie ports 815 and device mounting ports 816. The cable tie ports 815 are generally U-shaped with a slender middle portion and larger rounded ends. The cable tie ports 815 are generally round holes and can be used for cable management and installation. The plurality of device mounting ports 816 can be used for mounting PDU (power distribution unit) or other devices.

Figure 53:
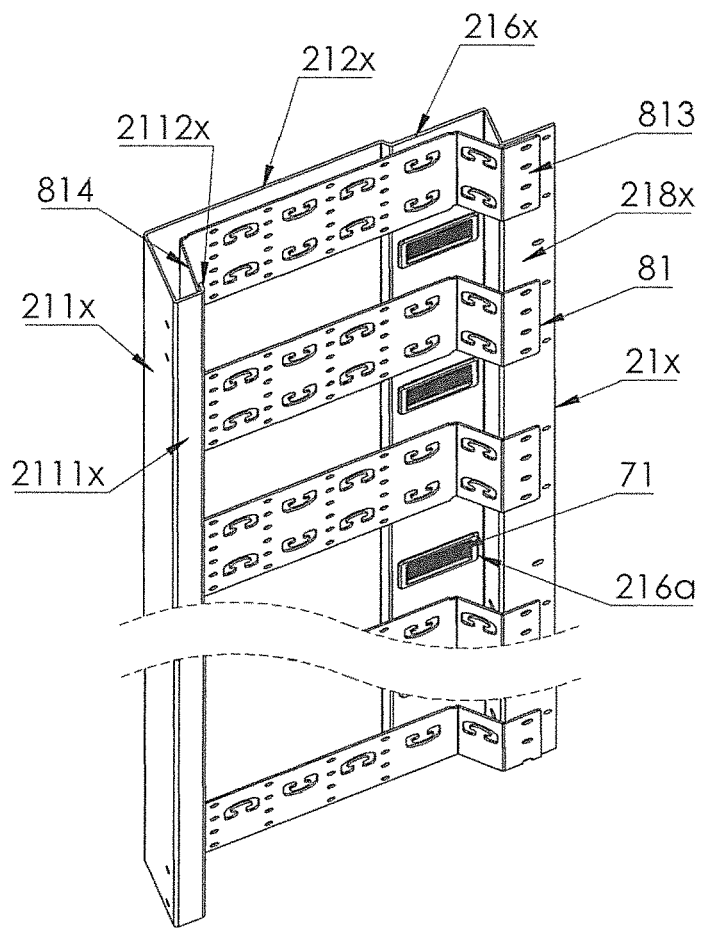
FIG. 53 illustrates how the device management apparatus is connected to the rear frame assembly.

FIG. 53 shows the integration of the device management apparatus 81 on the rear frame pillar 21x, where the mounting surface 813 of the device management apparatus 81 is connected to the mounting surface 218x of the rear frame pillar 21x. The mounting surface 814 is in contact with and, and is connected to, the lip 2112x of the rear frame pillar 21x. Gaps or spaces are provided between the mounting surfaces 811, 812 of the device management apparatus 81 and the surfaces 212x and 216x of the rear frame pillar 21x. These gaps and spaces can be used for accommodating cables to provide additional cable management or installation functions.

Figure 64:
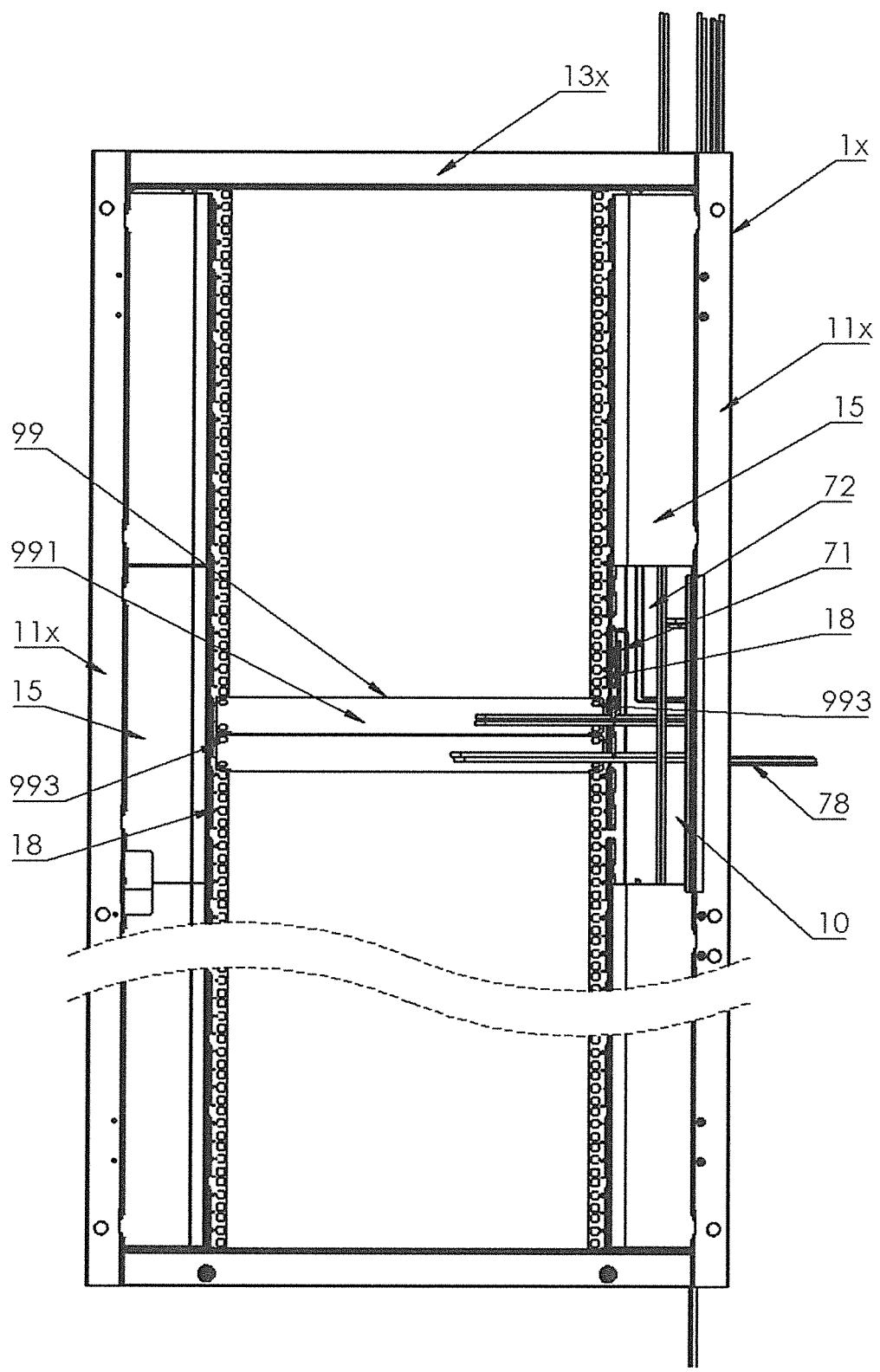
FIG. 64 is a front view of the frame structure of FIG. 62.

In FIGS. 42 and 64, PDU devices 82 are shown to be mounted on the device management apparatus 81 on the rear pillar 21x.

Cable Management

Figure 33:
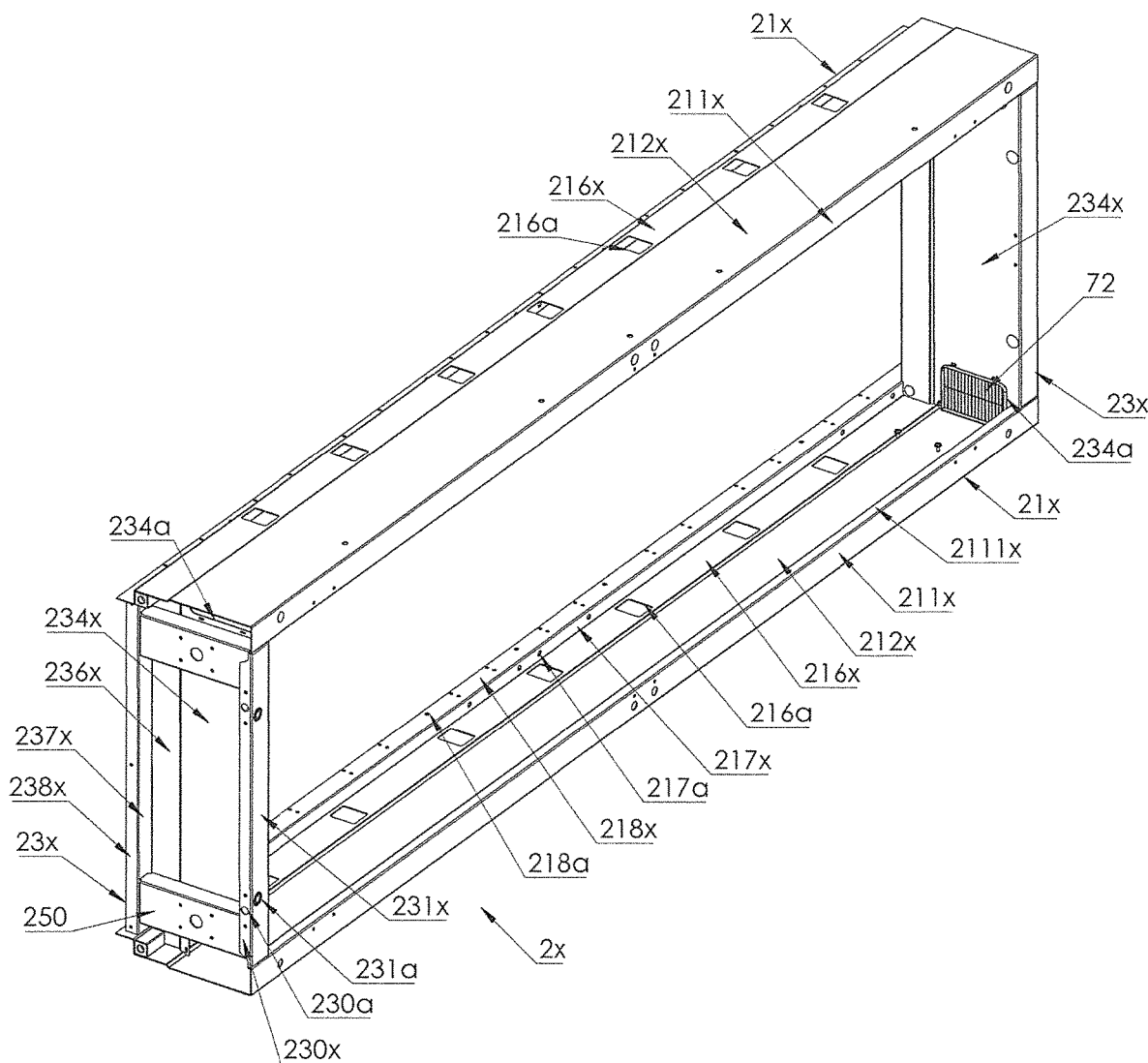
FIG. 33 is a perspective view of the rear frame assembly of the frame structure of FIG. 26.
Figure 34:
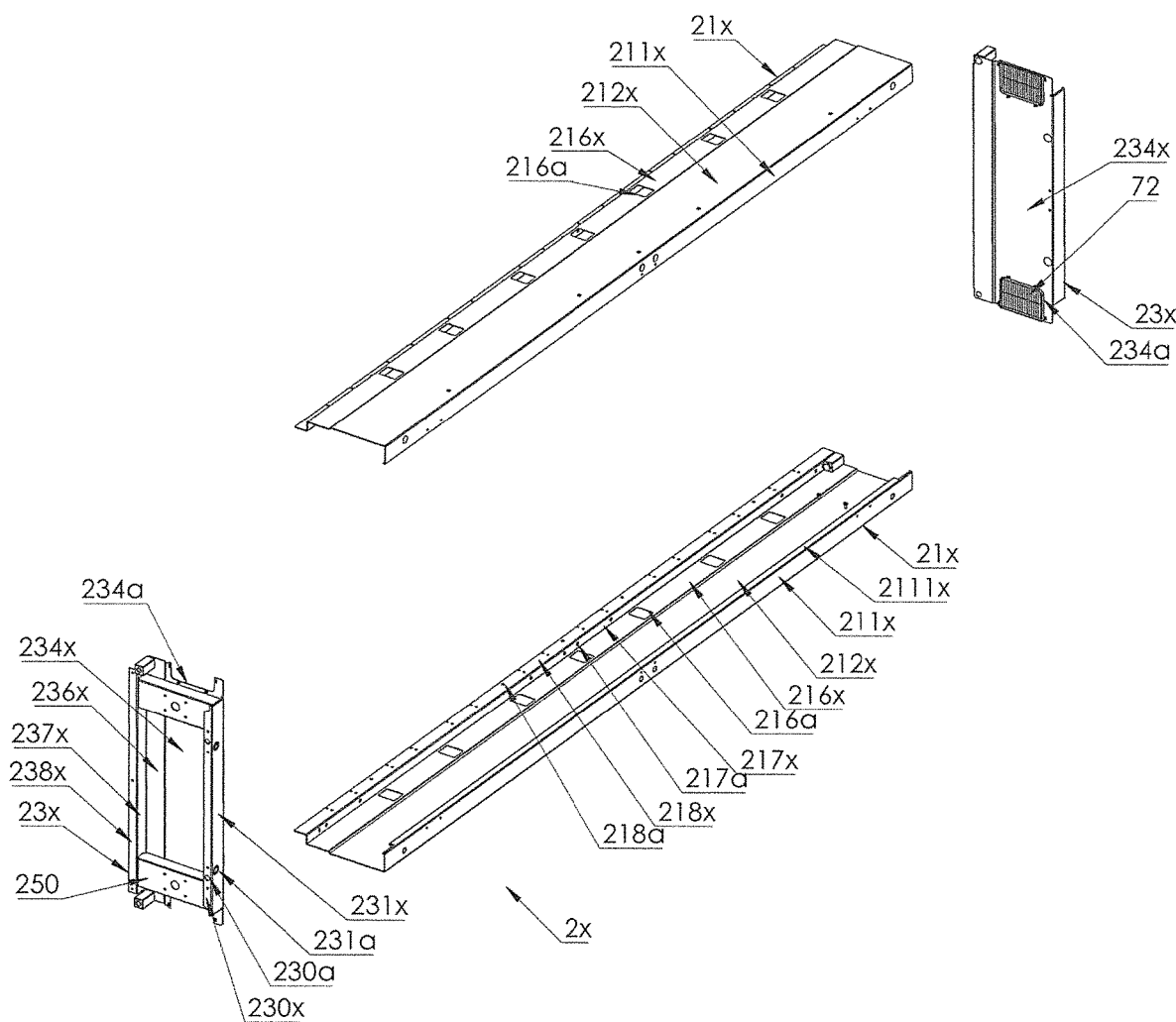
FIG. 34 is an exploded perspective view of the rear frame assembly of FIG. 33.

The present invention provides a cable management system where cables can be run or routed through the front frame pillars 11x, the front frame beams 13x, the mounting rails 18, the rear frame pillars 21x and the rear frame beams 23x. Openings are provided in these pillars, beams and mounting rails 18 to allow cable to enter and exit. Specifically, referring to FIG. 29, the front frame assembly 1x is provided with entry openings 117a on the front frame pillar 11x, and cable entry openings 133a on the front frame beam 13x. Referring to FIG. 40, the mounting rail 18 is provided with entry openings 181a and 183a. Referring to FIG. 33, the rear frame assembly 2x is provided with entry openings 216a on the rear frame pillar 21x and cable entry openings 234a on the rear frame beam 23x.

The present invention also provides cable entry grommets 71 and 72 that function to provide proper ventilation or air flow management for the interior of the enclosure or cabinet.

Figure 54:
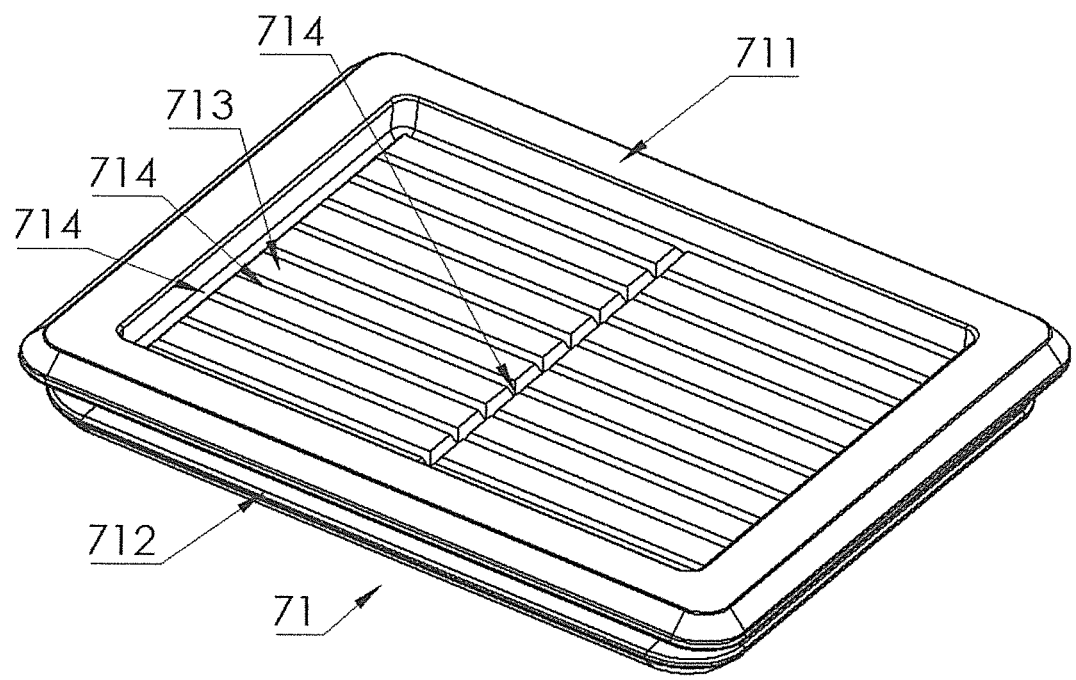
FIG. 54 is a perspective view of a cable entry grommet.
Figure 55:
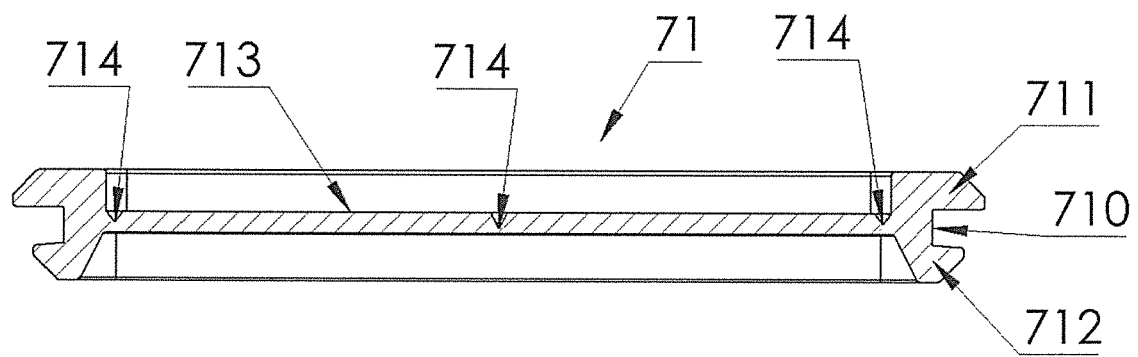
FIG. 55 is a cross-sectional view of the grommet of FIG. 54.

For example, FIGS. 54-55 show an airseal cable entry grommet 71. The airseal cable entry grommet 71 can be made into different shapes and sizes to match various entry openings or ports. The airseal cable entry grommet 71 can be made from elastomeric plastic material, and is provided with a first flange 711, a second flange 712 and a groove 710 between these two flanges 711, 712 along the perimeter of the grommet 71. Flanges 711, 712 and groove 710 provide fixation and sealing of the grommet 71 to the corresponding cable entry opening. The perimeter of the flanges 711 and 712 define a central area that is provided with an array of strips 713. Notches 714 are provided in the strips 713 to thin the thickness of the strips 713, so that each strip 713 or combination of strips 713 can be easily broken at the notches 714 and removed from the surrounding structure, thereby providing space for cable to pass through, while allowing the remaining structure of the grommet 71 to effectively block unwanted air flow in the central area.

Figure 56:
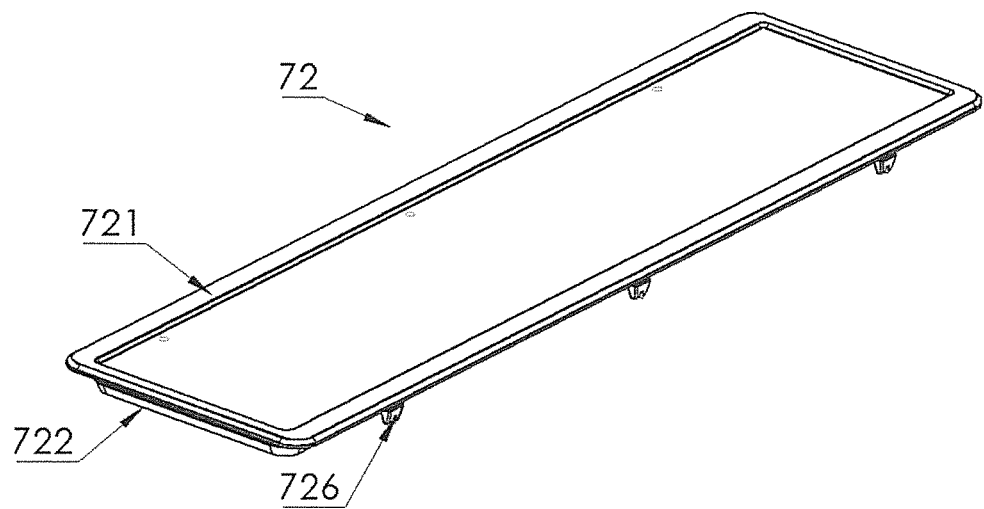
FIG. 56 is a perspective view of another cable entry grommet.
Figure 57:
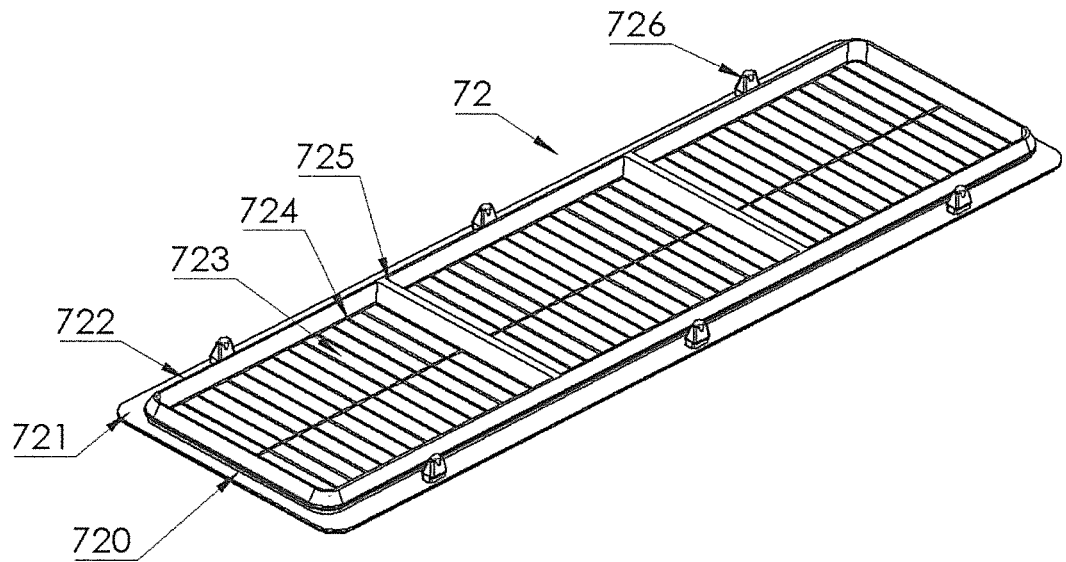
FIG. 57 is another perspective view of the grommet of FIG. 56.

FIGS. 56-57 show another embodiment of a cable entry grommet 72, which is provided with a top flange 721, a bottom flange 722 and a groove 720 between these two flanges 721, 722. A plurality of protruding tabs 726 are provided in spaced-apart manner along the bottom flange 722. The cable entry grommet 72 has a central area that is provided with arrays of strips 723 having notches 724 that are similar to the notches 714. As illustrated in FIGS. 48-49, the cable entry grommet 72 can be installed in the opening 101a of the cover plate 10 by snugly fitting the tabs 726 into the mounting holes 101b while having the flanges 721 and 722 surround the entry opening 101a.

Figure 58:
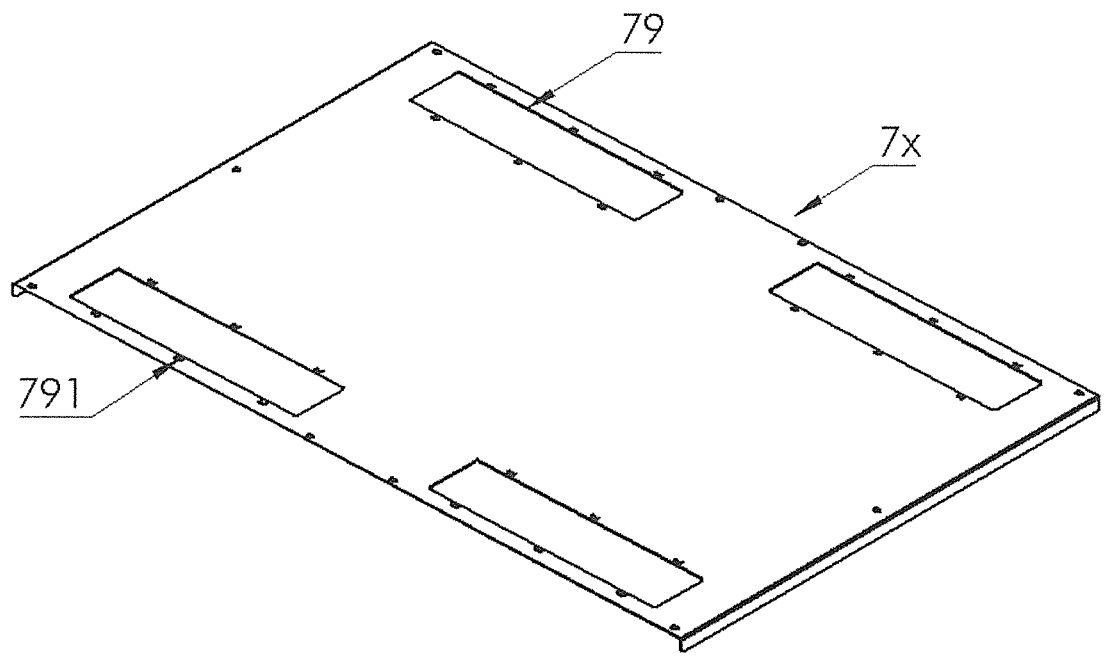
FIG. 58 is a perspective view of the top cover.
Figure 59:
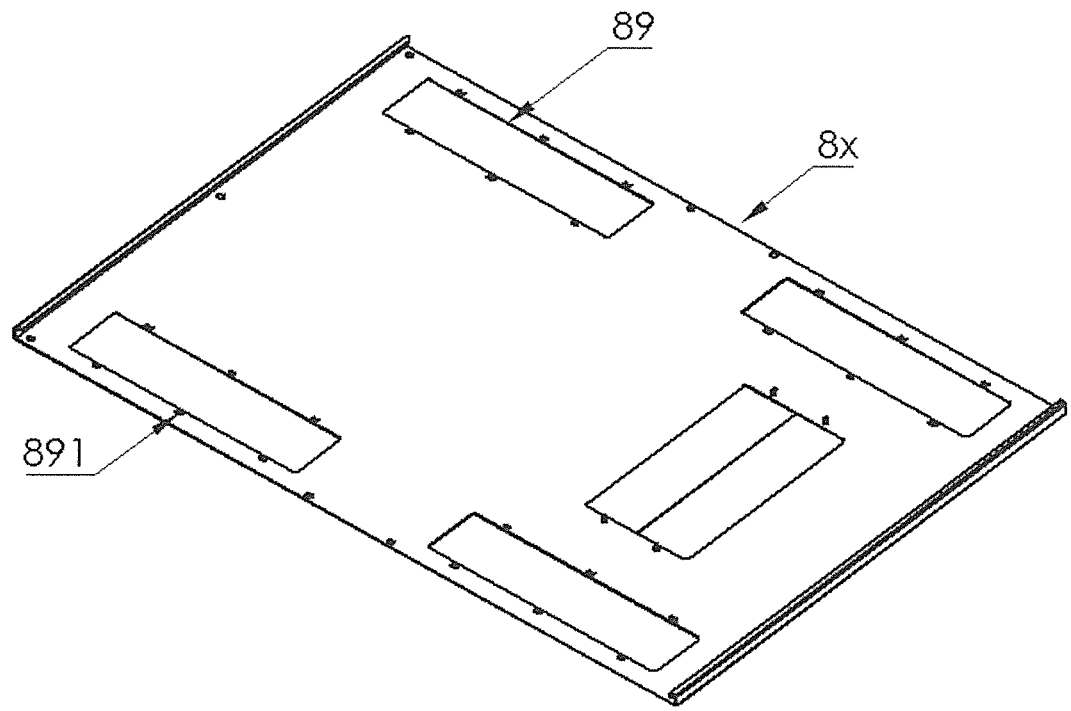
FIG. 59 is a perspective view of the base.

Referring to FIGS. 58-59, the top cover 7x is provided with top entry openings 79 and the bottom plate 8x is provided with bottom entry openings 89. Each entry opening 79 and 89 consists of a large rectangular or oblong opening, and a plurality of smaller snap openings 791 and 891, respectively, on both sides, similar to that shown in FIG. 48. The cable entry grommet 72 can be installed on the top entry openings 79 of the top cover 7x and bottom entry openings 89 of the bottom cover 8x by snugly fitting the tabs 726 into a plurality of the snap openings.

Figure 60:
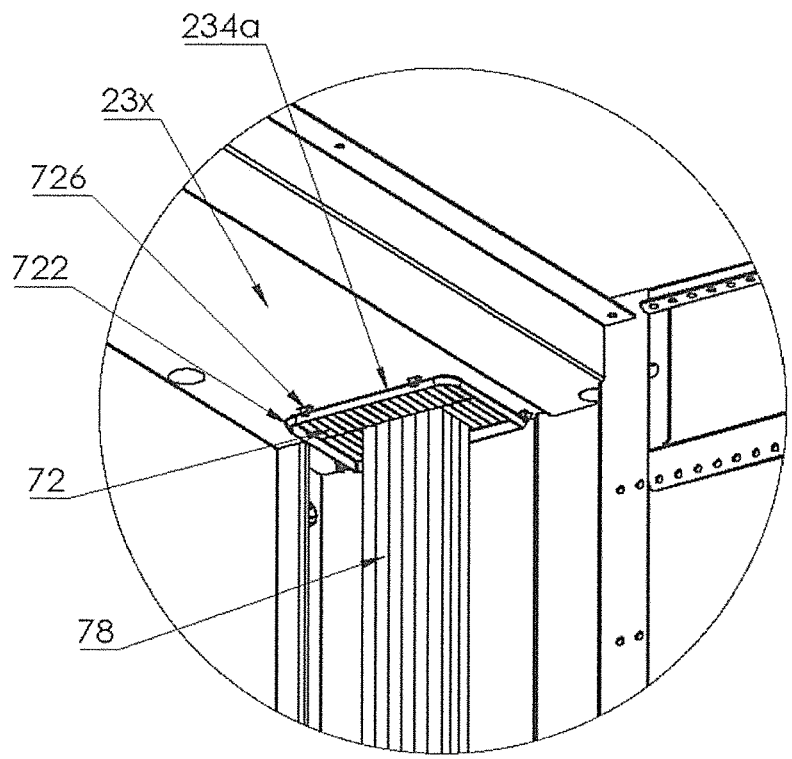
FIG. 60 is an enlarged perspective view showing how one or more cable entry grommets can be provided in a cable entry opening of the frame beam.
Figure 61:
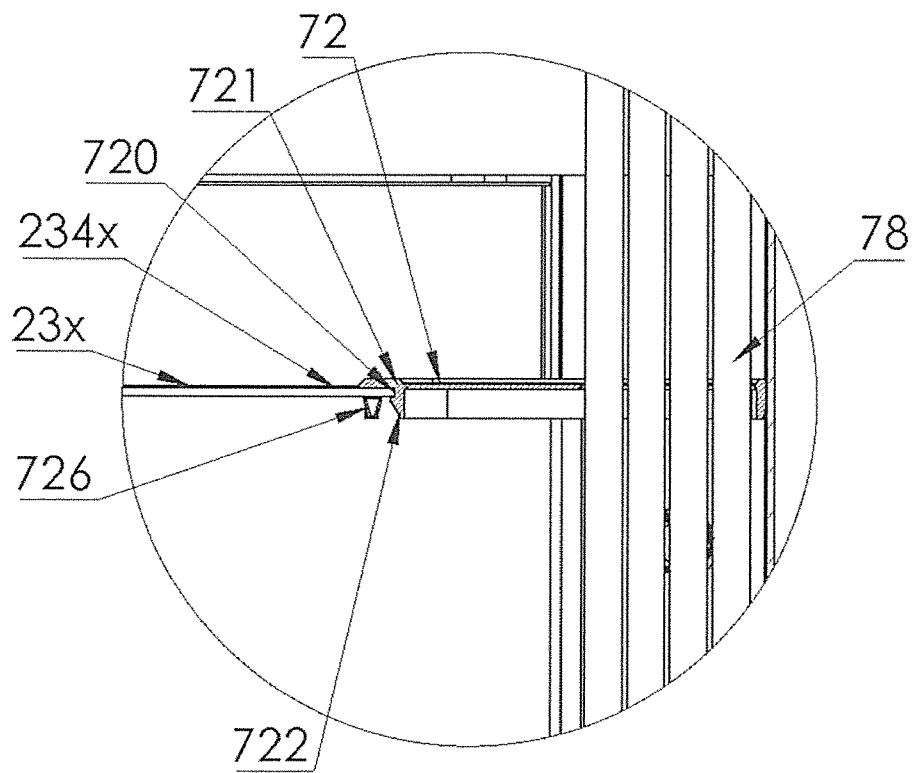
FIG. 61 is a cross-sectional view of FIG. 60.

FIGS. 60-61 illustrate how these cable entry grommets 71 and 72 facilitate proper ventilation or air flow management. For example, one or more cable entry grommets 72 can be provided in the cable entry openings 234a of the frame beam 23x. The cable entry openings 234a allow for installation of the cable entry grommet 72 on the frame beam 23x. The flanges 721, 722 and groove 720 facilitate snap-fit and sealing of the cable entry grommet 72 to the cable entry opening 234a on the surface 234x of the frame beam 23x, as best illustrated in FIG. 61. Meanwhile, any combination of strips 723 can be easily separated and removed from the surrounding structure, thereby allowing groups of cable 78 to pass through while the remaining structure of the grommet 72 can still effectively block air flow and improve thermal management in the area. Cable entry grommets 71 and 72 can be provided at any of the other entry openings 117a, 133a, 216a, 181a and 183a to provide similar ventilation.

Figure 62:
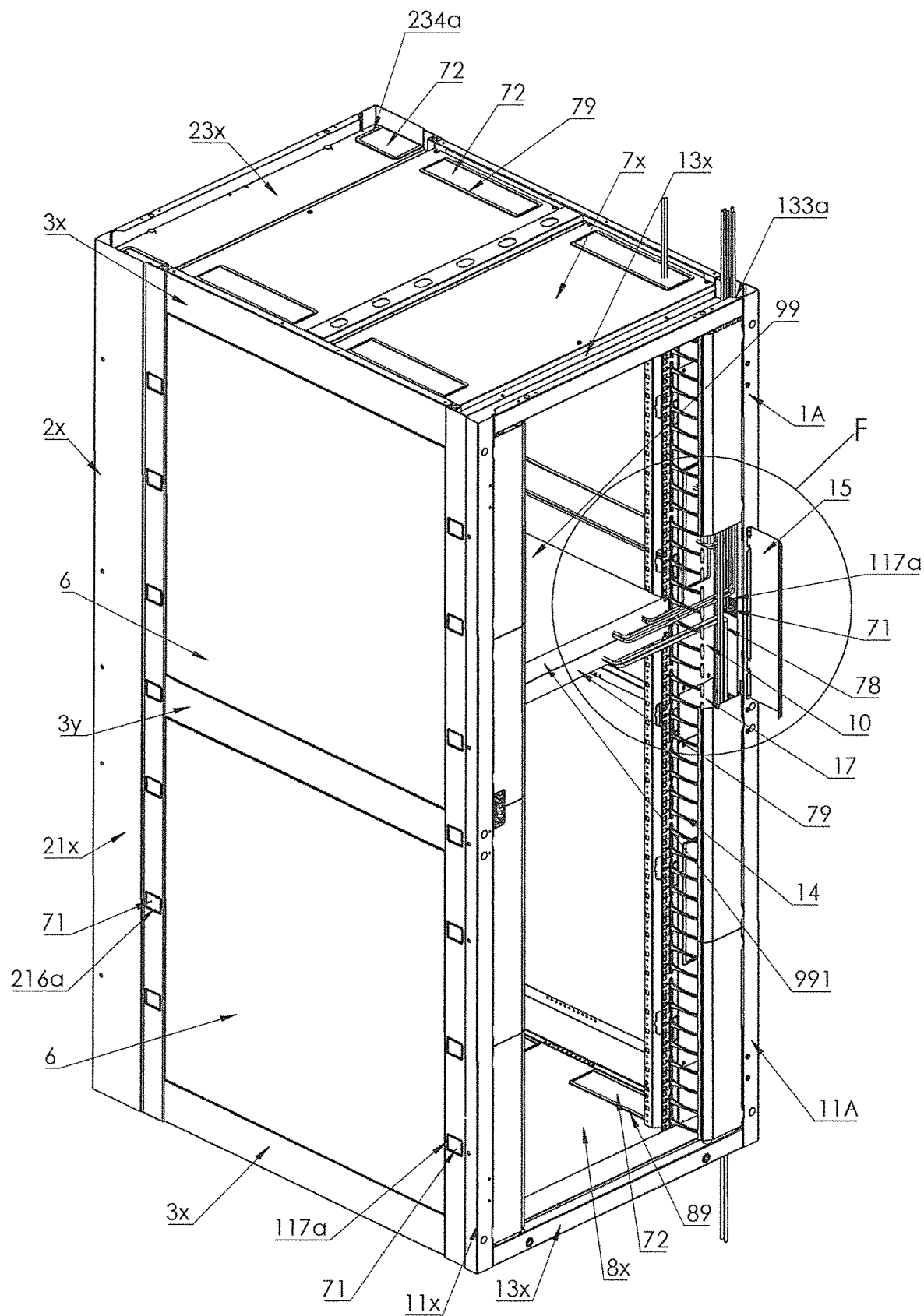
FIG. 62 is a perspective view of the frame structure of FIG. 41 showing the cable being installed therein.
Figure 63:
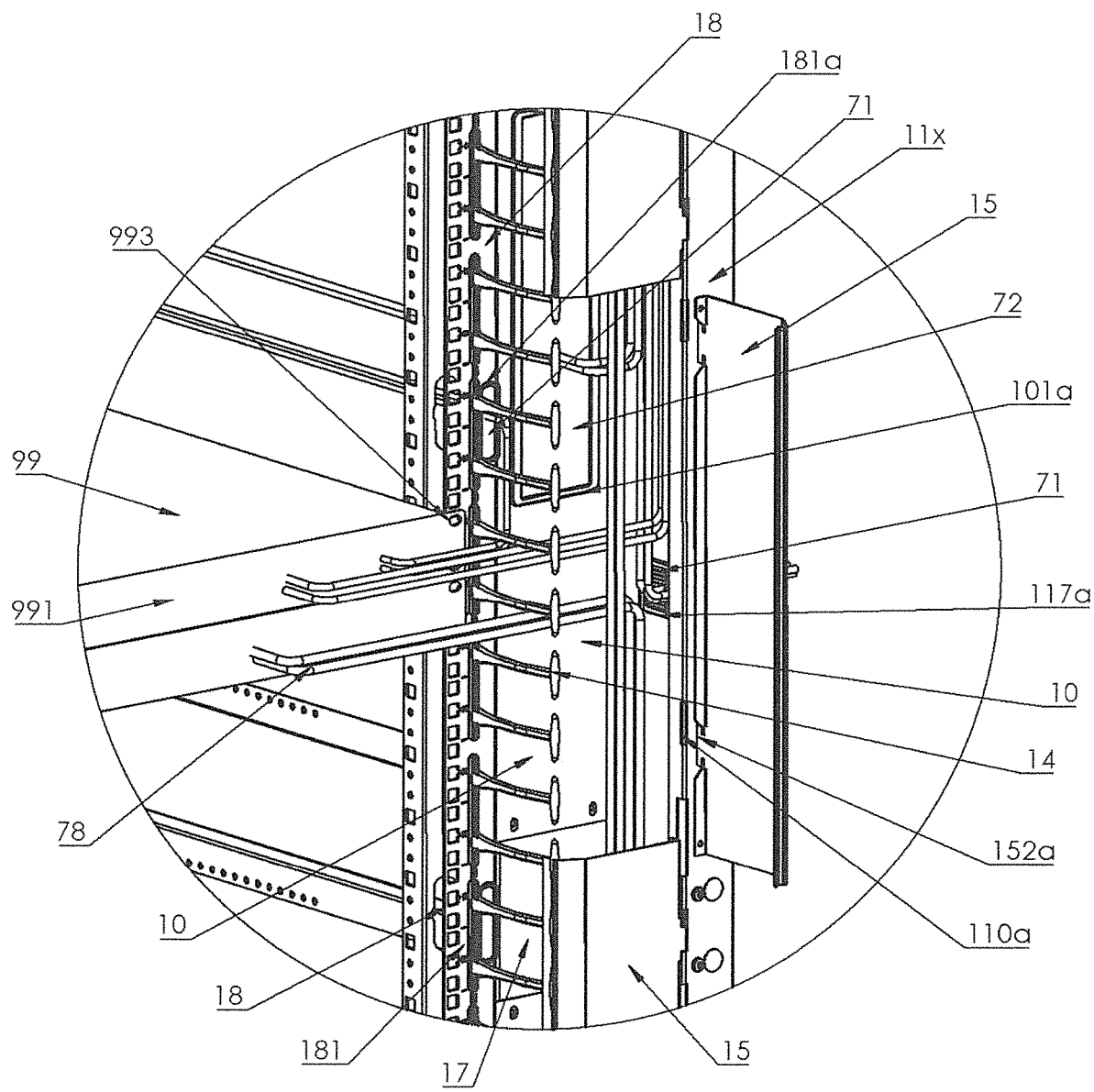
FIG. 63 is an enlarged view of the circled area F in FIG. 62.
Figure 65:
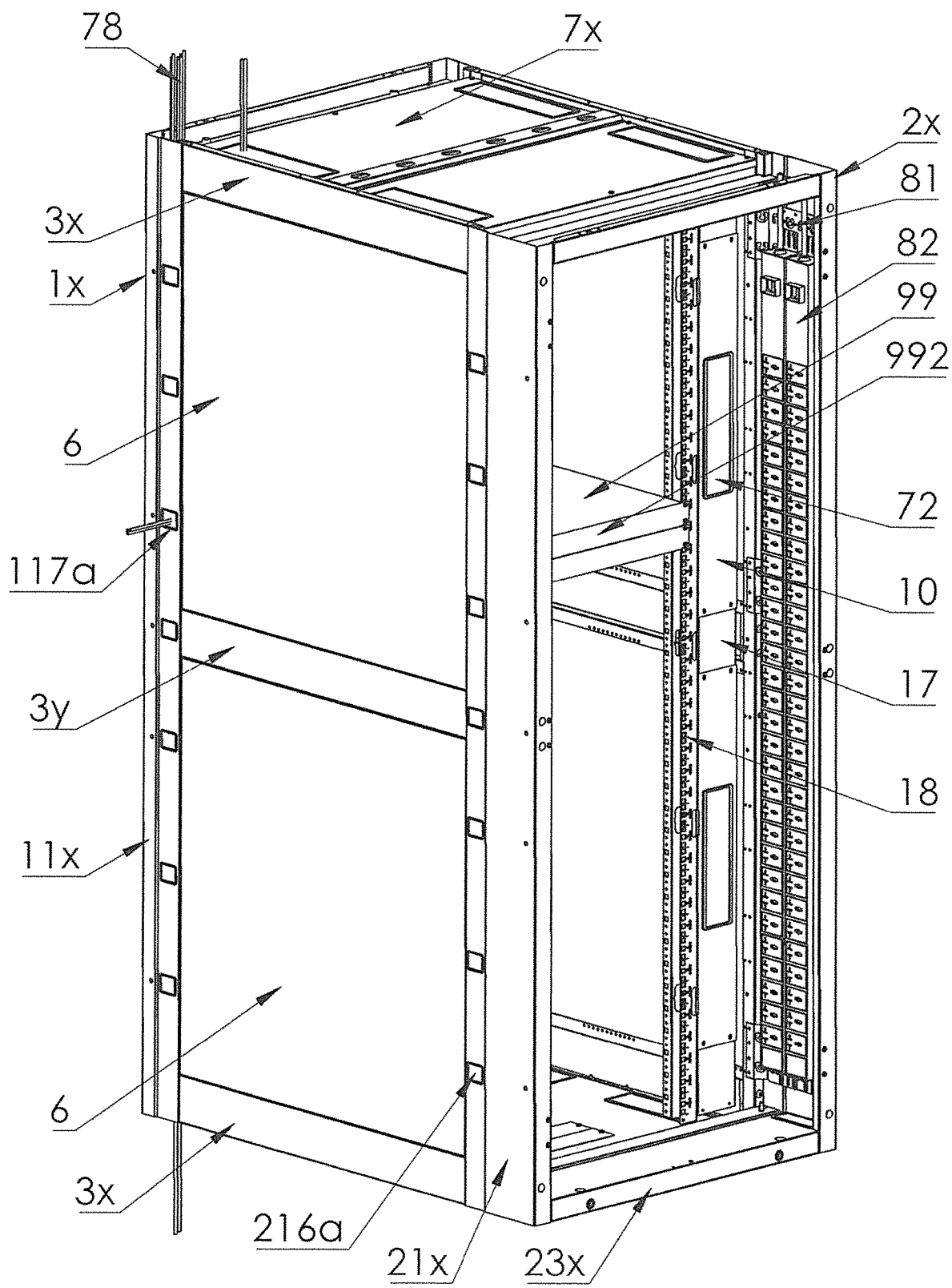
FIG. 65 is a rear perspective view of the frame structure of FIG. 62.

FIGS. 62-65 illustrate the cable management system of the present invention. For example, FIGS. 62, 63 and 65 show various lines of cable 78 coupled to the electronic equipment, and how they enter or exit the flexible cable ducts 14, and run vertically inside the enclosure. The cable 78 can also enter and exit from the top via entry openings 79 and 133a (through mounted grommets 71 or 72), and run vertically inside the enclosure, and then can pass through the mounting rail 18 or the the cover plate 10 (through mounted grommets 71 or 72) to go towards the rear side of cabinet. Similarly, cable 78 can enter and exit from the bottom through entry openings 89 and 133a. Cable 78 can also pass through the entry openings 117a on the surface 117x of the front pillar 11x (through a mounted grommet 71) to run horizontally to the outside of the cabinet, or to an adjacent cabinet, thereby allowing cable 78 to be directly connected to multiple enclosure cabinets.

Air Flow and Ventilation

FIGS. 62-65 also illustrate the air flow and ventilation management for the cabinet of the third embodiment. A rack-mountable electronic device 99 can be provided with mounting flanges 993 on its sides. The rack-mountable electronic device 99 can be installed inside the enclosure cabinet by overlapping and connecting its mounting flanges 993 with the mounting surface 181 of the mounting rail 18 (See FIGS. 63 and 65). The mounted electronic device 99 is normally provided with a vented front cover 991 and a vented rear cover 992.

In one example of cabinet ventilation when cooling air is delivered through the front (defined by the front surface of the front frame assembly 1x) or the rear (defined by front surface of the rear frame assembly 2x) of the cabinet, cooling air can be drawn through the vented front cover 991 and flow directly through the electronic device 99 in a front-to-rear direction, or drawn into the vented rear cover 992 and flow directly through the electronic device 99 in a rear-to-front direction, thereby removing heat generated by the electronic device 99. The mounting rails 18 which are connected to the electronic device 99 via its mounting flange 993, the modular cover plates 10, and the front pillars 11x, as well as the airseal grommets 71 and 72 mounted on cable entry openings, all together form effective barriers for air flow movement thereby only allowing cooling air to be drawn through the vented front and rear covers (991 and 992) of the mounted electronic devices 99, even when the swing cover conduit 15 is swung open to allow access to cables 78. Therefore, the total amount of cooling air delivered through the cabinet will only flow through the electronic device 99 directly through its front and rear vents (991 and 992) without leaking to other areas. This arrangement greatly improves airflow efficiency and cooling effectiveness.

In another example of cabinet ventilation where exhaust air is removed through the front or rear of the cabinet, hot exhaust air generated by electronic equipment 99 can only escape and be removed through the vented front cover 991 or the vented rear cover 992, with no air re-circulation movement in the space between the electronic device 99 and side panels and frames of the cabinet. This is because of the existence of air flow barriers formed in the front and rear frames of the cabinet by the mounting rails 18 which are connected to the electronic device 99 via its mounting flange 993, the modular cover plates 10, the front pillars 11x, as well as airseal grommets 71 and 72 mounted on cable entry openings thereon. Therefore, the total amount of exhaust air removed from the cabinet will only flow directly from the electronic device 99. This arrangement greatly improves the effectiveness of the heat removal process.

Ventilation and air flow management for the second embodiment has been described above. Specifically, the same front-to-rear, and rear-to-front, channeling of air through the electronic device 99 still applies, but the front frame chamber shown in FIG. 38 is defined by the front frame pillar 11x, the mounting rail 18 and the flexible cable ducts 14, which function to effectively block unwanted airflow from the front and side by the surfaces 110x, 111x, 112x and 117x of front frame pillar 11x, and block airflow from the rear by a surface 181 of the mounting rail 18 and the surface 118x of the front frame pillar 11x.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A frame structure for a cabinet enclosure, comprising:
a front frame assembly having first and second front pillars;
a rear frame assembly having first and second rear pillars;
a first side brace member, and a second side brace member, each having a beam that has opposite ends, with the opposite ends of each side brace member connected to one of the front pillars and one of the rear pillars;
wherein each pillar is formed by bending a metal plate to form multiple surfaces, each pillar having at least one recessed surface facing outwardly away from the frame, with each recessed surface having at least one adjacent raised surface; and
wherein the beam of each side brace member comprises a vertical surface and a flange surface extending by ninety degrees from the vertical surface to define a recessed attachment area, the frame structure further including a side panel that is removably connected to the side brace member, with the side panel having a side edge that is received in the recessed attachment area.

2. The frame structure of claim 1, wherein a distance is defined between each recessed surface and its adjacent raised surface, and the distance is between 1 mm to 25 mm.

3. The frame structure of claim 1, wherein the recessed surface of each of the front pillars has a first end and a second end from which the raised surface extends, with a fastening surface extending generally perpendicular from the first end of the recessed surface, and a mounting surface extending generally perpendicular from the fastening surface, and each of the front pillars further includes a front surface extending generally perpendicular from the raised surface.

4. The frame structure of claim 1, wherein the recessed surface of each of the rear pillars has a first end and a second end from which the raised surface extends, with a fastening surface extending generally perpendicular from the first end of the recessed surface, and a mounting surface extending generally perpendicular from the fastening surface, and each of the rear pillars further includes a front surface extending generally perpendicular from the raised surface.

5. The frame structure of claim 1, wherein the front frame assembly also includes a frame mounting surface that is oriented at ninety degrees from a front frame fastening surface, and together with the front frame fastening surface defines a recessed attachment area for receiving the side edge of the side panel.

6. The frame structure of claim 5, wherein the flange surface of each side brace member overlaps the side edge of the side panel to effectively block airflow.

7. The frame structure of claim 5, wherein the frame mounting surface overlap the side edge of the side panel to effectively block airflow.

8. The frame structure of claim 5, wherein the frame mounting surface has a width of 1 mm to 100 mm.

9. The frame structure of claim 1, wherein the rear frame assembly also includes a frame mounting surface that is oriented at ninety degrees from a rear frame fastening surface, and together with the rear frame fastening surface defines a recessed attachment area for receiving the side edge of the side panel.

10. The frame structure of claim 9, wherein the flange surface of each side brace member overlaps the side edge of the side panel to effectively block airflow.

11. The frame structure of claim 9, wherein the frame mounting surface overlap the side edge of the side panel to effectively block airflow.

12. The frame structure of claim 9, wherein the frame mounting surface has a width of 1 mm to 100 mm.

13. A frame structure for a cabinet enclosure, comprising:
 a front frame assembly having first and second front pillars;
 a rear frame assembly having first and second rear pillars;
 a first side brace member, and a second side brace member, each having a beam that has opposite ends, with the opposite ends of each side brace member connected to one of the front pillars and one of the rear pillars; and
 wherein each pillar is formed by bending a metal plate to form multiple surfaces, each pillar having at least one recessed surface facing outwardly away from the frame, with each recessed surface having at least one adjacent raised surface;
 wherein the frame structure further includes a mounting rail which has:
  a mounting surface that has a first edge and an opposite second edge;
  a first side surface having a first edge and a second edge, with the first edge of the first side surface extending generally perpendicular from the first edge;
  a second side surface extending at a non-perpendicular angle from the second edge of the mounting surface;
  a plurality of mounting ports and at least one cable entry port are provided on the first side surface;
  a cable entry port is provided on the second side surface;
  a flanged surface extending at an angle from the second edge of the first side surface; and
  wherein the mounting surface and the flanged surface are parallel to each other.

14. A frame structure for a cabinet enclosure, comprising:
 a front frame assembly having first and second front pillars;
 a rear frame assembly having first and second rear pillars;
 a first side brace member, and a second side brace member, each having a beam that has opposite ends, with the opposite ends of each side brace member connected to one of the front pillars and one of the rear pillars; and
 wherein each pillar is formed by bending a metal plate to form multiple surfaces, each pillar having at least one recessed surface facing outwardly away from the frame, with each recessed surface having at least one adjacent raised surface;
 wherein the frame structure further includes a device management apparatus which has:
  a first mounting surface having a first edge and a second edge;
  a second mounting surface having a first edge extending at a non-perpendicular angle from the first edge of the first mounting surface, and a second edge;
  a third mounting surface extending at a non-perpendicular angle from the second edge of the second mounting surface;
  a fourth mounting surface extending at a non-perpendicular angle from the second edge of the first mounting surface; and
  wherein the first and second mounting surfaces are provided with a plurality of cable tie ports and a plurality of device mounting ports.

15. A frame structure for a cabinet enclosure, comprising:
 a front frame assembly having first and second front pillars;
 a rear frame assembly having first and second rear pillars;
 a first side brace member, and a second side brace member, each having a beam that has opposite ends, with the opposite ends of each side brace member connected to one of the front pillars and one of the rear pillars; and
 wherein each pillar is formed by bending a metal plate to form multiple surfaces, each pillar having at least one recessed surface facing outwardly away from the frame, with each recessed surface having at least one adjacent raised surface;
 wherein the frame structure further includes a support rail having a device placement surface that is bent inwardly at an angle to form an angled transition surface, and then bent inwardly at an angle and to form a mounting surface that is perpendicular to the device placement surface;
wherein the device placement surface is provided with an extension part that has a rear support surface extending therefrom, with the rear support surface is aligned on the same plane as the mounting surface.

16. A frame structure for a cabinet enclosure, comprising:
 a front frame assembly having first and second front pillars;
 a rear frame assembly having first and second rear pillars;
 a first side brace member, and a second side brace member, each having a beam that has opposite ends, with the opposite ends of each side brace member connected to one of the front pillars and one of the rear pillars;
 a mounting rail secured to the first front pillar;
 a flexible cable duct secured to the mounting rail adjacent the first front pillar, the flexible cable duct having a plurality of spaced-apart curved finger sections, each having a first end that is secured to the mounting rail, and a second end that supports an enlarged adapter so that each combined curved finger section and enlarged end forms a T-shape; and
 wherein the first front pillar, the mounting rail, and the flexible cable ducts together define a front frame chamber that provides a cable management function.

17. The frame structure of claim 16, further including a plurality of cables, and wherein each of the front and rear pillars, and the mounting rail, comprises at least one cable entry opening, wherein each of the plurality of cables extends through at least one of the front or rear pillars and the mounting rail, and enter and exit the at least one of the front or rear pillars and the mounting rail via selected cable entry openings.

18. The frame structure of claim 17, further including at least one cable entry grommet that is adapted to cover a cable entry opening, wherein the cable entry grommet comprises a perimeter, a first flange, a second flange, and a groove between the first and second flanges along the perimeter, wherein the perimeter defines a central area that is provided with an array of strips, each strip having a thickness, and wherein at least one notch is provided in each strips to thin the thickness of each strip so that each strip or selected combination of strips can be easily broken at the notch.

19. An enclosed cabinet having a front, a rear, a left side, and a right side, comprising:
- a frame structure for a cabinet enclosure, comprising:
  - a front frame assembly having first and second front pillars;
  - a rear frame assembly having first and second rear pillars;
  - a first side brace member, and a second side brace member, each having a beam that has opposite ends, with the opposite ends of each side brace member connected to one of the front pillars and one of the rear pillars;
  - a mounting rail secured to the first front pillar; and
  - a flexible cable duct secured to the mounting rail adjacent the first front pillar; and
- an electronic device mounted to the mounting rail, the electronic device having a vented front cover and a vented rear cover;
- wherein a front frame chamber is defined by the first front pillar, the mounting rail and the flexible cable duct, and the front frame chamber blocks airflow from the front and either the right or left side of the cabinet, so that air can only be vented from the front to the rear, or from the rear to the front, via the vented front cover and the vented rear cover of the electronic device.

20. The frame structure of claim 19, further including:
- an intermediate connecting member connected to the mounting rail and one of the side brace members or one of the frame assemblies;
- a cover plate connected to the intermediate connecting member; and
- wherein the front frame chamber is defined by the first front pillar, the mounting rail, the flexible cable duct, and cover plate, and the front frame chamber blocks airflow from the front and either the right or left side of the cabinet, so that air can only be vented from the front to the rear, or from the rear to the front, via the vented front cover and the vented rear cover of the electronic device.

21. The frame structure of claim 20, further including a swing cover conduit pivotably connected to the first front pillar, wherein (i) the swing cover conduit prevents air from escaping from the front of the cabinet, (ii) the cover plate blocks air flow from the rear of the cabinet, and (iii) the first front pillar prevents air from escaping from either the left side or the right side.

22. The frame structure of claim 21, wherein each of the front and rear pillars comprises at least one cable entry opening, and further including at least one cable entry grommet that is adapted to cover a cable entry opening, wherein each cable entry grommet also assists in blocking air flow.

23. The frame structure of claim 21, wherein the cover plate comprises at least one cable entry opening, and further including at least one cable entry grommet that is adapted to cover a cable entry opening, wherein each cable entry grommet also assists in blocking air flow.

24. The frame structure of claim 21, further including a top cover, wherein the top cover comprises at least one cable entry opening, and further including at least one cable entry grommet that is adapted to cover a cable entry opening, wherein each cable entry grommet also assists in blocking air flow.

25. The frame structure of claim 21, further including a base, wherein the top cover comprises at least one cable entry opening, and further including at least one cable entry grommet that is adapted to cover a cable entry opening, wherein each cable entry grommet also assists in blocking air flow.

* * * * *